United States Patent
Yamaguchi et al.

(10) Patent No.: US 8,120,159 B2
(45) Date of Patent: Feb. 21, 2012

(54) SEMICONDUCTOR INTEGRATED CIRCUIT, MANUFACTURING METHOD THEREOF, AND SEMICONDUCTOR DEVICE USING SEMICONDUCTOR INTEGRATED CIRCUIT

(75) Inventors: Mayumi Yamaguchi, Atsugi (JP); Konami Izumi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/797,192

(22) Filed: Jun. 9, 2010

(65) Prior Publication Data

US 2010/0244250 A1 Sep. 30, 2010

Related U.S. Application Data

(62) Division of application No. 11/785,149, filed on Apr. 16, 2007, now Pat. No. 7,785,938.

(30) Foreign Application Priority Data

Apr. 28, 2006 (JP) ................................ 2006-126329

(51) Int. Cl.
*H01L 23/02* (2006.01)
(52) U.S. Cl. ................ 257/686; 257/758; 257/E21.575; 438/149
(58) Field of Classification Search .................. 257/686, 257/758, E21.575; 438/149
See application file for complete search history.

(56) References Cited

U.S. PATENT DOCUMENTS

| | | | |
|---|---|---|---|
| 5,998,291 A | 12/1999 | Bakhit et al. | |
| 6,525,415 B2 | 2/2003 | Koyanagi et al. | |
| 6,700,631 B1 | 3/2004 | Inoue et al. | |
| 7,037,752 B2 | 5/2006 | Kuwabara et al. | |
| 7,067,926 B2 | 6/2006 | Yamazaki et al. | |
| 7,098,121 B2 * | 8/2006 | Mori et al. | 438/551 |
| 7,511,380 B2 | 3/2009 | Yamazaki et al. | |
| 2006/0163710 A1 | 7/2006 | Kuwabara et al. | |

FOREIGN PATENT DOCUMENTS

| | | |
|---|---|---|
| CN | 1516253 | 7/2004 |
| CN | 1519929 | 8/2004 |
| EP | 1 432 032 | 6/2004 |
| EP | 1 434 264 | 6/2004 |
| JP | 06-061418 | 3/1994 |
| JP | 2001-189419 | 7/2001 |

OTHER PUBLICATIONS

Office Action (Application No. 200710100943.1) dated Mar. 9, 2010.

* cited by examiner

*Primary Examiner* — Julia Slutsker
(74) *Attorney, Agent, or Firm* — Eric J. Robinson; Robinson Intellectual Property Law Office, P.C.

(57) ABSTRACT

A step of forming a through hole in a semiconductor substrate, or a step of polishing the semiconductor substrate from its back surface requires a very long time and causes decrease of productivity. In addition, when semiconductor substrates are stacked, a semiconductor integrated circuit which is formed of the stack is thick and has poor mechanical flexibility. A release layer is formed over each of a plurality of substrates, layers each having a semiconductor element and an opening for forming a through wiring are formed over each of the release layers. Then, layers each having the semiconductor element are peeled off from the substrates, and then overlapped and stacked, a conductive layer is formed in the opening, and the through wiring is formed; thus, a semiconductor integrated circuit is formed.

8 Claims, 33 Drawing Sheets

⋮

⋮

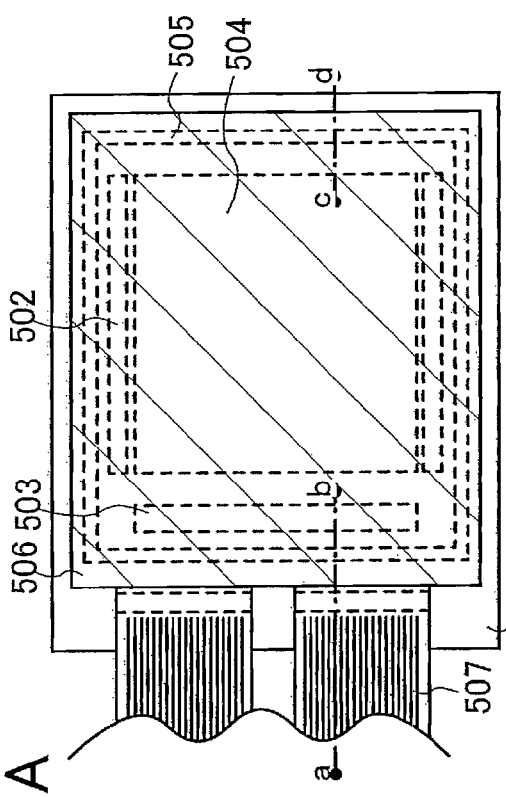
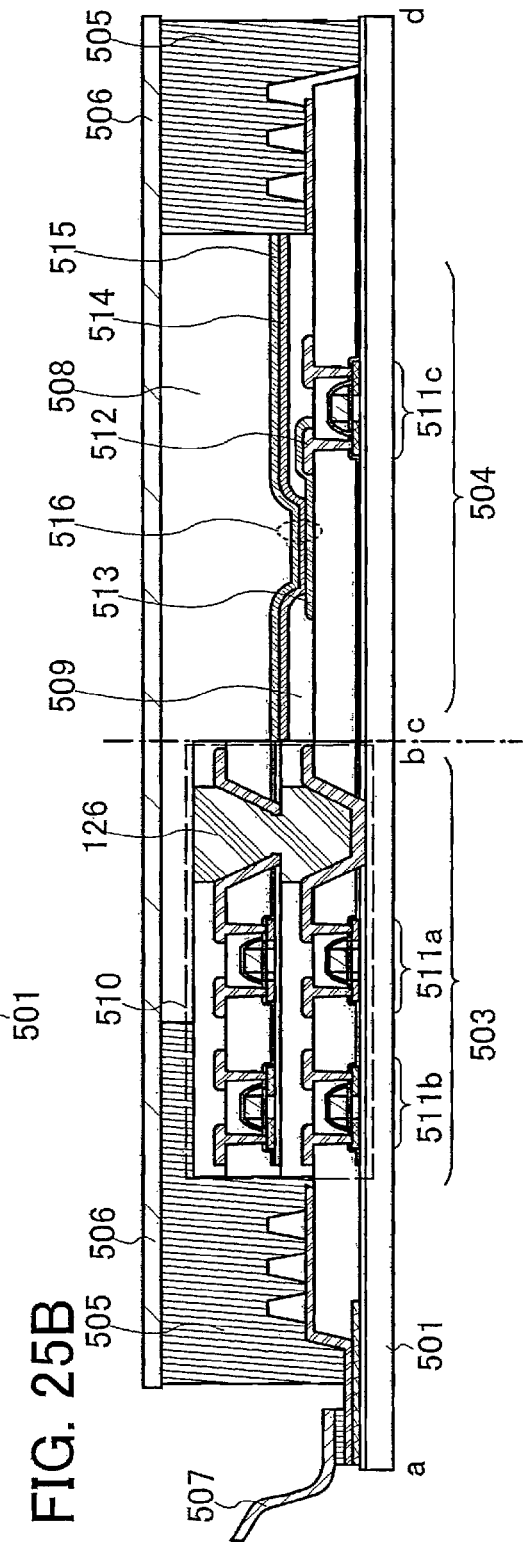
FIG. 25A
FIG. 25B

SEMICONDUCTOR INTEGRATED CIRCUIT, MANUFACTURING METHOD THEREOF, AND SEMICONDUCTOR DEVICE USING SEMICONDUCTOR INTEGRATED CIRCUIT

BACKGROUND OF THE INVENTION

1. Field of the Invention

The present invention relates to a semiconductor integrated circuit which is formed by stacking semiconductor elements.

2. Description of the Related Art

A technique for highly integrating a semiconductor integrated circuit has been developed by stacking semiconductor substrates provided with integrated circuits. Such a semiconductor integrated circuit which is formed by stacking semiconductors has been manufactured by sequentially stacking semiconductor substrates provided with integrated circuits. The semiconductor integrated circuit which is formed by stacking the semiconductors is formed such that semiconductor substrates are each provided with an integrated circuit and stacked by thinning the semiconductor substrates or the like (see e.g., Reference 1: Japanese Published Patent Application No. H6-61418, and Reference 2: Japanese Published Patent Application No. 2001-189419).

SUMMARY OF THE INVENTION

However, in a conventional method for manufacturing a semiconductor integrated circuit which is formed by stacking semiconductors, after an opening is formed in a part of a semiconductor substrate by etching or the like, a through hole is formed by polishing the semiconductor substrate from its back surface. Then, a wiring is formed in the through hole by deposition or plating, so that integrated circuits formed on the semiconductor substrates are connected to each other.

In this manner, a step of forming a through hole in a semiconductor substrate, or a step of polishing the semiconductor substrate from its back surface requires a very long time and causes decrease of productivity. In addition, in a step of forming a through hole in the semiconductor substrate or a step of polishing the semiconductor substrate from its back surface, dust is generated, which causes a defect in an integrated circuit. In addition, a semiconductor integrated circuit which is formed by stacking semiconductors has a structure in which semiconductor substrates are stacked; therefore, the semiconductor integrated circuit has a thick structure and poor mechanical flexibility.

It is an object of the present invention to improve the productivity of an integrated circuit which is formed by stacking semiconductors. It is another object of the present invention to provide a method for manufacturing a semiconductor integrated circuit having mechanical flexibility by thinning an integrated circuit which is formed by stacking semiconductors.

According to the present invention, a release layer is formed over each of a plurality of substrates, layers each having a semiconductor element and an opening for forming a through wiring are formed over each of the release layers. Then, layers each having the semiconductor element are peeled off from the substrates, and then overlapped and stacked, the opening is filled with a conductive material, and the through wiring is formed; thus, a semiconductor integrated circuit is formed. Note that in this specification, an opening penetrates a layer having a semiconductor element. In addition, a part of a side surface of the opening or a part of a layer having a semiconductor element located below the opening has conductivity. Further, "to form a through wiring (also simply referred to as a wiring)" means to fill an opening with a conductive material and electrically connect upper and lower layers each having semiconductor elements.

One feature of a manufacturing method of a semiconductor integrated circuit of the present invention is as follows: forming a first element formation layer including a semiconductor element over a first substrate, the semiconductor element including a semiconductor layer and insulating layers sandwiching the semiconductor layer; forming release layers over second to n-th ($n \geq 2$) substrates; forming second to n-th element formation layers each including an opening and a semiconductor element over the release layers formed over the second to n-th substrates, the semiconductor element including a semiconductor layer and insulating layers sandwiching the semiconductor layer; peeling off the second to n-th element formation layers from the second to n-th substrates, and attaching the second to n-th element formation layers to the first element formation layer; and forming a wiring in the openings, and electrically connecting a lower element formation layer and an upper element formation layer which is attached to the lower element formation layer, and n element formation layers are stacked.

Another feature of a manufacturing method of a semiconductor integrated circuit of the present invention is as follows: forming a first element formation layer including a semiconductor element over a first substrate, the semiconductor element including a semiconductor layer and insulating layers sandwiching the semiconductor layer; forming release layers over second to n-th ($n \geq 2$) substrates; forming second to n-th element formation layers each including an opening and a semiconductor element over the release layers formed over the second to n-th substrates, the semiconductor element including a semiconductor layer and insulating layers sandwiching the semiconductor layer; peeling off the second to n-th element formation layers from the second to n-th substrates, and attaching the second to n-th element formation layers to the first element formation layer such that the openings approximately overlap each other; and forming a wiring in the openings, electrically connecting a lower element formation layer and an upper element formation layer which is attached to the lower element formation layer, and stacking n element formation layers.

Another feature of a manufacturing method of a semiconductor integrated circuit of the present invention is as follows: forming a first element formation layer including a semiconductor element over a first substrate, the semiconductor element including a semiconductor layer and insulating layers sandwiching the semiconductor layer; forming release layers over second to n-th ($n \geq 2$) substrates; forming second to n-th element formation layers each including an opening and a semiconductor element over the release layers formed over the second to n-th substrates, the semiconductor element including a semiconductor layer and insulating layers sandwiching the semiconductor layer; peeling off the second to n-th element formation layers from the second to n-th substrates; and attaching the second to n-th element formation layers to the first element formation layer by forming a wiring in the openings, and electrically connecting a lower element formation layer and an upper element formation layer which is attached to the lower element formation layer.

Another feature of a manufacturing method of a semiconductor integrated circuit of the present invention is as follows: forming a first release layer over a first substrate; forming a first element formation layer including a semiconductor element over the first release layer, the semiconductor element including a semiconductor layer and insulating layers sandwiching the semiconductor layer; forming release layers over second to n-th (n≧2) substrates; forming second to n-th element formation layers each including an opening and a semiconductor element over the release layers formed over the second to n-th substrates, the semiconductor element including a semiconductor layer and insulating layers sandwiching the semiconductor layer; peeling off the first element formation layer from the first substrate; peeling off the second to n-th element formation layers from the second to n-th substrates, and attaching the second to n-th element formation layers to the first element formation layer; and forming a wiring in the openings, electrically connecting a lower element formation layer and an upper element formation layer which is attached to the lower element formation layer, and stacking n element formation layers.

Another feature of a manufacturing method of a semiconductor integrated circuit of the present invention is as follows: forming a first release layer over a first substrate; forming a first element formation layer including a semiconductor element over the first release layer, the semiconductor element including a semiconductor layer and insulating layers sandwiching the semiconductor layer; forming release layers over second to n-th (n≧2) substrates; forming second to n-th element formation layers each including an opening and a semiconductor element over the release layers formed over the second to n-th substrates, the semiconductor element including a semiconductor layer and insulating layers sandwiching the semiconductor layer; peeling off the first element formation layer from the first substrate; peeling off the second to n-th element formation layers from the second to n-th substrates, and attaching the second to n-th element formation layers to the first element formation layer such that the openings approximately overlap each other; and forming a wiring in the openings, electrically connecting a lower element formation layer and an upper element formation layer which is attached to the lower element formation layer, and n element formation layers are stacked.

Another feature of a semiconductor integrated circuit of the present invention is as follows: a first element formation layer including a semiconductor element, the semiconductor element including a semiconductor layer and insulating layers sandwiching the semiconductor layer, and second to n-th (n≧2) element formation layers each including an opening and a semiconductor element, the semiconductor element including a semiconductor layer and insulating layers sandwiching the semiconductor layer, in which the second to n-th (n≧2) element formation layers are stacked over the first element formation layer, and in which a wiring is formed in the openings.

Another feature of a semiconductor integrated circuit of the present invention is as follows: a first element formation layer including a semiconductor element, the semiconductor element including a semiconductor layer and insulating layers sandwiching the semiconductor layer, and second to n-th (n≧2) element formation layers each including an opening and a semiconductor element, the semiconductor element including a semiconductor layer and insulating layers sandwiching the semiconductor layer, in which the second to n-th (n≧2) element formation layers are stacked over the first element formation layer, in which the first to n-th element formation layers are attached to each other such that the openings provided in a lower element formation layer and another element formation layer provided over the one element formation layer approximately overlap each other; and a wiring is formed in the openings.

Note that a release layer in this specification means a layer which makes it easy to peel off a plurality of layers having semiconductor elements from a substrate.

In the present invention, when an integrated circuit including a semiconductor element which is formed using a semiconductor layer and insulating layers sandwiching the semiconductor layer is formed over a substrate, and peeled off from the substrate, and then stacked, an integrated circuit which is formed by stacking semiconductors can be thinned. In addition, by forming a semiconductor integrated circuit of the present invention over a flexible substrate such as plastic, a semiconductor device which is thin, lightweight, and flexible can be formed.

In addition, since a step of forming a through hole in a semiconductor substrate having a thickness of several micrometers to several hundred micrometers is omitted, productivity can be improved. That is, since the semiconductor substrate is not required to be polished so as to form a through hole in the semiconductor substrate, generation of dust can be suppressed, and contamination of a semiconductor integrated circuit can be prevented.

BRIEF DESCRIPTION OF THE DRAWINGS

FIGS. 25A and 25B are diagrams illustrating a structural example of a semiconductor device of the present invention.

DETAILED DESCRIPTION OF THE INVENTION

Figure 1A:
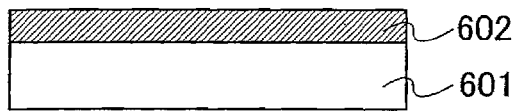
FIGS. 1A to 1C are diagrams illustrating a method for forming a semiconductor integrated circuit of the present invention.

Hereinafter, embodiment modes of the present invention will be described with reference to the accompanying drawings. However, the present invention can be implemented in various modes. As is easily known to a person skilled in the art, the mode and the detail of the present invention can be variously changed without departing from the spirit and the scope of the present invention. Thus, the present invention should not be interpreted as being limited to the following description of the embodiment modes. Note that the same reference numerals are commonly used to denote the same portions or portions having similar functions in different drawings for describing the embodiment modes, and the repeated description thereof is omitted.

Embodiment Mode 1

A semiconductor integrated circuit of this embodiment mode is provided with a layer (hereinafter also referred to as an element formation layer) having semiconductor elements, which is formed over each of a plurality of substrates. When the layer having the semiconductor elements is peeled off, and then, overlapped and attached to another substrate, the semiconductor integrated circuit of this embodiment mode is formed. In order to peel off the layer having the semiconductor elements from the substrate, a release layer is formed over the substrate, and the layer having the semiconductor elements is formed over the release layer. In addition, the layer having the semiconductor elements, which is overlapped and attached to each other, is electrically connected to an upper layer or a lower layer with a through wiring.

This embodiment mode will briefly describe a method for forming a semiconductor integrated circuit of the present invention with reference to FIGS. 1A to 3D.

As shown in FIG. 1A, a first element formation layer 602 having semiconductor elements is formed over a first substrate 601. The first element formation layer 602 is a bottom layer of a semiconductor integrated circuit which is to be formed by stacking layers having semiconductor elements. In the case of forming the semiconductor integrated circuit over the first substrate 601, the first element formation layer 602 can be formed without providing a release layer over the first substrate 601. In the case where the first element formation layer 602 is peeled off from the first substrate 601 and attached to another substrate to form the semiconductor integrated circuit, a release layer is formed between the first substrate 601 and the first element formation layer 602. This embodiment mode shows an example in which the first element formation layer 602 is formed without providing a release layer over the first substrate 601.

Figure 1B:
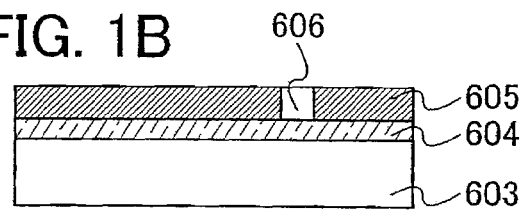
Figure 1B:
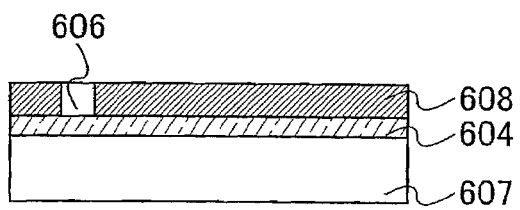
Figure 1B:
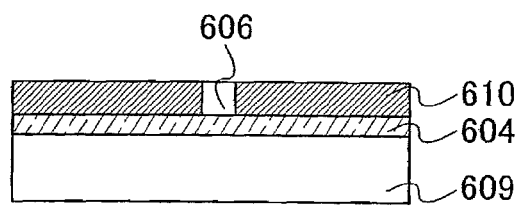

Next, as shown in FIG. 1B, a release layer 604 and a second element formation layer 605 having semiconductor elements are formed over a second substrate 603. The second element formation layer 605 has an opening 606 for forming a through wiring. Similarly, the release layer 604 and a third element formation layer 608 having semiconductor elements are formed over a third substrate 607. The third element formation layer 608 has the opening 606 for forming a through wiring similarly to the second element formation layer 605.

In this manner, the required number of element formation layers is formed so as to form the semiconductor integrated circuit. For example, in the case where three element formation layers are stacked, a first element formation layer, a second element formation layer, and a third element formation layer are formed over a first substrate, a second substrate, and a third substrate, respectively. Note that each of the second element formation layer and the third element formation layer includes an opening for forming a through wiring.

This embodiment mode shows an example in which the first element formation layer 602 to an n-th element formation layer 610 are formed over the first substrate 601 to an n-th substrate 609 ($n \geq 2$) respectively, and n element formation layers are stacked to form the semiconductor integrated circuit (see FIG. 1B). Here, the second element formation layer 605 to the n-th element formation layer 610 are formed over the release layers 604 which are formed over the second substrate 603 to the n-th substrate 609. In addition, each of the second element formation layer 605 to the n-th element formation layer 610 has the opening 606 for forming the through wiring.

Figure 1C:
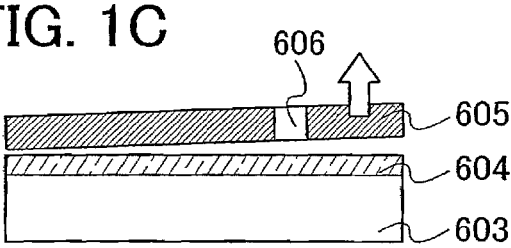
Figure 1C:
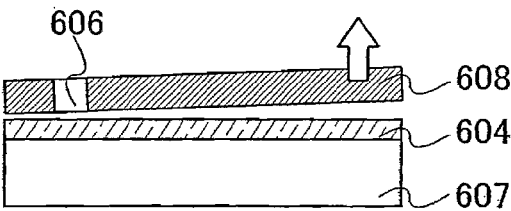
Figure 1C:
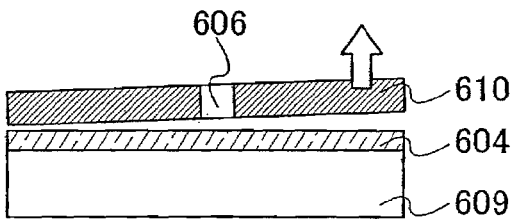

Next, as shown in FIG. 1C, the second element formation layer 605 to the n-th element formation layer 610 which are formed over the second substrate 603 to the n-th substrate 609 respectively are peeled off.

Figure 2A:
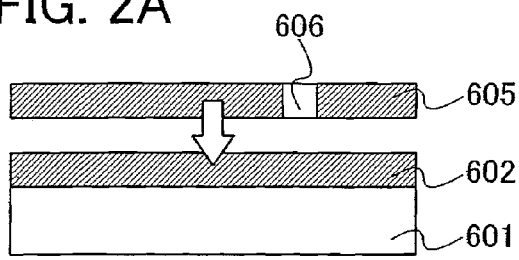
FIGS. 2A to 2G are diagrams illustrating a method for forming a semiconductor integrated circuit of the present invention.
Figure 2B:
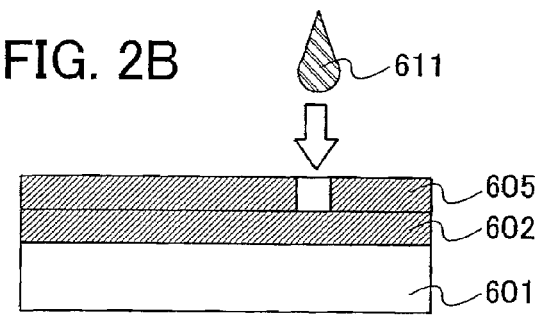

Then, as shown in FIG. 2A, the second element formation layer 605 which has been peeled off from the second substrate 603 is attached to the first element formation layer 602. Then, as shown in FIG. 2B, the opening 606 provided in the second element formation layer 605 is filled with a conductive material. In this embodiment mode, a conductive paste 611 used as a conductive material is dropped in the opening 606. A through wiring 612 is formed in the opening 606 in which the conductive paste 611 is dropped (FIG. 2C), and the first element formation layer 602 and the second element formation layer 605 are electrically connected.

Figure 2C:
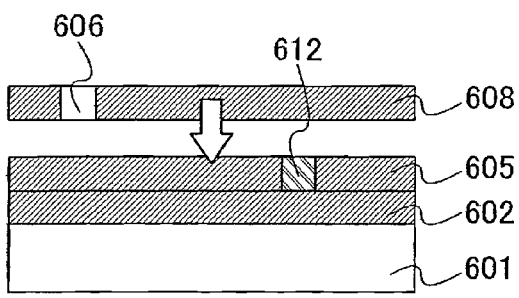
Figure 2D:
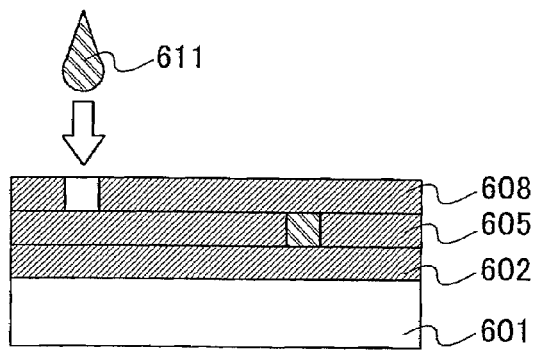

Similarly, as shown in FIG. 2C, the third element formation layer 608 which has been peeled off from the third substrate 607 is attached to the second element formation layer 605. Then, as shown in FIG. 2D, when the conductive paste 611 is dropped in the opening 606 provided in the third element formation layer 608, the through wiring 612 is formed, and the second element formation layer 605 and the third element formation layer 608 are electrically connected.

Figure 2E:
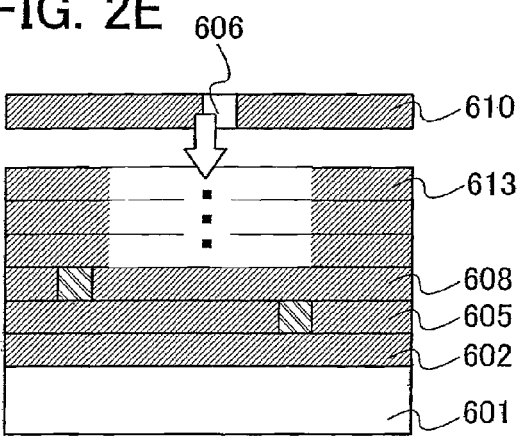
Figure 2F:
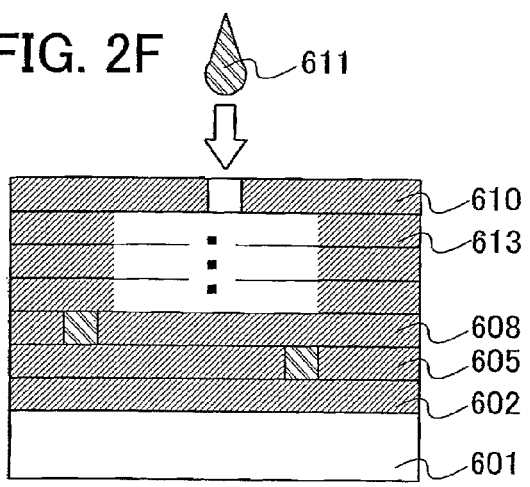
Figure 2G:
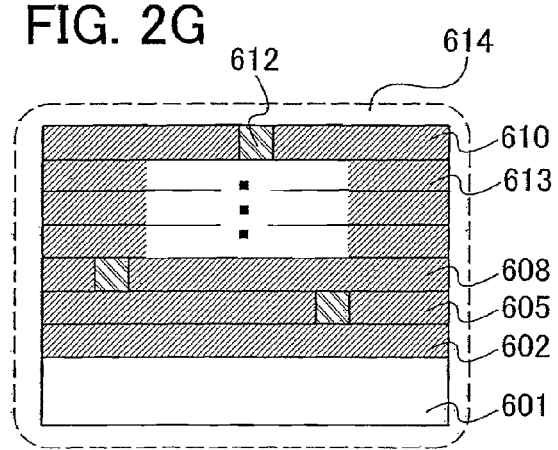

The above steps are repeated, and finally, the n-th element formation layer 610 which has been peeled off from the n-th substrate 609 is attached to an (n−1)th element formation layer 613, as shown in FIG. 2E. Then, as shown in FIG. 2F, when the through wiring 612 is formed by dropping the conductive paste 611 in the opening 606 provided in the n-th element formation layer 610, and the n-th element formation layer 610 and the (n−1)th element formation layer 613 are electrically connected, a semiconductor integrated circuit 614 in which a plurality of layers having semiconductor elements is overlapped and attached to each other can be formed (see FIG. 2G). Note that "connected" in this specification is a synonymous with "electrically connected".

The release layer 604, which forms a boundary for peeling off the second element formation layer 605 from the second substrate 603, is formed using a film having a relationship that the stacked layers have low adhesion physically at the time of stacking; a film whose property is changed to be embrittled by some sort of treatment such as heating, laser irradiation, or ultraviolet irradiation; or a film which can lower the adhesion of stacked films. The second substrate 603 and the second element formation layer 605 can be peeled off from an interface of the film whose adhesion is lowered. For example, it is known that a metal film which is hard to be oxidized like a noble metal and an oxide film (e.g., a silicon oxide film) have low adhesion. By using this, a metal film and a silicon oxide film are stacked over the second substrate 603 as the release layer 604, and the second element formation layer 605 is formed thereover; therefore, at an interface between the metal film and the silicon oxide film, the second element formation layer 605 can be peeled off from the second substrate 603.

The following example can be used as a material of the release layer 604 formed over the second substrate 603 and a method for peeling off the second element formation layer 605 from the second substrate 603.

(1) A metal oxide film is provided to have a single-layer structure or a stacked structure as the release layer 604 over the second substrate 603. Then, when the metal oxide film which is the release layer 604 is embrittled by heating, laser irradiation, or the like, the second substrate 603 and the second element formation layer 605 are peeled off. Here, when a light transmitting substrate such as a glass substrate or a quartz substrate is used as the second substrate 603, laser irradiation can be performed from the back surface of the substrate. It is believed that the metal oxide film is embrittled by heating or laser irradiation because the metal oxide film is crystallized.

(2) An amorphous silicon film including hydrogen is provided as the release layer 604, over the second substrate 603. Then, the release layer 604 is embrittled by heating or laser irradiation, or the release layer 604 is removed by etching, so that the second substrate 603 and the second element formation layer 605 are peeled off.

(3) The second element formation layer 605 is formed over the second substrate 603 (without providing the release layer 604). Then, the second element formation layer 605 is obtained by polishing the second substrate 603 from its back surface to be thinned or removed, or by removing the substrate by etching. For example, when a quartz substrate is used as the second substrate 603, the substrate can be removed by etching using a HF solution, HF vapor, $CHF_3$, a mixed gas of $C_4F_8$ and $H_2$, or the like. When a silicon substrate is used as the second substrate 603, the substrate can be removed by etching using a fluoride halogen gas such as $NF_3$, $BrF_3$, or $ClF_3$.

(4) A metal film and a metal oxide film are stacked as the release layer 604, over the second substrate 603. Then, the metal oxide film is embrittled by heating, laser irradiation, or the like, and then, a part of the release layer 604 is etched to be removed, so that the second substrate 603 and the second element formation layer 605 are physically peeled off at an interface between the embrittled metal oxide film and the metal film. For example, when the release layer 604 is formed using metal such as tungsten (W) or molybdenum (Mo), the etching of the release layer 604 can be performed using a solution such as ammonia peroxide mixture; a chlorine-based gas typified by $CCl_4$; a mixed gas of $O_2$ and a fluorine-based gas typified by $CF_4$, $SF_6$, or $NF_3$; or the like. When the release layer 604 is formed using metal such as aluminum (Al) or titanium (Ti), an acid solution or a $Cl_2$ gas can be used for etching. Note that it is also possible to physically peel off the second substrate 603 and the second element formation layer 605 without performing a step of embrittling the metal oxide film or the amorphous silicon film which is formed as the release layer 604, or a step of etching the release layer 604.

As a method for peeling off the release layer physically, for example, a cut is made at an end portion of the second substrate 603, and a trigger for causing peeling between the second substrate 603 and the second element formation layer 605 is made, from which the second element formation layer 605 can be peeled off.

Here, the release layer 604 and the second element formation layer 605 formed over the second substrate 603 are described. In addition, by using the above method, the release layer 604 and the second element formation layer 605 to the n-th element formation layer 610 are formed over the second substrate 603 to the n-th substrate 609, so that the second element formation layer 605 to the n-th element formation layer 610 can be peeled off.

In addition, in a method in which the second element formation layer 605 is bonded to the first element formation layer 602, and the n-th element formation layer 610 is bonded to the (n−1)th element formation layer 613, an adhesive layer is selectively formed in a portion other than the opening 606, and upper and lower layers can be bonded to each other. The adhesive layer can be formed with a single layer or a stacked structure using an inorganic compound or an organic compound having an insulating property, or the like. Furthermore, a material which includes an organic compound such as polyimide, epoxy, or acrylic as a main material (e.g., a permanent thick resist film using the above element as a main material, or the like) can also be used. In addition, an anisotropic conductive material may be used as the adhesive layer. When the anisotropic conductive material is used, an adhesive layer is not required to be formed selectively, which is preferable.

As described above, the opening 606 is formed so that the upper and lower layers are electrically connected by dropping the conductive paste 611 and the through wiring 612 is formed. Therefore, a shape and a structure are formed such that a conductive layer is formed at the periphery of the opening 606 of the n-th element formation layer 610 and over an outermost surface of the (n−1)th element formation layer 613 located below the opening 606 of the n-th element formation layer 610, and the upper and lower layers are electrically connected when the conductive paste 611 is dropped.

In addition, a method for applying the conductive paste 611 over the entire surface of the layer using a spin coating method can be given as the easiest method for dropping the conductive paste 611. In the case of using this method, after the conductive paste 611 is applied by a spin coating method, a step of wiping the applied surface and removing unnecessary conductive paste 611 may be added, if necessary. Further, a method in which the conductive paste 611 is selectively dropped in the opening 606 can be applied using a droplet discharge method typified by an ink jet method, a screen printing method, or the like.

Here, an organic resin in which a conductive particle having a grain size of several tens of micrometers or less is dissolved or dispersed is used for the conductive paste 611. As the conductive particle, a fine particle of metal such as silver (Ag), copper (Cu), aluminum (Al), gold (Au), nickel (Ni), platinum (Pt), palladium (Pd), tantalum (Ta), molybdenum (Mo), or titanium (Ti); a fine particle of silver halide; carbon black; or the like can be used. In addition, as an organic region contained in the conductive paste, one or more of organic resins functioning as a binder, a solvent, a dispersing agent, and a coating material for the metal particle can be used. Typically, an organic resin such as an epoxy resin, a phenolic resin, or a silicone resin can be used. Further, when the through wiring 612 is formed, baking is preferably performed after the conductive paste 611 is dropped in the opening 606. For example, in the case of using fine particles (e.g., the grain size of the particles is greater than or equal to 1 nm and less than or equal to 100 nm) containing silver as their main component as a material of the conductive paste 611, the through wiring 612 can be formed by hardening the conductive paste 611 by baking at temperatures ranging from 150 to 300° C.

Figure 3A:
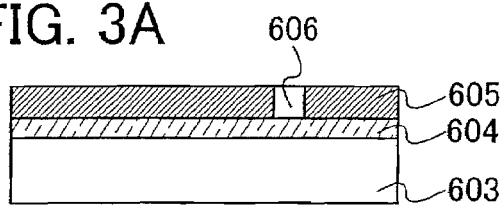
FIGS. 3A to 3D are diagrams illustrating a method for forming a semiconductor integrated circuit of the present invention.
Figure 3A:
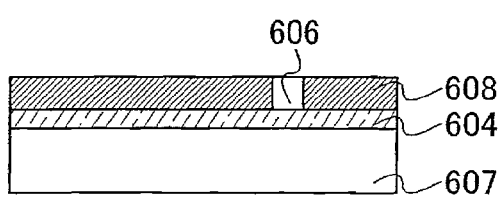
Figure 3A:
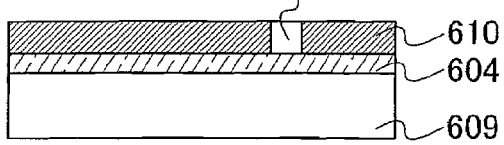
Figure 3B:
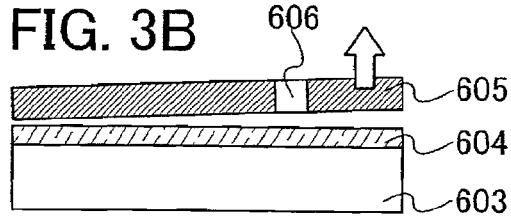
Figure 3B:
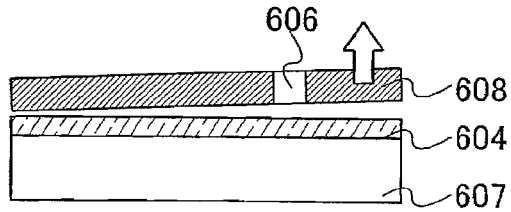
Figure 3B:
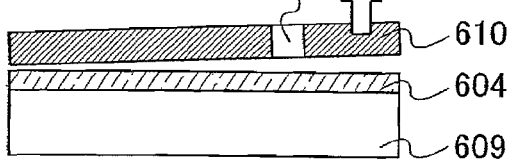
Figure 3C:
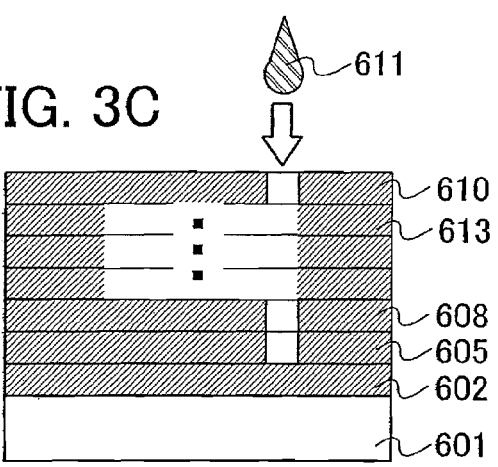
Figure 3D:
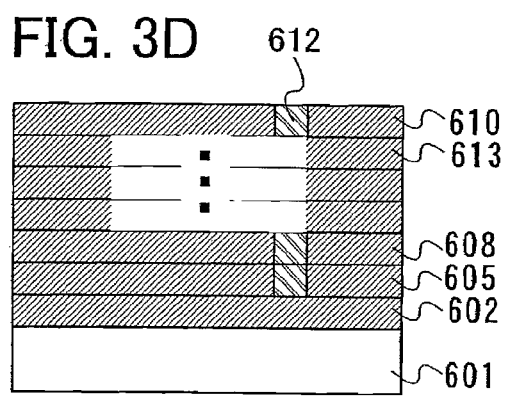

The process described above shows an example in which a process that each layer is attached to another layer and the conductive paste 611 is dropped is repeated; however, the present invention is not limited to this method, and the through wiring 612 may be formed after all the layers are stacked and the conductive paste 611 is dropped at one time. Specifically, the second element formation layer 605 to the n-th element formation layer 610 are formed over the second substrate 603 to the n-th substrate 609 respectively as shown in FIG. 3A, and the second element formation layer 605 to the n-th element formation layer 610 are peeled off as shown in FIG. 3B. Then, as shown in FIG. 3C, all of the second element formation layer 605 to the n-th element formation layer 610 are attached to the first element formation layer 602 formed over the first substrate 601. Then, as shown in FIG. 3D, the through wiring 612 is formed by dropping the conductive paste 611 in the opening 606 formed in the second element formation layer 605 to the n-th element formation layer 610, and all the stacked layers can be electrically connected.

In this case, as shown in FIGS. 3A to 3D, when the second element formation layer 605 to the n-th element formation layer 610 are overlapped, the openings 606 provided in respective layers approximately overlap each other. Note that "to approximately overlap" in this specification is used by considering an error of alignment when the element formation layers are overlapped, and misalignment of overlapped openings provided in respective layers is acceptable as long as electrical connection between a lower element formation layer and an upper element formation layer is maintained.

In this manner, by forming a semiconductor integrated circuit by the above-described method, a through wiring can be formed without performing a step of forming a through hole which penetrates a substrate or a step of polishing the back surface of the substrate; therefore, a throughput can be improved. In addition, since the back surface of the substrate is not polished, generation of dust can be suppressed, and contamination of a semiconductor element and a semiconductor integrated circuit can be prevented.

Furthermore, layers having a plurality of semiconductor elements are peeled off from the substrate and stacked over another layer without forming a through hole which penetrates the substrate or without polishing the back surface of the substrate; therefore, a substrate for forming the layer having the plurality of semiconductor elements can be reused. This is one method for forming a semiconductor integrated circuit at low cost.

In addition, since a plurality of layers having semiconductor elements is peeled off from the substrate and stacked, a semiconductor integrated circuit can be thinned. Furthermore, when a structure in which a semiconductor integrated circuit is formed over a flexible substrate or a semiconductor integrated circuit without a substrate is used, a semiconductor device which is thin, lightweight, and flexible can be formed.

Embodiment Mode 2

Figure 8A:
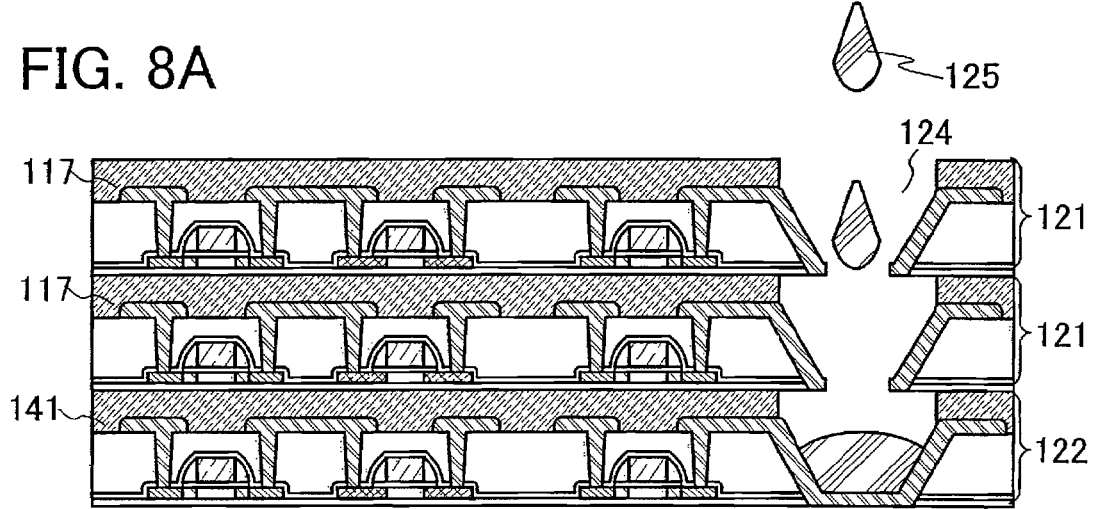
FIGS. 8A and 8B are diagrams illustrating a method for forming a semiconductor integrated circuit of the present invention.
Figure 8B:
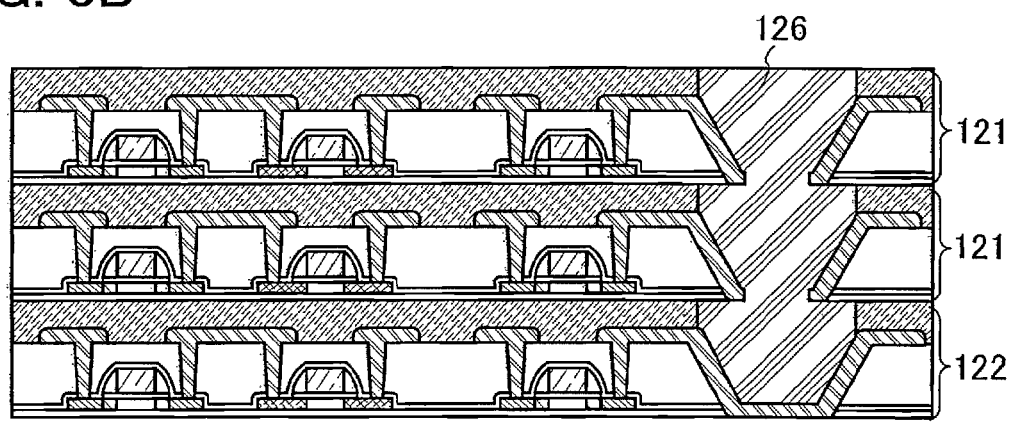
Figure 9A:
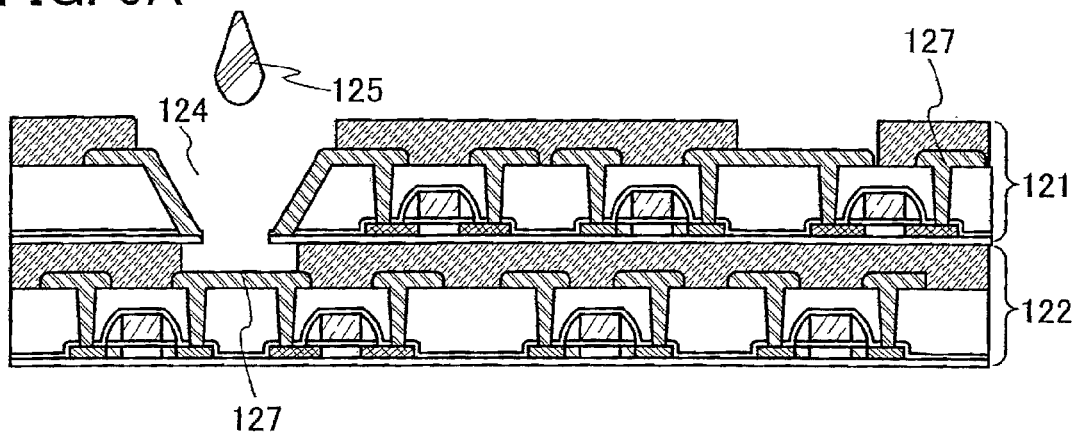
FIGS. 9A and 9B are diagrams illustrating a method for forming a semiconductor integrated circuit of the present invention.
Figure 9B:
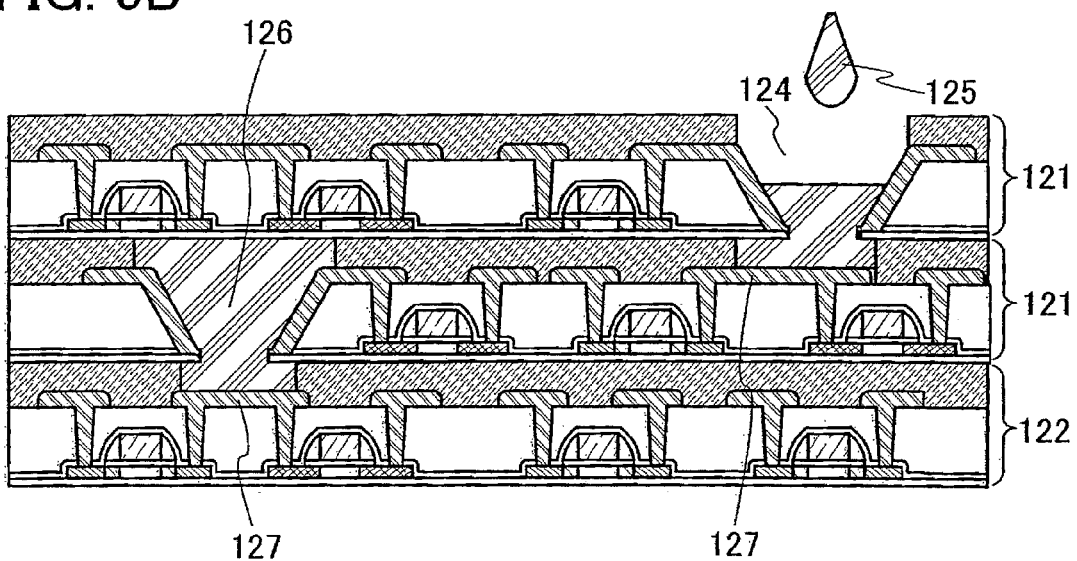
Figure 10A:
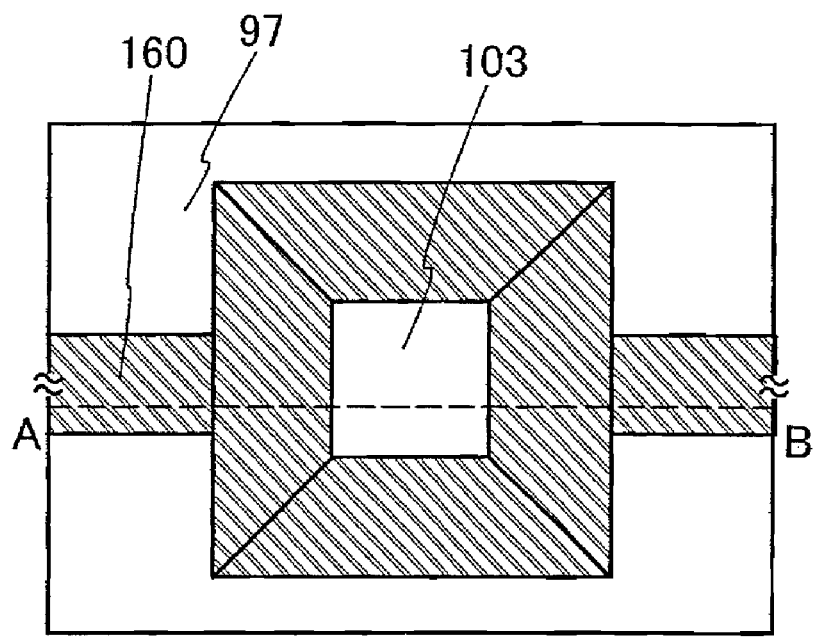
FIGS. 10A and 10B are diagrams illustrating a method for forming a semiconductor integrated circuit of the present invention.
Figure 10B:
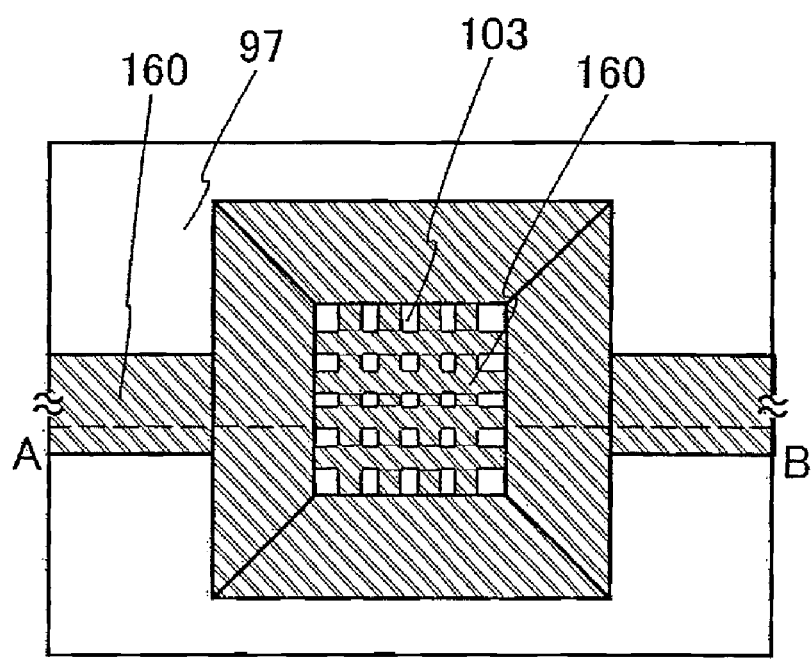

This embodiment mode will describe a method for forming the first to n-th element formation layers which form the semiconductor integrated circuit described in Embodiment Mode 1, and a method for forming a semiconductor integrated circuit by stacking those element formation layers, with reference to FIGS. 4A to 10B. Here, FIGS. 4A to 9B show cross-sectional views of a substrate, and FIGS. 10A and 10B show top views of a substrate.

First, a method for manufacturing the second to n-th element formation layers in Embodiment Mode 1 will be described. First, a first insulating layer 101 is formed over one surface of a substrate 100. Next, a release layer 102 is formed over the first insulating layer 101. Then, a second insulating layer 103 is formed over the release layer 102 (see FIG. 4A).

The substrate 100 is a substrate having an insulating surface, for example, a glass substrate, a quartz substrate, a resin (plastic) substrate, a sapphire substrate, a silicon wafer or a metal plate having an insulating film formed on its surface, or the like. As the substrate 100, a glass substrate or a plastic substrate is preferably used. When a glass substrate or a plastic substrate is used, the substrate 100 having a side of 1 meter or more or having a predetermined shape such as a square can be easily manufactured. For example, when a glass substrate or a plastic substrate which has a square shape and has a side of 1 meter or more is used, productivity can be drastically improved because a semiconductor integrated circuit to be manufactured is square. This is a great advantage compared with the case of using a silicon substrate having a circular shape with a diameter of about 30 centimeters at most.

The first, insulating layer 101 and the second insulating layer 103 are formed using a material such as an oxide of silicon, a nitride of silicon, an oxide of silicon containing nitrogen, a nitride of silicon containing oxygen, or the like by a vapor phase growth method (CVD method), a sputtering method, or the like. In addition, the first insulating layer 101 and the second insulating layer 103 may have a stacked structure. The first insulating layer 101 prevents an impurity element from the substrate 100 from entering an upper layer. If not required, the first insulating layer 101 does not have to be fowled.

The release layer 102 is formed with a single layer or a stacked layer by a sputtering method or the like by using an element selected from among tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), platinum (Pt), osmium (Os), iridium (Ir), silicon (Si), and the like; or an alloy material containing the above-described element as its main component or a compound material containing an alloy. Note that silicon contained in a layer containing silicon may be any one of amorphous, microcrystalline, and polycrystalline silicon.

When the release layer 102 has a single-layer structure, it is preferable to form a layer containing any one of tungsten, molybdenum, a mixture of tungsten and molybdenum, an oxide of tungsten, a nitride of tungsten, an oxynitride of tungsten, a nitride oxide of tungsten, an oxide of molybdenum, a nitride of molybdenum, an oxynitride of molybdenum, a nitride oxide of molybdenum, an oxide of a mixture of tungsten and molybdenum, a nitride of a mixture of tungsten and molybdenum, an oxynitride of a mixture of tungsten and molybdenum, or a nitride oxide of a mixture of tungsten and molybdenum.

When the release layer 102 has a stacked structure, for example, a tungsten layer, a molybdenum layer, or a layer containing a mixture of tungsten and molybdenum can be formed as a first layer, and a layer containing an oxide of tungsten, a nitride of tungsten, an oxynitride of tungsten, a nitride oxide of tungsten, an oxide of molybdenum, a nitride of molybdenum, an oxynitride of molybdenum, a nitride oxide of molybdenum, an oxide of a mixture of tungsten and molybdenum, a nitride of a mixture of tungsten and molybdenum, an oxynitride of a mixture of tungsten and molybdenum, or a nitride oxide of a mixture of tungsten and molybdenum can be formed as a second layer. These oxides or oxynitrides can be formed by performing oxygen plasma treatment or $N_2O$ plasma treatment to the surface of the first layer.

When the release layer 102 is formed to have a stacked structure of a layer containing metal such as tungsten and a layer containing an oxide of the metal, a layer containing silicon oxide may be formed over the layer containing the metal, so that a layer containing an oxide of the metal can be formed at an interface between the layer containing the metal and the layer containing silicon oxide.

In addition, thermal oxidization treatment, oxygen plasma treatment, treatment using highly oxidative solution such as ozone water or the like can be applied to the surface of the layer containing the metal such as tungsten to form a layer containing an oxide of the metal over the layer containing the metal, and then, a silicon nitride layer, a silicon oxynitride layer, or a silicon nitride oxide layer can be formed thereover. The layer containing a nitride of the metal, an oxynitride of the metal, and a nitride oxide of the metal can be similarly formed. Note that for the release layer 102, it is preferable to use a material which can obtain an etching selection ratio with respect to a conductive layer to be formed in a later step.

Next, a plurality of semiconductor elements 96 is formed over the second insulating layer 103. As the semiconductor elements, a transistor, a diode, a capacitor, a bipolar transistor, or the like can be used. Here, as an example, the case where a plurality of thin film transistors is formed as the semiconductor elements is shown (see FIG. 4B).

Each of the plurality of semiconductor elements 96 includes a semiconductor layer 90, a gate insulating layer 91, and a first conductive layer 92 (also referred to as a gate electrode). The semiconductor layer 90 includes impurity regions 93 which function as a source and a drain, impurity regions 94, and a channel formation region 95. The impurity regions 93 and 94 are doped with an impurity element imparting n-type conductivity (e.g., phosphorus (P) or arsenic (As)) or an impurity element imparting p-type conductivity (e.g., boron (B)). The impurity regions 94 are LDD (Lightly Doped Drain) regions. By providing the LDD regions, generation of an off current can be suppressed.

In this embodiment mode, each of the plurality of semiconductor elements 96 has a top-gate structure in which the gate insulating layer 91 is provided over the semiconductor layer 90 and the first conductive layer 92 is provided over the gate insulating layer 91. However, the structure of the plurality of the semiconductor elements 96 can have various modes without being limited to a specific structure. For example, a bottom-gate structure in which the gate insulating layer 91 is provided over the first conductive layer 92 and the semiconductor layer 90 is provided over the gate insulating layer 91; or a structure in which conductive layers are provided over and below the semiconductor layer 90 with a gate insulating layer interposed therebetween may be used. In such a way, by using a structure in which the first conductive layers 92 are provided over and below the semiconductor layer 90, a current value can be increased because a channel region is increased, or an S value can be reduced because a depletion layer is easily formed. In addition, one or more semiconductor elements selected from the plurality of semiconductor elements 96 may be a multi-gate semiconductor element which has two or more gate electrodes and two or more channel formation regions. By using a multi-gate structure, there is an effect that an off current is reduced, withstand voltage is increased to improve the reliability of a transistor, flat characteristics can be obtained without causing changes of a drain-source current very much even when a drain-source voltage is changed at the time of an operation in a saturation region, or the like. Furthermore, a source electrode or a drain electrode may be overlapped with a channel formation region (or a part thereof). By using a structure where a source electrode or a drain electrode is overlapped with a channel formation region (or a part thereof), charges accumulate in the part of the channel formation region, so that an unstable operation can be prevented.

Note that this embodiment mode shows an example of forming a thin film transistor as the plurality of semiconductor elements 96; however, various modes of transistors can be applied to a transistor in the present invention, and types of applicable transistors are not limited to a certain type. Therefore, a thin film transistor (TFT) using a non-single crystalline semiconductor film typified by amorphous silicon and polycrystalline silicon, a transistor formed using a semiconductor substrate or an SOI substrate, a MOS transistor, a junction transistor, a bipolar transistor, or the like can be applied. In addition, a transistor using a compound semiconductor such as ZnO or a—InGaZnO, a transistor using an organic semiconductor or a carbon nanotube, and other transistors may be applied as well. Note that a non-single crystalline semiconductor film may contain hydrogen or halogen.

The plurality of semiconductor elements 96 which forms a semiconductor integrated circuit forms a circuit combining a transistor, a diode (e.g., a PN diode, a PIN diode, a Schottky diode, or a diode-connected transistor), or the like. For example, when a transistor is used as a switch which forms a logic circuit, the polarity (the conductivity type) of the transistor is not particularly limited to a certain type. However, when an off current is preferred to be small, a transistor of a polarity with a small off current is desirably used. As a transistor with a small off current, there is a transistor provided with an LDD region, a transistor with a multi-gate structure, or the like.

In addition, it is desirable that an n-channel transistor be used when a potential of a source terminal of the transistor being operated as a switch is closer to the low-potential-side power supply (e.g., Vss, GND, or 0 V), while a p-channel transistor be used when the potential of the source terminal is closer to the high-potential-side power supply (e.g., Vdd). This is because the transistor can easily function as a switch since the absolute value of the gate-source voltage of the transistor can be increased. A CMOS switch may also be used by using both n-channel and p-channel transistors. When a CMOS switch is used, the switch can be operated appropriately even in a case where a voltage to be outputted through the switch (that is an input voltage of the switch) is higher than an output voltage, a case where a voltage to be outputted through the switch is lower than an output voltage, or the like.

Furthermore, the plurality of semiconductor elements 96 provided over the substrate is not limited to transistors, and various kinds of elements can be formed according to the function of a semiconductor device to be formed. For example, in the case of forming a semiconductor device which transmits and receives information without contact (e.g., RFID, an IC tag, or the like), an element such as a capacitor, a resistor, an inductor, or a diode can be formed over a substrate. In the case of forming a semiconductor device having a function of storing data (also referred to as a memory or a memory device), a transistor and a memory element can be formed over a substrate. Here, the memory element can have various shapes and functions in accordance with characteristics required of a semiconductor device. For example, a memory element in which a layer having an organic material is sandwiched between two conductive layers or a transistor-type memory element having a floating gate can be formed.

Figure 4A:
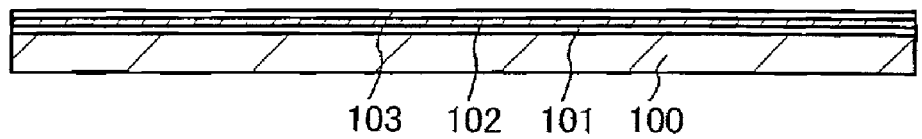
FIGS. 4A to 4D are diagrams illustrating a method for forming a semiconductor integrated circuit of the present invention.
Figure 4B:
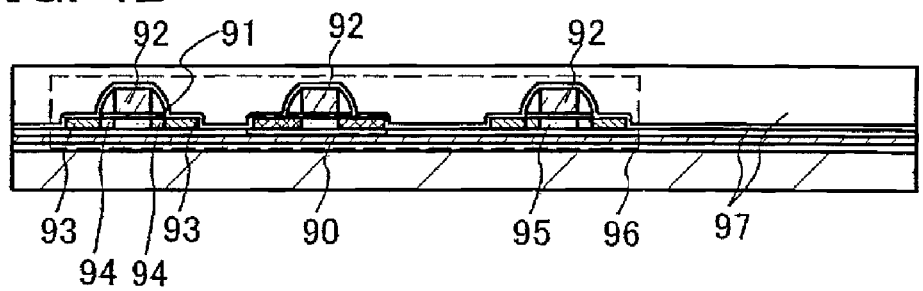

Next, fourth insulating layers 97 are formed over the plurality of transistors 96 (see FIG. 4B). The fourth insulating layers 97 are formed using a material such as an oxide of silicon, a nitride of silicon, polyimide, acrylic, siloxane, an oxazole resin, or the like by an arbitrary film formation method such as a vapor phase growth method, a sputtering method, an SOG (Spin On Glass) method, a droplet discharge method (e.g., an ink-jet method), or the like. Siloxane is composed of, for example, a skeleton formed by the bond of silicon and oxygen, in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. An oxazole resin is, for example, photosensitive polybenzoxazole or the like. The oxazole resin which has a lower relative permittivity (which is about 2.9) than the relative permittivity of polyimide or the like (which is about 3.2 to 3.4) can be used to suppress the generation of parasitic capacitance and to perform a high-speed operation.

This embodiment mode shows an example in which two insulating layers are formed over the plurality of transistors 96, as the insulating layers 97; however, the present invention is not limited to this structure. In other words, there are no particular limitations on the number of insulating layers provided over the plurality of transistors 96. In the case of forming the insulating layer in a single-layer structure, a manufacturing process is simplified. On the other hand, in the case of forming the insulating layer in a stacked structure, stress applied to the semiconductor elements can be relieved compared to the case of forming the insulating layer in a single-layer structure.

Figure 4C:
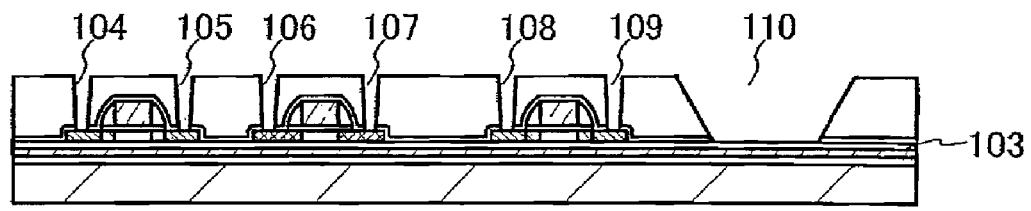

Next, contact holes 104 to 109 are formed in the fourth insulating layers 97 (see FIG. 4C). A method for forming the contact holes 104 to 109 is not limited in particular. For example, the contact holes 104 to 109 can be formed by providing a mask formed of a resist or the like over the fourth insulating layers 97 and then etching the fourth insulating layers 97.

In addition, by etching the fourth insulating layers 97, an opening 110 is formed such that a part of the second insulating layer 103 is exposed. The opening 110 can be formed at the same time as the contact holes 104 to 109, or it can be formed separately.

When the opening 110 is formed at the same time as the contact holes 104 to 109, the opening 110 is formed such that the part of the second insulating layer 103 is exposed by etching the fourth insulating layers 97, at the same time as the formation of the contact holes 104 to 109.

When the opening 110 is formed separately from the contact holes 104 to 109, after the formation of the contact holes 104 to 109, the opening 110 is formed such that the part of the second insulating layer 103 is exposed by etching the fourth insulating layers 97. When the opening 110 is formed separately from the contact holes 104 to 109, in a step shown later, a second conductive layer is formed over the fourth insulating layers 97 and the contact holes 104 to 109, and then, the opening 110 can be formed such that a part of the release layer 102 is exposed by etching the fourth insulating layers 97 and the second insulating layer 103.

This embodiment mode shows an example in which the opening 110 is formed at the same time as the contact holes 104 to 109.

A method for forming the opening 110 is not limited in particular. For example, similarly to the formation of the contact holes 104 to 109, the opening 110 can be formed by providing a mask formed of a resist or the like over the fourth insulating layers 97 and then etching the fourth insulating layers 97. An etching method for forming the opening 110 is not limited in particular, and a wet etching method, a dry etching method, or a method combining them may be used.

Note that when the opening 110 is formed by using a general etching method, a side surface of the opening is formed at an angle of about 70° to 80° with respect to the substrate. However, in this embodiment mode, by setting etching conditions appropriately, the side surface of the opening 110 is preferably formed at an angle of 10° to 60° with respect to the substrate, and more preferably, at an angle of 30° to 50°. With this angle, the second conductive layer to be formed later is easily formed on the side surface of the opening 110. However, the present invention is not limited to this structure.

Figure 4D:
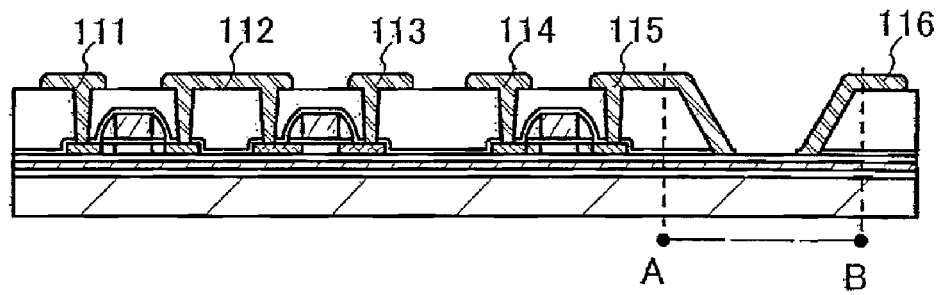

Next, second conductive layers 111 to 116 are formed over the fourth insulating layers 97, the contact holes 104 to 109, and the opening 110 (see FIG. 4D). The second conductive layers 111 to 115 are connected to sources (also referred to as source regions or source electrodes) or drains (also referred to as drain regions or drain electrodes) of the plurality of semiconductor elements 96, and the second conductive layer 116 and a part of the second conductive layer 115 are formed on the side surface of the opening 110.

By a sputtering method or the like, the second conductive layers 111 to 116 are formed in a single-layer structure or a stacked structure of the following: an element selected from among titanium, tungsten, chromium, aluminum, tantalum, nickel, zirconium, hafnium, vanadium, iridium, niobium, lead, platinum, molybdenum, cobalt, rhodium, and the like; an alloy material containing the above-described element as its main component; or a compound material of an oxide or a nitride containing the above-described element as its main component. As an example of the stacked structure of each of the second conductive layers 111 to 116, there are a three-layer structure of titanium, aluminum, and titanium, a five-layer structure of titanium, titanium nitride, aluminum, titanium, and titanium nitride, a five-layer structure of titanium, titanium nitride, aluminum doped with silicon, titanium, and titanium nitride, and the like. When the second conductive layers 111 to 116 are formed with a stacked structure, contact resistance with the source or drain can be lowered. Further, stress applied to the second conductive layers 111 to 116 can be relieved.

Here, for description of the opening 110, FIG. 10A shows a top view corresponding to A-B of FIG. 4D. In the opening 110, a second conductive layer 160 is formed over the fourth insulating layers 97 and the second insulating layer 103. Note that the second conductive layer 160 corresponds to the second conductive layers 115 and 116 of FIG. 4D which are seen from the top surface. In addition, a bottom face of the opening 110 is not covered with the second conductive layer 160 and the fourth insulating layers 97, and the second insulating layer 103 is exposed. Here, the bottom face of the opening is provided with one hole (a portion that the second insulating layer 103 is exposed); however, as shown in FIG. 10B, the bottom face may be provided with a plurality of second conductive layers 160, so that the bottom face of the opening 110 may have a mesh shape, for example. Here, the shapes of the opening 110 and the hole of the bottom face are rectangular; however, a circular shape, a polygonal shape, or the like may also be used. Note that the rectangular shape and the polygonal shape include a shape whose corner portion is rounded.

Note that the size of the opening 110 may be set considering the size of the conductive particle included in a conductive material which is used in a later step or the time to be spent on an etching process for providing the opening 110. In other words, the size of the opening 110 may be selected so that the conductive particle included in the conductive material which is used in a later step may have a size capable of passing through the opening 110, and the time to be spent on a process. Specifically, the size of the opening is preferably 1 μm or more. In addition, in consideration of a space for forming a semiconductor element or the like, the size of the opening 110 is preferably 50 μm or less.

By the above process, the second element formation layer to the n-th element formation layer including the second insulating layer 103, the plurality of semiconductor elements 96, the fourth insulating layers 97, the second conductive layers 111 to 116, and the opening 110 can be formed over the second substrate to the n-th substrate.

Figure 5A:
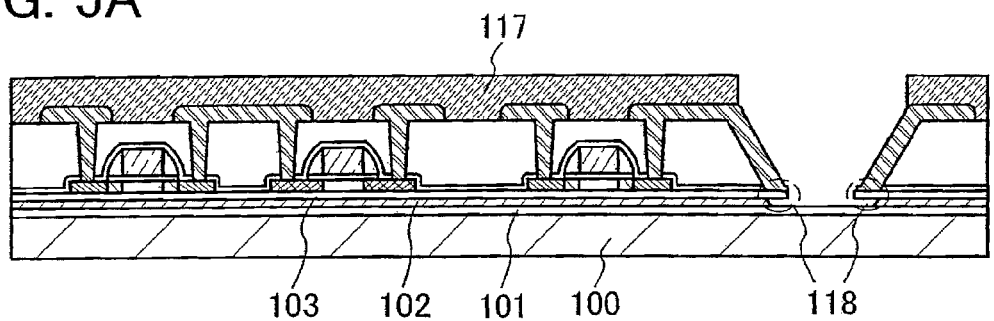
FIGS. 5A to 5C are diagrams illustrating a method for forming a semiconductor integrated circuit of the present invention.

Next, a fifth insulating layer 117 is selectively formed over the fourth insulating layers 97 and the second conductive layers 111 to 116 (see FIG. 5A). Since the fifth insulating layer 117 is not formed over the opening 110, parts of the second conductive layers 115 and 116 are exposed. Since the fifth insulating layer 117 functions to attach a layer having semiconductor elements, the fifth insulating layer 117 is also referred to as an adhesive layer. In addition, since the fifth insulating layer 117 is used as an adhesive layer, the fifth insulating layer 117 can be formed after peeling and at the time of attachment to another layer which are performed in a later step. This embodiment mode shows an example in which the fifth insulating layer 117 is formed before a peeling process.

The fifth insulating layer 117 can be formed using various methods as follows. For example, when a photosensitive permanent resist is formed with a slit coater, and light exposure and development are performed, the fifth insulating layer 117 can be formed. In addition, after a permanent-resist dry film is attached to the fourth insulating layers 97 and the second conductive layers 111 to 116, light exposure and development are performed, so that the fifth insulating layer 117 can be formed. Alternatively, when an insulating resin such as an epoxy resin, an acrylic resin, or a polyimide resin is used, the fifth insulating layer 117 can be formed having a thickness of 5 to 200 μm, preferably 15 to 35 μm by a screen printing method, a droplet discharge method, or the like. Note that the fifth insulating layer 117 can have a uniform thickness by a screen printing method or a droplet discharge method. A screen printing method is preferably used because the screen printing method can shorten a manufacturing time and a device is inexpensive. Note that after the fifth insulating layer 117 is formed, heat treatment is performed, if required.

Next, a release-layer removal region 118 in which the release layer is removed is formed by removing the second insulating layer 103 which is exposed at the bottom face of the opening 110 and the part of the release layer 102 below the second insulating layer 103 with an etchant (see FIG. 5A). Here, an example in which the second insulating layer 103 and the release layer 102 are removed by etching is shown; however, only the second insulating layer 103 may be removed and a step of removing the release layer 102 is not required to be performed. When a later peeling process can be performed, time can be shortened; therefore, an etching process of the release layer 102 is preferably reduced.

As described above, in the case where the opening 110 is formed after the second conductive layer is formed or after the fifth insulating layer 117 is formed, the second insulating layer 103 can be removed by etching at the time of forming the opening 110; therefore, the above-described etching process of the second insulating layer 103 can be omitted. In this case, the part of the release layer 102 can be removed and the release-layer removal region 118 can be formed at the time of forming the opening 110.

Figure 5B:
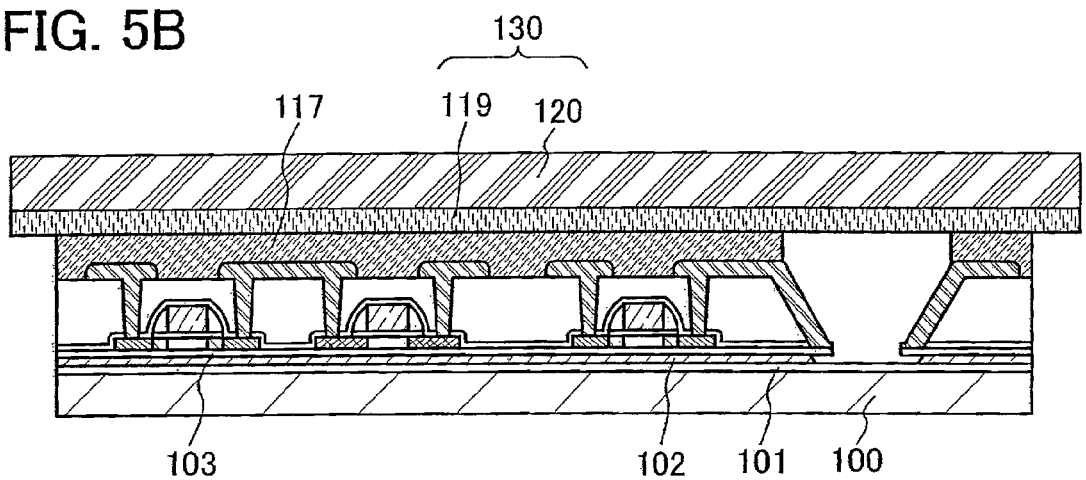

Next, a supporting substrate 130 is provided over the fifth insulating layer 117 (see FIG. 5B). The supporting substrate 130 is a substrate in which a sixth insulating layer 120 and an adhesive layer 119 are stacked. The adhesive layer 119 is a thermoplastic resin, the adhesivity of which decreases by heat treatment, which is formed using, for example, a material which softens by heating, a material in which a micro capsule that expands by heating or a foaming agent is mixed, a material in which thermal meltability or a pyrolytic property is given to a thermosetting resin, a material in which interface intensity is deteriorated because of entry of moisture, or a material in which a water-absorbing resin is expanded in accordance with the entry of moisture. In this specification, the supporting substrate in which the sixth insulating layer 120 and the adhesive layer 119 are combined is also referred to as a supporting substrate of heat-peeling type.

In addition, instead of the supporting substrate of heat-peeling type, a heat-peeling film, the adhesivity of which is decreased by heat treatment, or a UV (ultraviolet) release film, the adhesivity of which is decreased by UV (ultraviolet) irradiation, or the like may be used. A UV film is a film in which the sixth insulating layer 120 and the adhesive layer 119, the adhesion of which is weakened by UV (ultraviolet) irradiation are stacked.

Figure 5C:
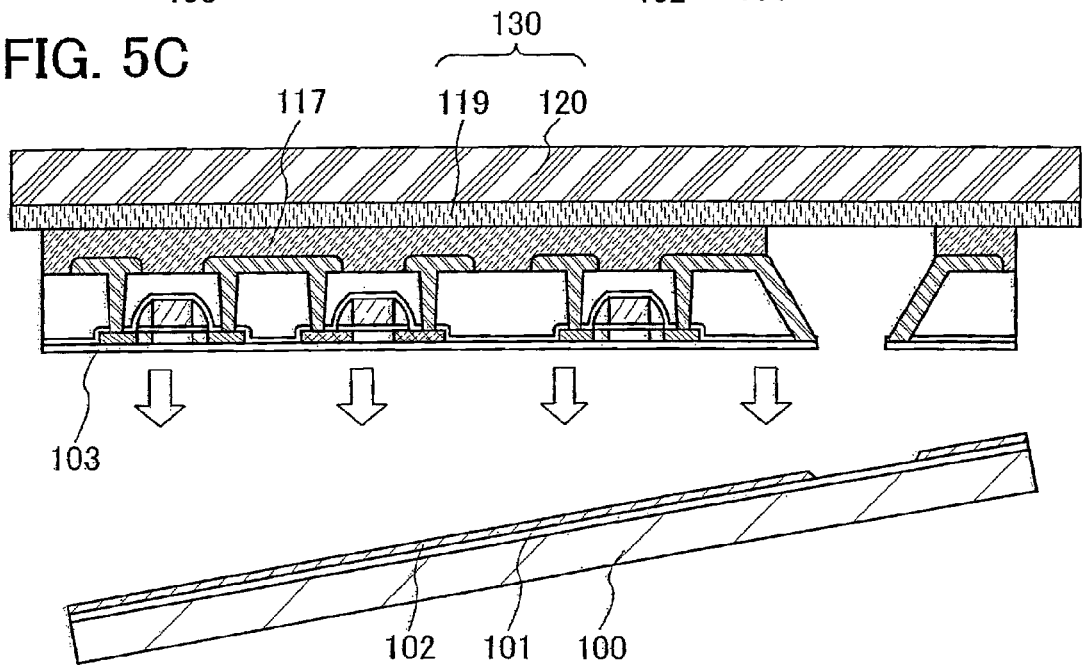

Next, by using the supporting substrate 130, the second element formation layer to the n-th element formation layer are peeled off from the substrate 100 (see FIG. 5C). The peeling of an n-th element formation layer 121 from the substrate 100 is performed either inside the release layer 102 or at the interface between the release layer 102 and the second insulating layer 103 as a boundary. The structure shown in FIGS. 5A to 5C is the case where the peeling is performed at the interface between the release layer 102 and the second insulating layer 103 as a boundary. In this manner, the peeling process can be performed easily in a short time by using the supporting substrate 130.

Figure 6A:
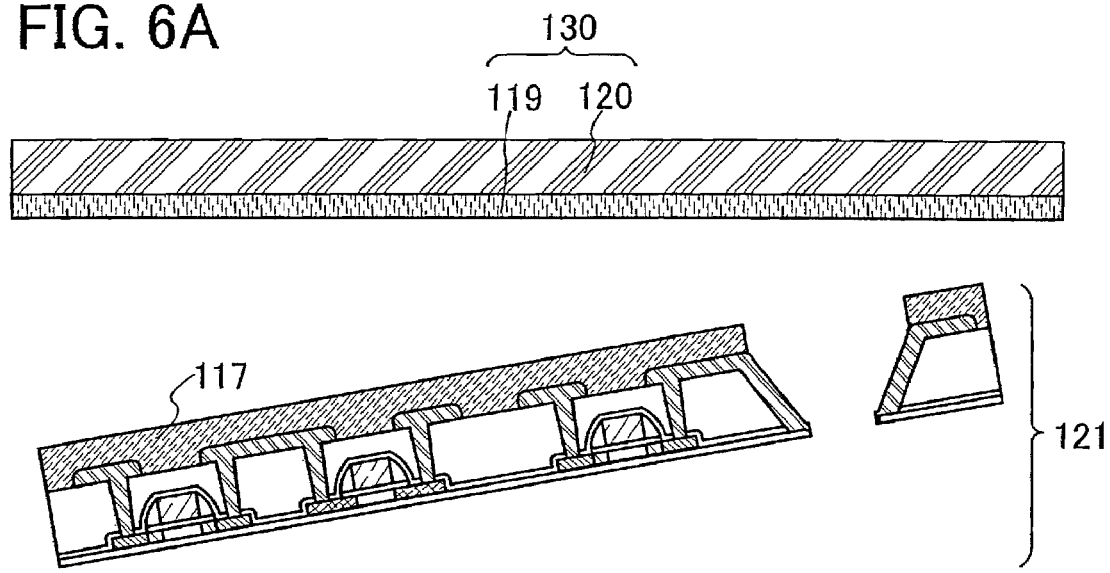
FIGS. 6A and 6B are diagrams illustrating a method for forming a semiconductor integrated circuit of the present invention.

Next, by performing heat treatment, the nth element formation layer 121 is separated from the supporting substrate 130 (see FIG. 6A). As described above, since the supporting substrate 130 is a substrate of heat-peeling type, adhesivity between the supporting substrate 130 and the fifth insulating layer 117 is decreased by heat treatment, so that the n-th element formation layer 121 can be separated from the supporting substrate 130.

Figure 6B:
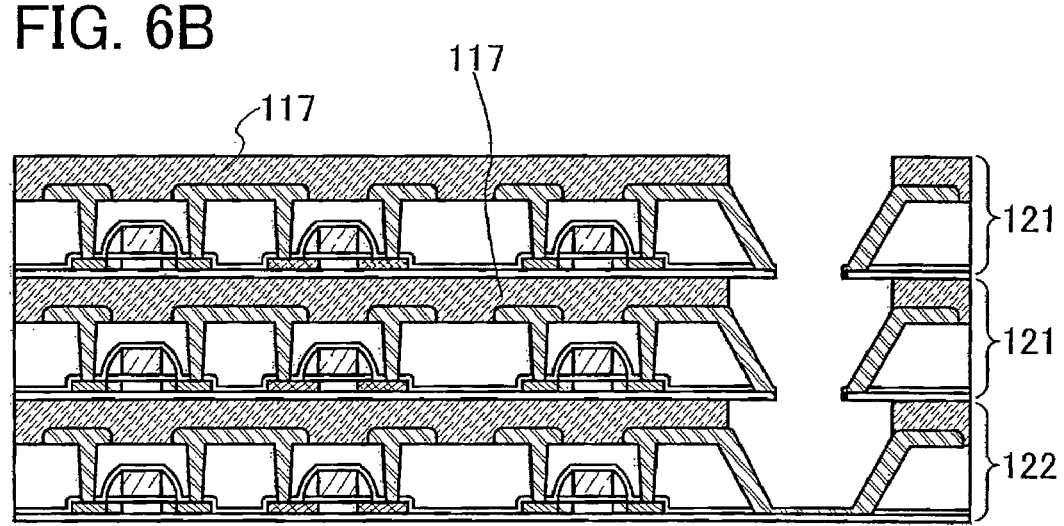

Next, when a first element formation layer 122 having semiconductor elements, and the second element formation layer to the n-th element formation layer 121 are stacked, a semiconductor integrated circuit having a plurality of semiconductor elements is formed (see FIG. 6B). FIG. 6B shows a stacked structure of three layers of the first element formation layer 122 to the n-th element formation layer 121 (n=3). However, the present invention is not limited to this structure; the element formation layer may be formed to have two layers or three or more layers, and a practitioner may select the number of element formation layers in accordance with the intended use.

In the above process, after the first element formation layer 122 and the second element formation layer 121 are stacked and attached to each other, the second element formation layer 121 and the supporting substrate 130 can be separated. Then, the third element formation layer to the n-th element formation layer 121 may be stacked. In this case, a step of attaching the element formation layer and a step of separating the supporting substrate 130 are repeated alternately. In this manner, in a method for manufacturing the above-described semiconductor integrated circuit, the process order may be changed so that manufacture is easily performed.

Here, FIGS. 6A and 6B show an example in which the first element formation layer 122 having the semiconductor elements has an opening, and openings in respective layers approximately overlap each other when the first element formation layer 122 to the n-th element formation layer (here, the n-th element formation layer 121 (n=3)) are stacked and attached to each other, as shown in FIGS. 3A to 3D in Embodiment Mode 1. In this case, the fifth insulating layer 117 is selectively formed at a portion other than the opening.

As described above, in a semiconductor integrated circuit in which a plurality of layers having semiconductor elements are stacked, the first element formation layer 122 which is a bottom layer may be formed by using a method similar to the above-described method for forming the second element formation layer to the n-th element formation layer which serve as an upper layer. In addition, the first element formation layer 122 may be formed without providing the release layer 102 and the opening 110.

However, the first element formation layer 122 which is the bottom layer can be formed by providing the release layer 102 and the opening 110, similarly to the second element formation layer to the n-th element formation layer which serve as the upper layer. For example, the first element formation layer 122 is formed using a glass substrate or a semiconductor substrate, and then peeled off from the substrate and attached to a plastic substrate, a film, or the like; therefore, a semiconductor integrated circuit can be transferred from a fabrication substrate to another substrate. In this way, by transferring the first element formation layer 122 from a fabrication substrate to another substrate, a thin and flexible semiconductor integrated circuit can be formed.

This embodiment mode will describe a method for manufacturing the first element formation layer 122 to serve as the bottom layer in the above manner, with reference to FIGS. 7A to 7D. The first element formation layer 122 is provided with the plurality of semiconductor elements 96, the fourth insulating layers 97, contact holes, and an opening over a substrate, similarly to the second element formation layer to the n-th element formation layer each having the semiconductor elements shown in FIGS. 5A to 5C. Then, the second conductive layers 111 to 114 and a second conductive layer 140 are formed over the contact holes and the opening (see FIG. 7A).

Figure 7A:
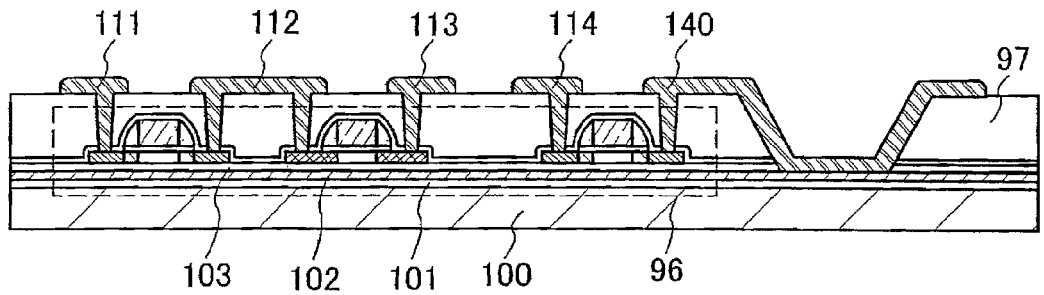
FIGS. 7A to 7D are diagrams illustrating a method for forming a semiconductor integrated circuit of the present invention.
Figure 7B:
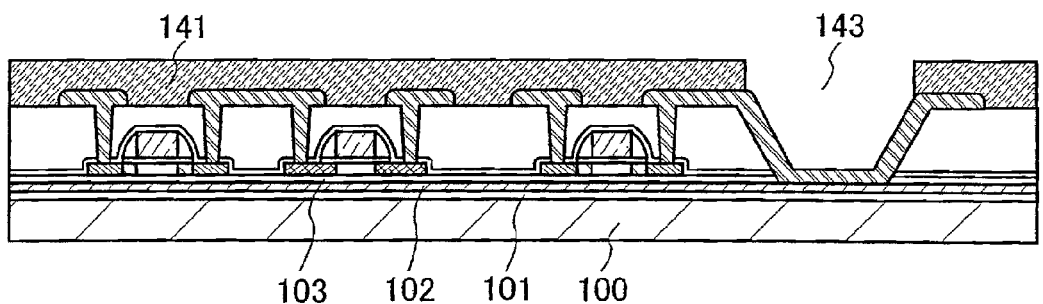

Next, a fifth insulating layer 141 is selectively formed over the fourth insulating layers 97, the second conductive layers 111 to 114, and the second conductive layer 140 (see FIG. 7B). Since the fifth insulating layer 141 is not formed over an opening 143, similarly to the fifth insulating layer 117, a part of the second conductive layer 140 is exposed. The fifth insulating layer 141 also functions as an adhesive layer for bonding stacked element formation layers to each other.

Figure 7C:
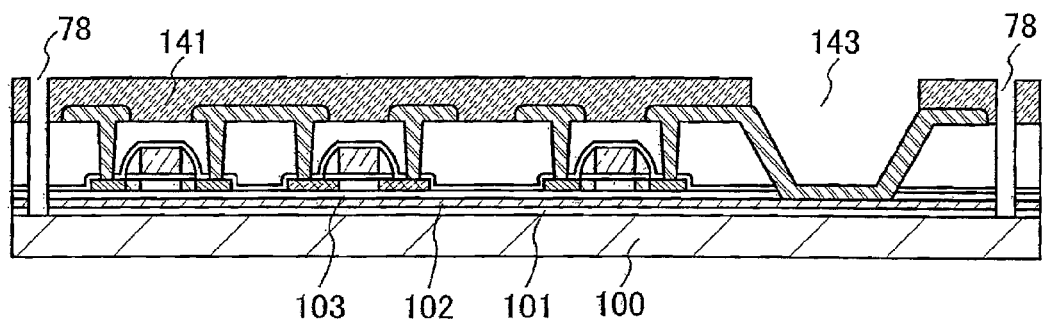

When the first element formation layer is formed, openings 78 for peeling are formed so as to expose at least part of the release layer 102 (see FIG. 7C). In terms of short processing time, this step is preferably carried out by laser beam irradiation. Laser beam irradiation is performed from the surface of the fifth insulating layer 141 to the first insulating layer 101, the release layer 102, the second insulating layer 103, the fourth insulating layers 97, and the fifth insulating layer 141. Then, the openings 78 for peeling are provided in the second insulating layer 103, the fourth insulating layers 97, and the fifth insulating layer 141. The structure shown in FIG. 7C is the case where a laser beam reaches up to the first insulating layer 101, and the openings 78 are formed in the first insulating layer 101, the release layer 102, the second insulating layer 103, the fourth insulating layers 97, and the fifth insulating layer 141. Note that the laser beam may reach up to the substrate 100.

In the step of irradiation of the above-described laser beam, ablation processing is used. In the ablation processing, a phenomenon is used in which a molecular bond in a portion irradiated with a laser beam, that is, a portion which has absorbed a laser beam is photolyzed, cut, and vaporized. In other words, an intermolecular bond of molecules which form the insulating layer is cut by photolysis and vaporized by laser beam irradiation; thereby forming the openings 78 for peeling.

In addition, as a laser beam, a solid state laser with a wavelength of 150 to 380 nm that is an ultraviolet light region is preferably used. More preferably, an $Nd:YVO_4$ laser with a wavelength of 150 to 380 nm may be used. This is because, as for the $Nd:YVO_4$ laser with a wavelength of 150 to 380 nm, light is easily absorbed in the insulating layer compared with other lasers on longer wavelength side, and ablation processing is possible. Moreover, the periphery of a processed portion is not affected and processability is good. In this manner, by providing the openings 78 for peeling, a peeling process can be made easily.

Figure 7D:
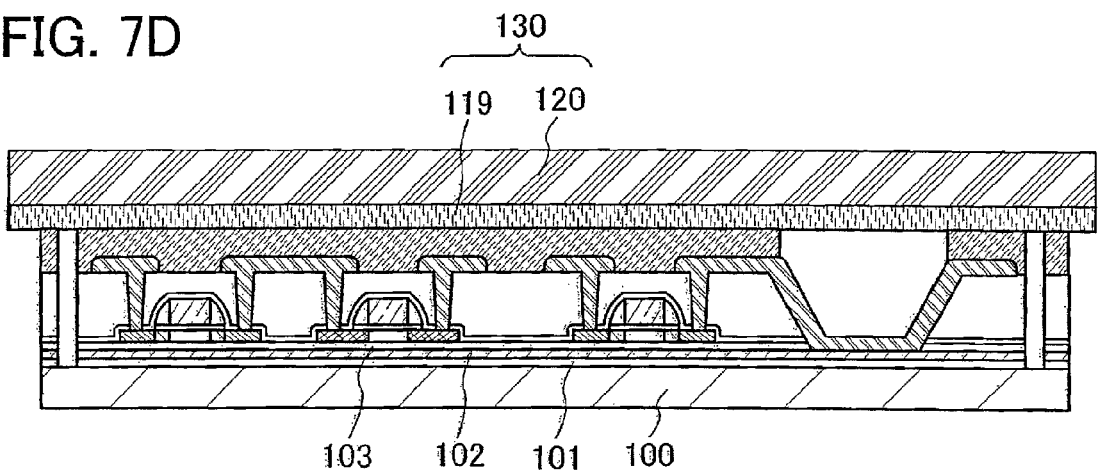

Note that the openings 78 for peeling shown in FIG. 7C are not necessarily provided, and this step can be omitted to move on to a step of FIG. 7D.

When the openings 78 are formed and when the openings 78 are not formed, the supporting substrate 130 is provided over the fifth insulating layer 141 formed in FIG. 7B (see FIG.

7D). The supporting substrate 130 is a substrate in which the sixth insulating layer 120 and the adhesive layer 119 are stacked, and the supporting substrate of heat-peeling type which is described above is used in this embodiment mode.

Next, by using the supporting substrate 130, the first element formation layer 122 is peeled off from the substrate 100. This peeling process may use a method similar to the method for forming the second element formation layer to the n-th element formation layer; therefore, description thereof is omitted here. Then, after the first element formation layer 122 is peeled off from the substrate 100, the first element formation layer 122 may be attached to another substrate.

Then, as shown above, the n-th element formation layer 121 (n=2) is attached to the first element formation layer 122, and the n-th element formation layer 121 (n=3) is attached to the n-th element formation layer 121 (n=2). A semiconductor integrated circuit of the present invention is formed by attaching n element formation layers including the first element formation layer to the n-th element formation layer and staking, in accordance with a practitioner's needs. In this embodiment mode, a semiconductor integrated circuit is formed by stacking three layers of the first element formation layer 122 to the n-th element formation layer 121 (n=3) (see FIG. 6B).

Next, an opening 124 provided in the semiconductor integrated circuit in which the first element formation layer 122 to the n-th element formation layer each having the semiconductor elements (in the diagram, the n-th element formation layer 121 (n=3)) are stacked, is filled with a conductive material. In this embodiment mode, a conductive paste 125 is dropped in the opening 124 (see FIG. 8A). As the conductive paste 125, a conductive particle having a grain size of several micrometers or less which is dissolved or dispersed in an organic resin is used, as described above. As the conductive particle, a fine particle of metal of one or more of Ag, Au, Cu, Ni, Pt, Pd, Ir, Rh, W, Al, Ta, Mo, Cd, Zn, Fe, Ti, Zr and Ba; a fine particle of silver halide; carbon black; or the like can be used. In addition, as an organic region, one or more of organic resins functioning as a binder, a solvent, a dispersing agent, and a coating for the metal particle can be used. Typically, an organic resin such as an epoxy resin or a silicone resin can be used.

Further, for example, in the case of using conductive paste having fine particles (e.g., the grain size of the particles is greater than or equal to 1 nm and less than or equal to 100 nm) containing silver as their main component, a conductive layer can be obtained by hardening the conductive paste by baking at temperatures ranging from 150 to 300° C. By these steps, a semiconductor integrated circuit in which the stacked layers having the plurality of semiconductor elements are electrically connected with a through wiring 126 can be formed (see FIG. 8B).

FIGS. 8A and 8B show an example in which the first element formation layer to the n-th element formation layer are stacked and attached to each other such that the openings in respective layers approximately overlap each other, and then the through wiring 126 is formed by dropping the conductive paste 125, as shown in FIGS. 3A to 3D in Embodiment Mode 1. However, the openings in respective layers are not necessarily overlapped with each other when the first element formation layer to the n-th element formation layer are stacked and attached to each other; for example, the structure shown in FIGS. 2A to 2G in Embodiment Mode 1 may be used. An example of this case is shown in FIGS. 9A and 9B.

When the openings 124 are formed without being overlapped with each other, a second conductive layer 127 is formed at a portion located directly below the opening 124, for example, at an uppermost portion of the (a−1)th layer directly below the opening of the a-th layer (here, a is 2 to n). In addition, the fifth insulating layer is not formed over the opening 124 of the a-th layer and the second conductive layer 127 of the (a−1)th layer, and the fifth insulating layer is selectively formed in a region other than the region (see FIG. 9A). Then, as shown in FIG. 9A, after the second element formation layer 121 is attached to the first element formation layer 122, the through wiring 126 is formed by dropping the conductive paste 125. Then, as shown in FIG. 9B, after the third element formation layer 121 is attached to the second element formation layer 121, the through wiring 126 is formed by dropping the conductive paste 125. Then, attachment of element formation layers up to the n-th layer and formation of the through wiring 126 by dropping the conductive paste 125 are repeated alternately, so that a semiconductor integrated circuit can be formed.

When a conductive layer is obtained by hardening the conductive paste 125 by baking, attachment of the element formation layers and dropping of the conductive paste 125 are repeated, and baking may be performed after all the first element formation layer 122 to the n-th element formation layer 121 are stacked. In this manner, a semiconductor integrated circuit in which the first element formation layer 122 to the n-th element formation layer 121 having a plurality of semiconductor elements, which are stacked, are electrically connected with the through wiring 126 can be formed.

By forming a semiconductor integrated circuit using this embodiment mode, a step of forming a through hole or a step of polishing the back surface of the substrate for forming a through hole can be omitted; therefore, time required for a process for manufacturing the semiconductor integrated circuit can be shortened. In addition, since a through hole is not formed in a substrate, or since the back surface of the substrate is not polished, a material of the substrate is not limited and the substrate can be reused. Accordingly, the semiconductor integrated circuit can be formed at low cost. Furthermore, since a plurality of layers having semiconductor elements is peeled off from the substrate and stacked, a semiconductor integrated circuit which is small, thin, and flexible can be formed.

Embodiment Mode 3

This embodiment mode will describe a method for forming a semiconductor integrated circuit which has a different structure from Embodiment Mode 2, with reference to drawings. This embodiment mode differs from Embodiment Mode 2 in that, when the first element formation layer to the n-th element formation layer are stacked, a conductive material is sandwiched between the element formation layers.

Figure 11A:
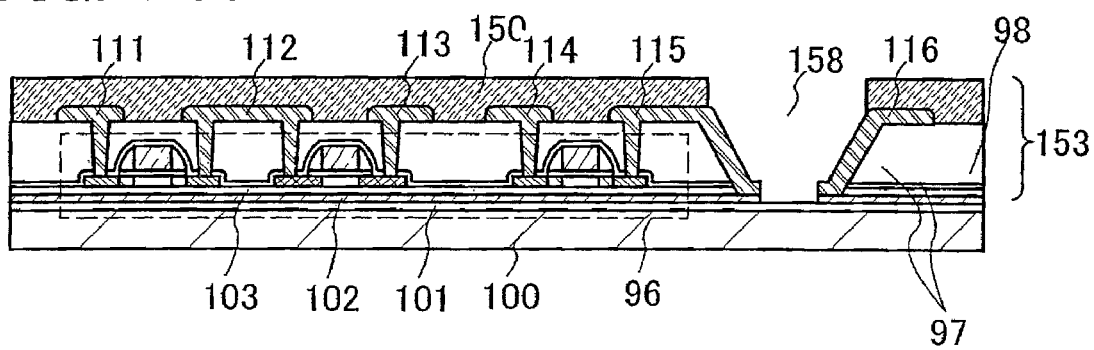
FIGS. 11A to 11C are diagrams illustrating a method for forming a semiconductor integrated circuit of the present invention.
Figure 11B:
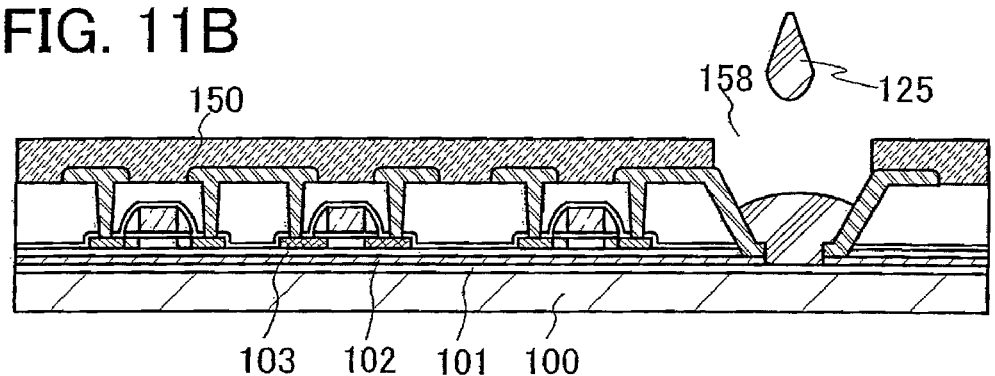
Figure 11C:
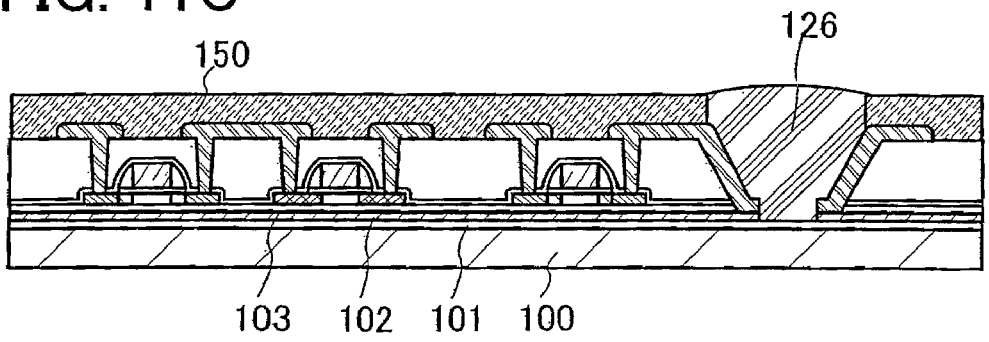

FIGS. 11A to 11C show cross-sectional views of the first element formation layer to the n-th element formation layer for forming a semiconductor integrated circuit. Since steps up to and including the formation of the second conductive layers 111 to 116 are the same as the steps up to and including the stage shown in FIG. 4D of Embodiment Mode 2, description thereof is omitted here. A fifth insulating layer 150 is selectively formed so as to cover the fourth insulating layers 97 and the second conductive layers 111 to 116 (see FIG. 11A). The fifth insulating layer 150 is not formed over an opening 158 provided in an n-th element formation layer 153 including semiconductor elements.

Here, a method for forming the opening 158 is described. The opening 158 is formed by removing a part of the fourth insulating layers 97, at the same time as the formation of contact holes. In addition, after the second conductive layers 111 to 116 are formed in the contact holes, the second insulating layer 103 at the bottom face of the opening and the release layer 102 can be removed. Alternatively, after the fifth insulating layer 150 is formed over the second conductive layers 111 to 116 and the fourth insulating layers 97, the second insulating layer 103 at the bottom face of the opening and the release layer 102 may be removed.

Next, the conductive paste 125 is dropped in the opening 158 provided in the n-th element formation layer 153 (see FIG. 11B). As described in the above embodiment mode, as the conductive paste 125, a conductive particle having a grain size of several nanometers to several micrometers which is dissolved or dispersed in an organic resin is used. The through wiring 126 is formed by a step of dropping the conductive paste 125 (see FIG. 11C).

Figure 12A:
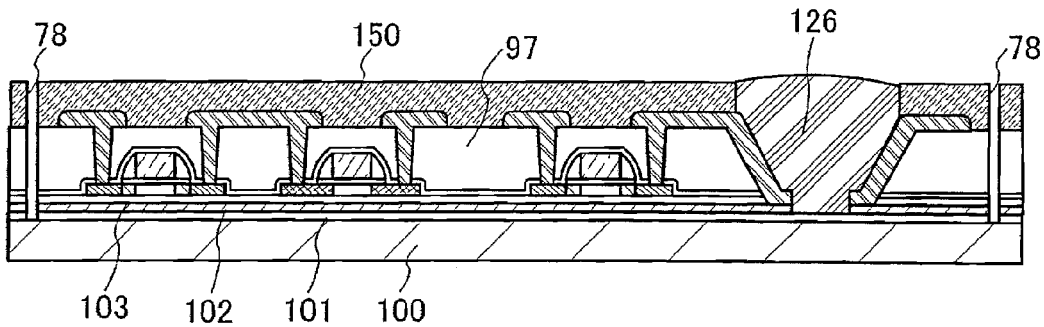
FIGS. 12A to 12C are diagrams illustrating a method for forming a semiconductor integrated circuit of the present invention.

Next, the openings 78 for peeling are formed so as to expose at least part of the release layer 102 (see FIG. 12A). As described in the above embodiment mode, this step may be carried out by laser beam irradiation. Laser beam irradiation is performed from the surface of the fifth insulating layer 150, and the openings 78 for peeling are formed so as to expose at least part of the release layer 102. The structure illustrated is the case where a laser beam reaches up to the first insulating layer 101, and the first insulating layer 101, the release layer 102, the second insulating layer 103, the fourth insulating layers 97, and the fifth insulating layer 150 are separated. In addition, here, an example in which the openings 78 for peeling are formed so as to expose the part of the release layer 102 is shown; however, the openings 78 are not required to be formed when a later peeling process is possible without conducting this step.

Figure 12B:
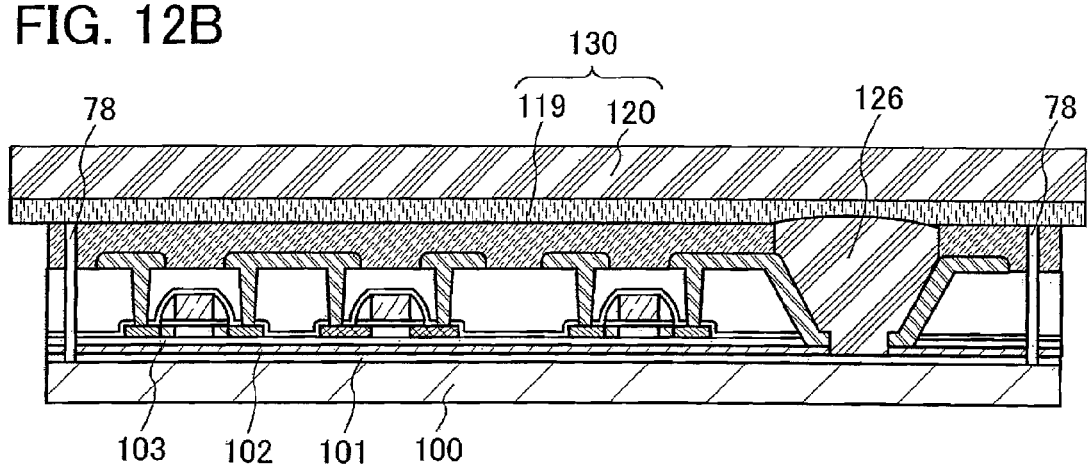

Next, the supporting substrate 130 is provided over the fifth insulating layer 150 (see FIG. 12B). The supporting substrate 130 is a substrate in which the sixth insulating layer 120 and the adhesive layer 119 are stacked, and is a substrate of heat-peeling type, as described in the above embodiment mode. Note that instead of the substrate of heat-peeling type, a heat-peeling film or a UV (ultraviolet) release film may be used.

Figure 12C:
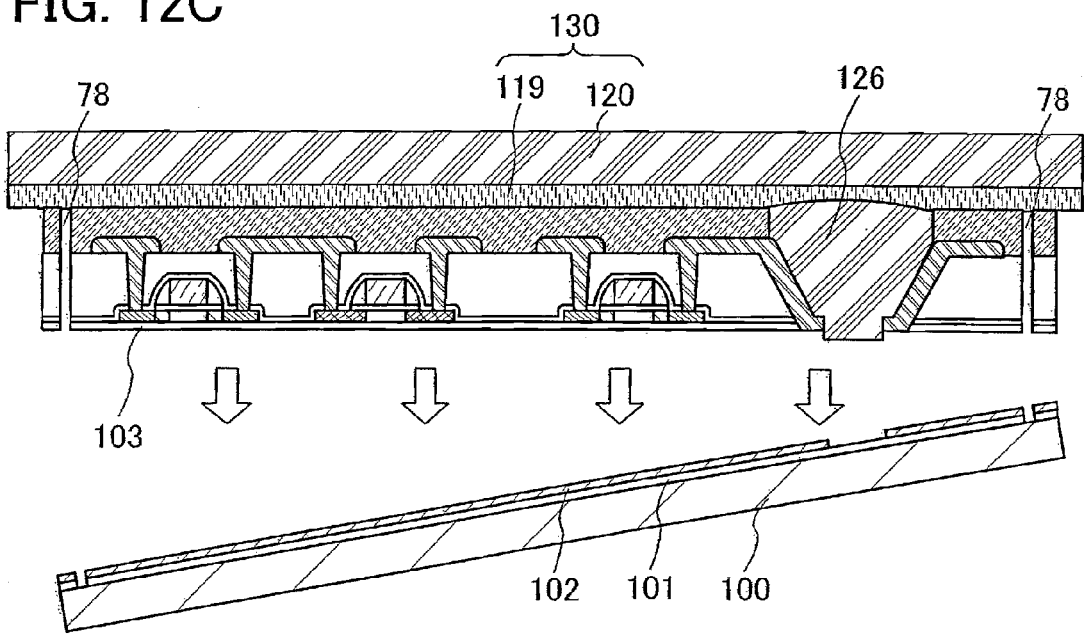

Next, by using the supporting substrate 130, the n-th element formation layer 153 is peeled off from the substrate 100 (see FIG. 12C). The peeling of the n-th element formation layer 153 is performed either inside the release layer 102 or at the interface between the release layer 102 and the second insulating layer 103 as a boundary, as described in the above embodiment mode. The structure illustrated is the case where the peeling is performed at the interface between the release layer 102 and the second insulating layer 103 as a boundary. In this manner, the peeling process can be performed easily in a short time by using the supporting substrate 130.

Figure 13A:
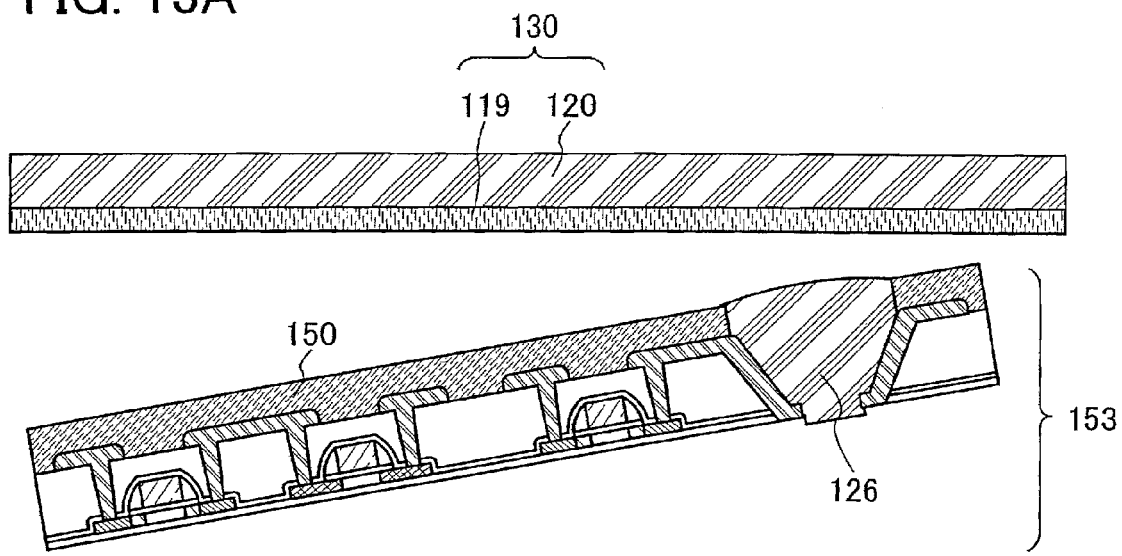
FIGS. 13A and 13B are diagrams illustrating a method for forming a semiconductor integrated circuit of the present invention.

Next, by performing heat treatment, the n-th element formation layer 153 is separated from the supporting substrate 130 (see FIG. 13A). As described above, since the supporting substrate 130 is a substrate of heat-peeling type, adhesivity between the supporting substrate 130 and the fifth insulating layer 150 is decreased by heat treatment, so that the n-th element formation layer 153 having a plurality of semiconductor elements can be separated from the supporting substrate 130.

Figure 13B:
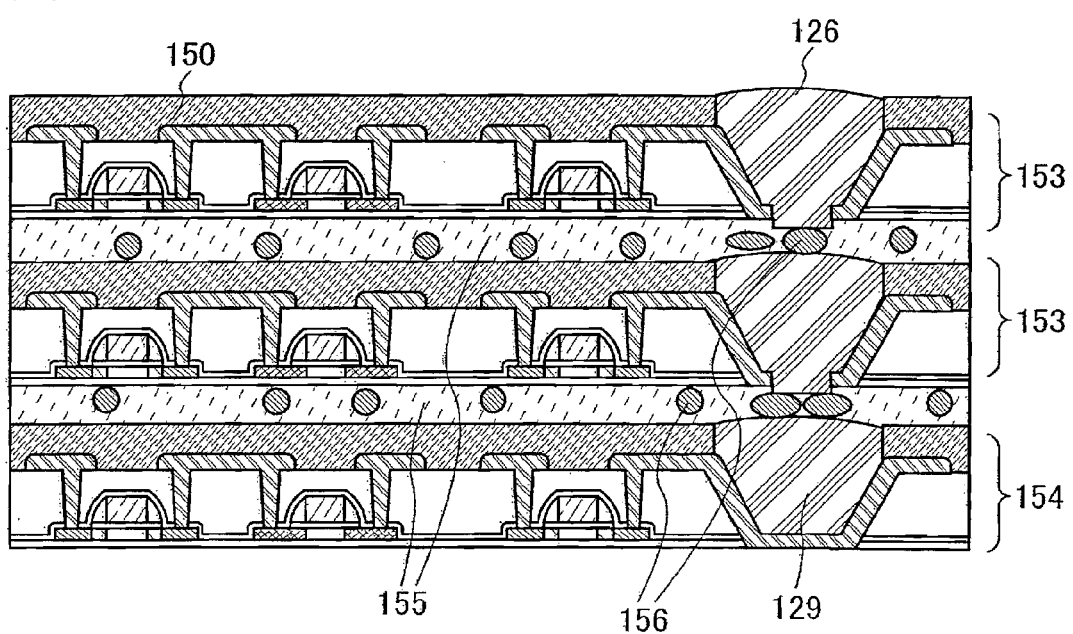

Next, by stacking a first element formation layer 154, and the second element formation layer to the n-th element formation layer 153 with conductive materials 155 interposed therebetween, a semiconductor integrated circuit having a plurality of semiconductor elements is formed (see FIG. 13B). In this manner, by attaching the first element formation layer 154 and the n-th element formation layer 153 which is stacked thereover to each other with the conductive materials 155 interposed therebetween, upper and lower layers can be electrically connected to each other through the through wiring 126. The drawing shows a stacked structure of three layers of the first element formation layer 154 to the n-th element formation layer 153 (n=3). However, the present invention is not limited to this structure; the element formation layer may be formed to have two layers or three or more layers, and a practitioner may select the number of element formation layers, as appropriate.

Here, as the conductive materials 155 for bonding the first element formation layer 154 and the n-th element formation layer 153 which is stacked thereover to each other, for example, a conductive adhesive containing a conductive particle 156 or a conductive film can be used. In particular, it is preferable to use an anisotropic conductive material having an anisotropic conductive property which has a conductive property in a direction perpendicular to a layer (or a substrate) and an insulation property in a parallel direction to the layer. Here, as the anisotropic conductive material, anisotropic conductive paste (ACP) which is thermally cured or an anisotropic conductive film (ACF) which is thermally cured can be used. These materials have conductive properties only in a particular direction (here, in a direction perpendicular to a substrate). The anisotropic conductive paste is referred to as a binder layer, and has a structure in which particles (hereinafter referred to as conductive particles) having conductive surfaces are dispersed in a layer containing an adhesive as its main component. The anisotropic conductive film has a structure in which conductive particles are dispersed in a thermosetting resin film or a thermoplastic resin film. Note that a spherical resin plated with nickel (Ni), gold (Au) or the like is used as the conductive particles. In order to prevent electrical short-circuit between the conductive particles at a portion in which an electrically connection is not required, an insulating particle containing silica or the like may be mixed.

In this manner, in a method for attaching the first element formation layer 154 and the n-th element formation layer 153 which is stacked thereover to each other using the conductive materials 155, high alignment accuracy is not required compared with the method for manufacturing the semiconductor integrated circuit described in Embodiment Mode 2, and manufacturing time can be shortened. This is because the through wiring 126 provided in the a-th layer and the through wiring 126 or a second conductive layer 157 provided in the (a−1)th layer may be electrically connected with the conductive materials 155 interposed therebetween (here, a is 2 to n).

Of the plurality of element formation layers included in the semiconductor integrated circuit, the first element formation layer 154 which is a bottom layer can be formed by using the method described in the above embodiment mode. For example, the first element formation layer 154 may be formed similarly to the second element formation layer to the n-th element formation layer 153 having the plurality of semiconductor elements which are described above. In addition, as shown in FIGS. 7A to 7D, the first element formation layer 154 may be formed such that an opening is provided and a second element formation layer is formed at a bottom face of the opening. The example in FIG. 13B shows the first element formation layer 154 which is formed by the method shown in FIGS. 7A to 7D. Furthermore, as shown in FIGS. 9A and 9B, the first element formation layer 154 may have a structure without an opening. The structure of the first element formation layer 154 can be selected appropriately in accordance with a manufacturing method.

In addition, a semiconductor integrated circuit can be formed without peeling off the first element formation layer 154 from the substrate 100. In this manner, when the first element formation layer 154 is not peeled off from the substrate 100, the release layer 102 and the supporting substrate 130 are not required to be formed over the substrate 100 provided with the first element formation layer 154, and the second to n-th element formation layers may be stacked after the fifth insulating layer 150 is formed.

In addition, after the first element formation layer 154 is peeled off from the substrate 100, it may be attached to another substrate, and then the second element formation layer to the n-th element formation layer can be stacked thereover. At this time, by using a substrate (or a film-like object) which is thin and flexible like plastic, as another substrate to which the first element formation layer 154 is attached, a semiconductor integrated circuit which is thin, lightweight, and flexible can be formed. Further, as the example shown in FIG. 13B, the first element formation layer 154 peeled off from the substrate 100 can be used without being attached to another substrate.

Figure 14A:
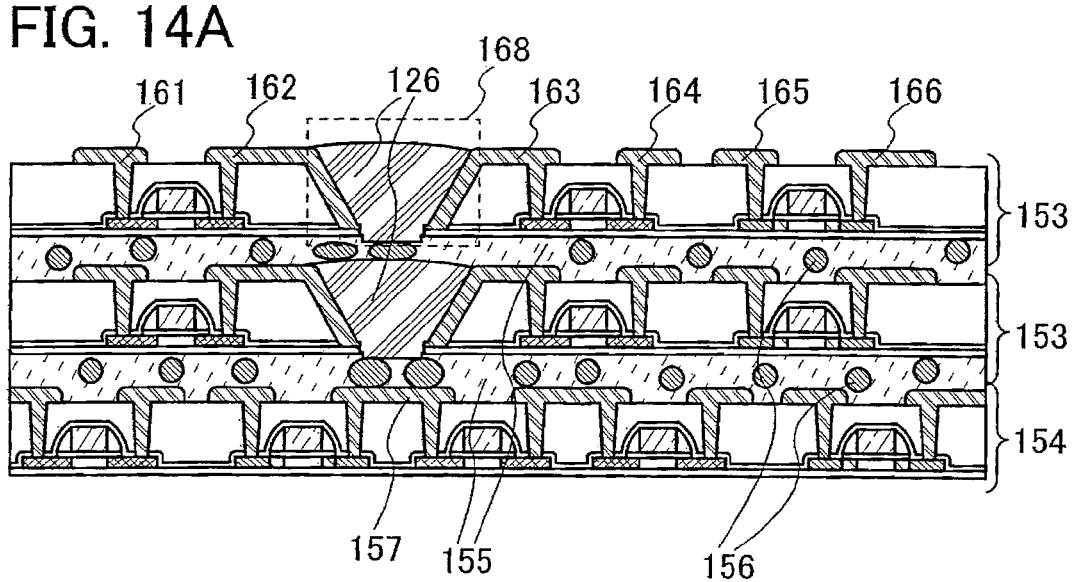
FIGS. 14A and 14B are diagrams illustrating a method for forming a semiconductor integrated circuit of the present invention.
Figure 14B:
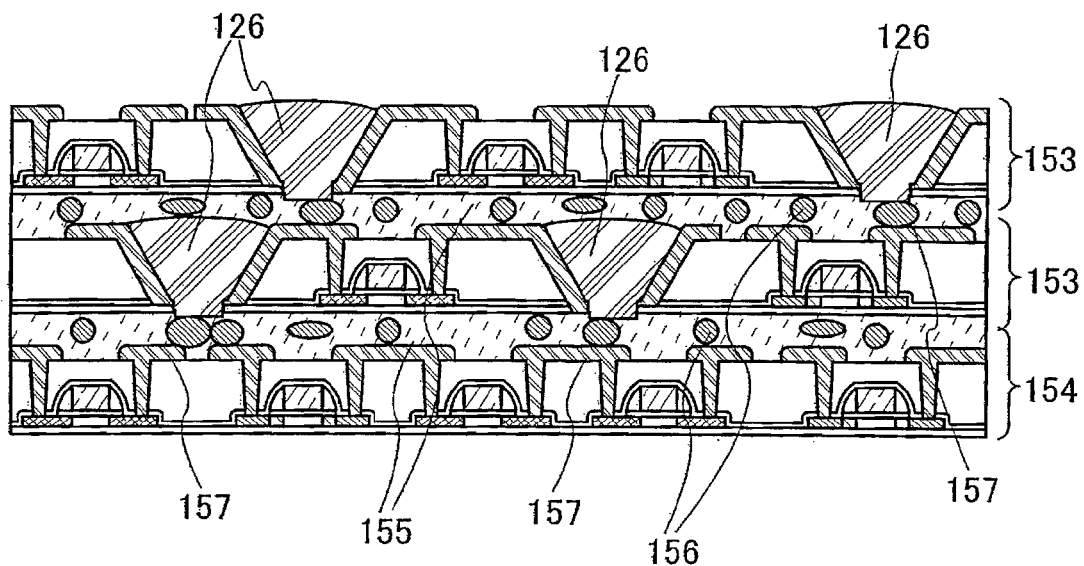

In addition, when a method for manufacturing a semiconductor integrated circuit shown in this embodiment mode is used, the element formation layers can be stacked and attached to each other without providing the fifth insulating layer 150 over the first element formation layer 154 and the n-th element formation layer 153 which is stacked thereover (see FIGS. 14A and 14B). In this case, after second conductive layers 161 to 166 are formed, an opening 168 is filled with a conductive material to form the through wiring 126, and the first element formation layer 154 and the second element formation layer to the n-th element formation layer 153 which are stacked thereover are stacked and attached to each other by using the conductive materials 155. In this manner, without providing the fifth insulating layer 150, a material and a process for forming the fifth insulating layer 150 can be reduced. However, since the fifth insulating layer 150 has a function of reducing parasitic capacitance generated between the first element formation layer 154 and the n-th element formation layer 153 which is stacked thereover, it can be decided whether the fifth insulating layer 150 is to be provided or not depending on need.

In FIG. 13B, an opening provided in the first element formation layer 154 and the opening 158 provided in each of the second element formation layer to the n-th element formation layer 153 which are stacked over the first element formation layer 154 are overlapped with each other, and a through wiring 129 is formed therein. However, the present invention is not limited to this example; and the first element formation layer 154 and the second element formation layer to the n-th element formation layer 153 can have the openings 158 in different portions (see FIG. 14B). This is a method similar to the method described in Embodiment Mode 2 with reference to FIGS. 9A and 9B; when the openings 158 are provided in portions which are not overlapped with each other, the second conductive layer 157 is formed at a portion located directly below the opening 158, that is, at an uppermost portion of the (a−1)th layer directly below the opening 158 of the a-th layer (here, a is 2 to n). Then, by attaching the first element formation layer to the n-th element formation layer to each other with the conductive materials 155 interposed therebetween, a semiconductor integrated circuit in which the first element formation layer to the n-th element formation layer are electrically connected to each other through the through wiring 129 can be formed.

This embodiment mode and the above embodiment mode show examples in which each of the first element formation layer to the n-th element formation layer is provided with the opening. However, the present invention is not limited to this example, and each of the first element formation layer to the n-th element formation layer can have a plurality of openings (see FIG. 14B). In this case, similarly to the above example, an opening or a second conductive layer is formed at a portion located directly below the opening, for example, at an uppermost portion of the (a−1)th layer directly below the opening of the a-th layer. In addition, the first element formation layer to the n-th element formation layer are electrically connected to each other through the conductive materials 155.

Furthermore, this embodiment mode and the above embodiment mode show examples in which the opening is filled with conductive paste. However, when viscosity and surface tension of the conductive paste are changed arbitrarily, upper and lower element formation layers can be electrically connected without filling. Accordingly, only the required amount of the conductive paste may be dropped.

By forming a semiconductor integrated circuit using this embodiment mode, a step of forming a through hole or a step of polishing the back surface of the substrate can be omitted; therefore, manufacturing time can be shortened. In addition, since the back surface of the substrate is not polished for forming a through hole which penetrates the substrate, selection of a material of the substrate is not limited and the substrate can be reused; therefore, cost can be reduced. Furthermore, since a substrate is not provided between the element formation layers, high integration is possible.

Embodiment Mode 4

The semiconductor integrated circuit of the present invention includes a plurality of semiconductor elements. Each of the plurality of semiconductor elements includes a semiconductor layer, an insulating layer to serve as a gate insulating layer, and an insulating layer to serve as a gate electrode. This embodiment mode will describe an example of a method for manufacturing the semiconductor layer included in each of the plurality of semiconductor elements and the insulating layer to serve as the gate insulating layer.

A semiconductor layer included in each of the semiconductor elements is formed by forming an amorphous semiconductor layer by a sputtering method, an LPCVD method, a plasma CVD method, or the like. Next, the amorphous semiconductor layer is crystallized by a laser crystallization method, an RTA (Rapid Thermal Anneal) method, a thermal crystallization method using an annealing furnace, a thermal crystallization method using a metal element which promotes crystallization, a crystallization method in which a thermal crystallization method using a metal element which promotes crystallization and a laser crystallization method are combined, or the like to form a crystallized semiconductor layer. Then, the crystallized semiconductor layer is processed into a desired shape.

Note that, of the above manufacturing methods, a crystallization method with heat treatment and a crystallization method in which irradiation of a continuous wave laser beam or a laser beam oscillating with a frequency of 10 MHz or more is performed may be used in combination. By irradiating the semiconductor layer with a continuous wave laser beam or a laser beam oscillating with a frequency of 10 MHz or more, the surface of the crystallized semiconductor layer can be planarized. By planarizing the surface of the crystallized semiconductor layer, a gate insulating layer which is a layer above the semiconductor layer can be thinned, and besides, pressure resistance of the gate insulating layer can be improved.

Moreover, of the above manufacturing methods, a continuous wave laser beam or a laser beam oscillating with a frequency of 10 MHz or more may be used for crystallization. A semiconductor layer which is crystallized by being scanned in one direction while being irradiated with a continuous wave laser beam or a laser beam oscillating with a frequency of 10 MHz or more, has a characteristic that crystals are grown in a scanning direction of the laser beam. A semiconductor element in which characteristic variation is reduced and field effect mobility is high can be obtained by arranging the semiconductor element such that the scanning direction is aligned with a channel length direction (a direction in which carriers flow when a channel formation region is formed) and by using the following method for manufacturing the insulating layer to serve as the gate insulating layer.

The insulating layer to serve as the gate insulating layer included in each of the plurality of semiconductor elements may be formed by performing plasma treatment to the semiconductor layer which is formed above so as to oxidize or nitride the surface of the semiconductor layer. For example, plasma treatment is employed, in which a rare gas (e.g., He, Ar, Kr, or Xe) and a mixed gas (e.g., oxygen, oxidized nitrogen, ammonia, nitrogen, or hydrogen) are introduced. In this case, when excitation of plasma is performed by introducing a microwave, plasma in which an electron temperature of the plasma is 1.5 eV or less and an electron density thereof is $1 \times 10^{11}$ cm$^{-3}$ or greater (hereinafter abbreviated as high-density plasma) can be generated. Specifically, the plasma treatment is preferably performed with an electron density of greater than or equal to $1 \times 10^{11}$ cm$^{-3}$ and less than or equal to $1 \times 10^{13}$ cm$^{-3}$ and an electron temperature of plasma of greater than or equal to 0.5 eV and less than or equal to 1.5 eV. The surface of the semiconductor layer is oxidized or nitrided by oxygen radicals (OH radicals may be included) or nitrogen radicals (NH radicals may be included) generated by this high-density plasma; accordingly, an insulating layer having a thickness of 5 to 10 nm is formed on the surface of the semiconductor layer. This insulating layer having a thickness of 5 to 10 nm may be used as the gate insulating layer.

Note that a reaction of this case by treatment using high-density plasma which is a solid-phase reaction can extremely reduce the interface-state density between the gate insulating layer and the semiconductor layer. Such high-density plasma treatment directly oxidizes (or nitrides) the semiconductor layer (crystalline silicon or polycrystalline silicon), so that variation in thickness of a gate insulating layer to be formed can be extremely small. In addition, the semiconductor layer in a crystal grain boundary of crystalline silicon is not oxidized too much; thus an extremely desirable state can be obtained. That is, by oxidizing or nitriding the surface of the semiconductor layer in the high-density plasma treatment described here, a gate insulating layer which has favorable uniformity and low interface-state density can be formed without excessive oxidizing reaction or nitriding reaction in a crystal grain boundary.

Note that as the gate insulating layer included in the semiconductor element, only the insulating layer formed by high-density plasma treatment may be used; alternatively, an insulating layer of silicon oxide, silicon oxynitride, silicon nitride, or the like may be stacked by a CVD method using plasma or a thermal reaction, over the insulating layer formed by high-density plasma treatment. In any case, characteristic variation can be reduced in the semiconductor element including the insulating layer formed by high-density plasma as the gate insulating layer or a part of the gate insulating layer.

In addition, the semiconductor layer, the gate insulating layer, and another insulating layer included in the semiconductor element are formed by plasma treatment in some cases. Such plasma treatment is preferably performed with an electron density of $1 \times 10^{11}$ cm$^{-3}$ or more and an electron temperature of plasma of 1.5 eV or less. Specifically, the plasma treatment is preferably performed with an electron density of greater than or equal to $1 \times 10^{11}$ cm$^{-3}$ and less than or equal to $1 \times 10^{13}$ cm$^{-3}$ and an electron temperature of plasma of greater than or equal to 0.5 eV and less than or equal to 1.5 eV.

When plasma has high electron density, and a low electron temperature in the vicinity of an object to be processed (e.g., a semiconductor layer, a gate insulating layer, or the like), the object to be processed can be prevented from being damaged by plasma. In addition, since the electron density of plasma is as high as $1 \times 10^{11}$ cm$^{-3}$ or more, an oxide or a nitride which is formed by oxidizing or nitriding the object to be processed using plasma treatment, can form a film that is superior to a thin film formed by a CVD method, a sputtering method, or the like, in uniformity of the thickness or the like, and is dense. Moreover, since the electron temperature of the plasma is as low as 1.5 eV or less, oxidizing treatment or nitriding treatment can be performed at a lower temperature compared with conventional plasma treatment or thermal oxidation. For example, even when plasma treatment is performed at a temperature lower than the strain point of a glass substrate by 100° C. or more, an oxide or a nitride can be formed by sufficiently oxidizing or nitriding the object to be processed.

Embodiment Mode 5

A semiconductor device having the semiconductor integrated circuit shown in the above embodiment modes will be described with reference to FIGS. 15A and 15B.

Figure 15A:
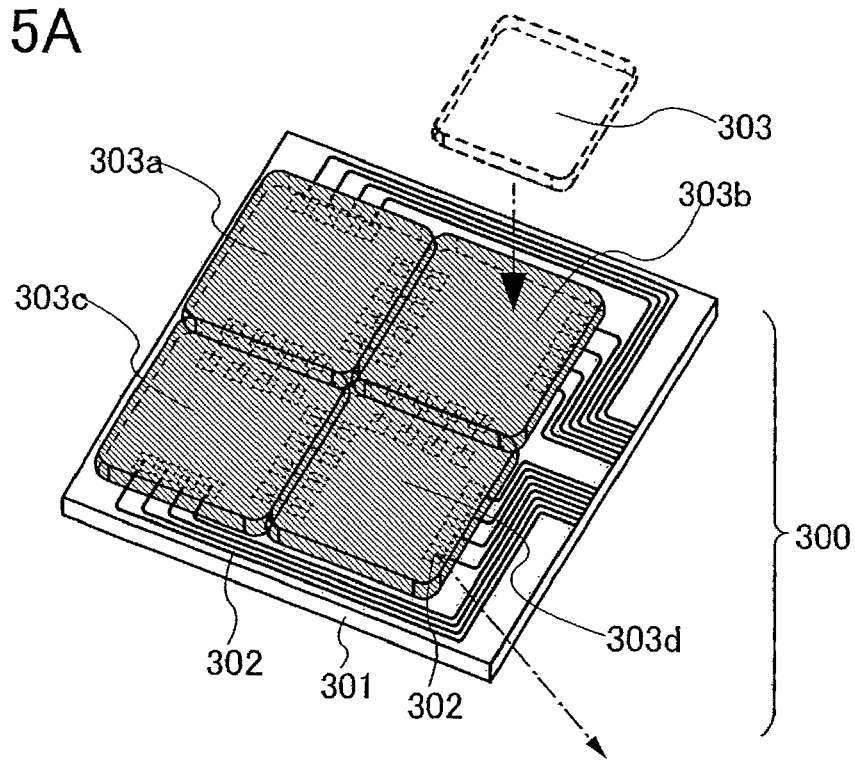
FIGS. 15A and 15B are diagrams illustrating a structural example of a semiconductor device of the present invention.
Figure 15B:
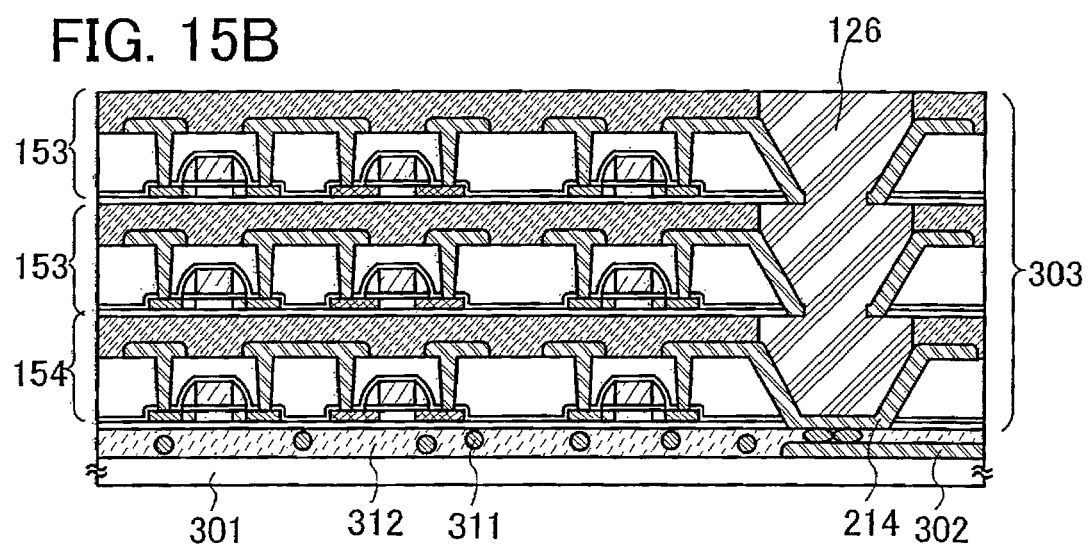

A semiconductor device 300 shown in FIG. 15A is provided such that a semiconductor integrated circuit 303 having any of the structures shown in the above embodiment modes is bonded to a substrate 301 provided with conductive films 302. Here, a plurality of semiconductor integrated circuits 303a to 303d is provided over the substrate 301 so as to be electrically connected to the conductive films 302. The substrate 301 and the semiconductor integrated circuits 303a to 303d can be bonded to each other with an adhesive resin 312, and the semiconductor integrated circuits 303a to 303d and the conductive films 302 can be electrically connected to each other through conductive particles 311 included in the adhesive resin 312 (see FIG. 15B). Alternatively, the semiconductor integrated circuits 303a to 303d and the conductive films 302 can be electrically connected to each other using a conductive adhesive such as silver paste, copper paste, or carbon paste, an anisotropic conductive adhesive such as ACP (Anisotropic Conductive Paste), a conductive film such as ACF (Anisotropic Conductive Film), solder joint, or the like.

Here, the semiconductor integrated circuit 303 which forms the semiconductor device 300 is formed by using the method described in the above embodiment mode. The electrical connection between the semiconductor integrated circuits 303a to 303d and the conductive films 302 can be performed such that a conductive layer 214 which is exposed to the back surface of the semiconductor integrated circuit 303 (a surface opposite to the surface provided with a semiconductor element) and the conductive films 302 are connected to each other through the conductive particles 311, as shown in FIG. 15B.

In addition, connection between the semiconductor integrated circuits 303a to 303d and the conductive films 302 may be performed through the conductive layer which is exposed to surfaces of the semiconductor integrated circuits 303a to 303d or through the through wiring 126 which is formed by dropping silver paste or the like. In this case, upper and lower surfaces of the semiconductor integrated circuits 303a to 303d can be reversed and attached to the substrate 301 such that the top layers of the semiconductor integrated circuits 303a to 303d are in contact with the conductive films 302. In addition, the conductive films 302 and the semiconductor integrated circuits 303a to 303d can be connected using wire bonding.

Although not shown here, an insulating film, or the like may be provided over the semiconductor integrated circuit 303 to protect the semiconductor integrated circuit 303.

Each of the semiconductor integrated circuits 303a to 303d shown in this embodiment mode functions as one or more of a central processing unit (CPU), a memory, a network processing circuit, a disc processing circuit, an image processing circuit, an audio processing circuit, a power supply circuit, a temperature sensor, a humidity sensor, an infrared ray sensor, and the like.

In this manner, the semiconductor integrated circuit which forms the semiconductor device of the present invention can be manufactured without performing a step of forming a through hole or a step of polishing a substrate; therefore, manufacturing time can be shortened. In addition, since polishing of a substrate is not performed so as to provide a through hole which penetrates the substrate, selection of a material of the substrate is not limited, and the substrate can be reused; therefore, cost can be reduced. Furthermore, since a substrate is not provided between layers having semiconductor elements, high integration of a device is possible. When such a semiconductor integrated circuit is used, a small and inexpensive semiconductor device can be provided.

Embodiment Mode 6

Figure 16A:
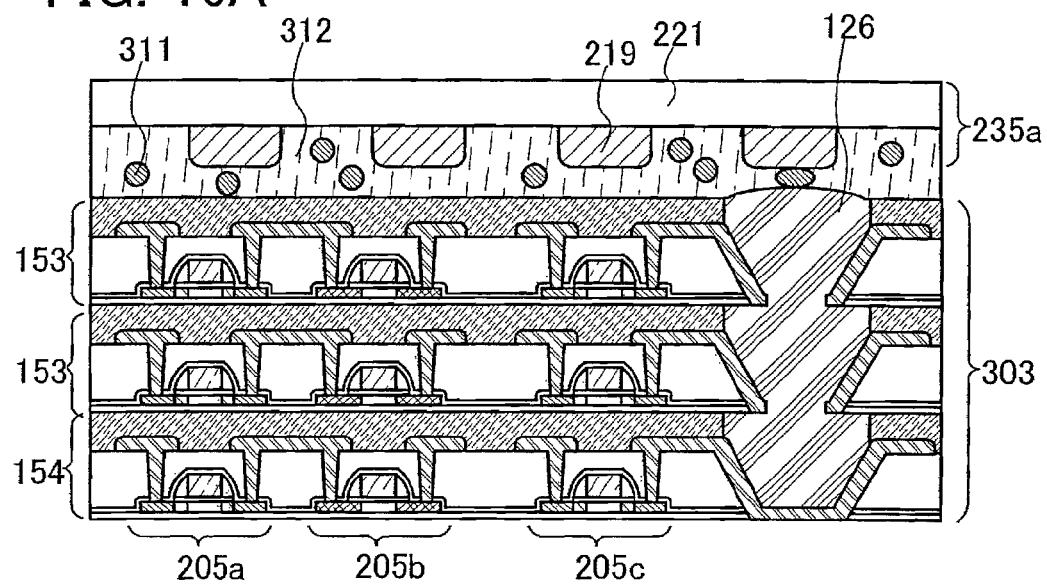
FIGS. 16A and 16B are diagrams illustrating a structural example of a semiconductor device of the present invention.
Figure 16B:
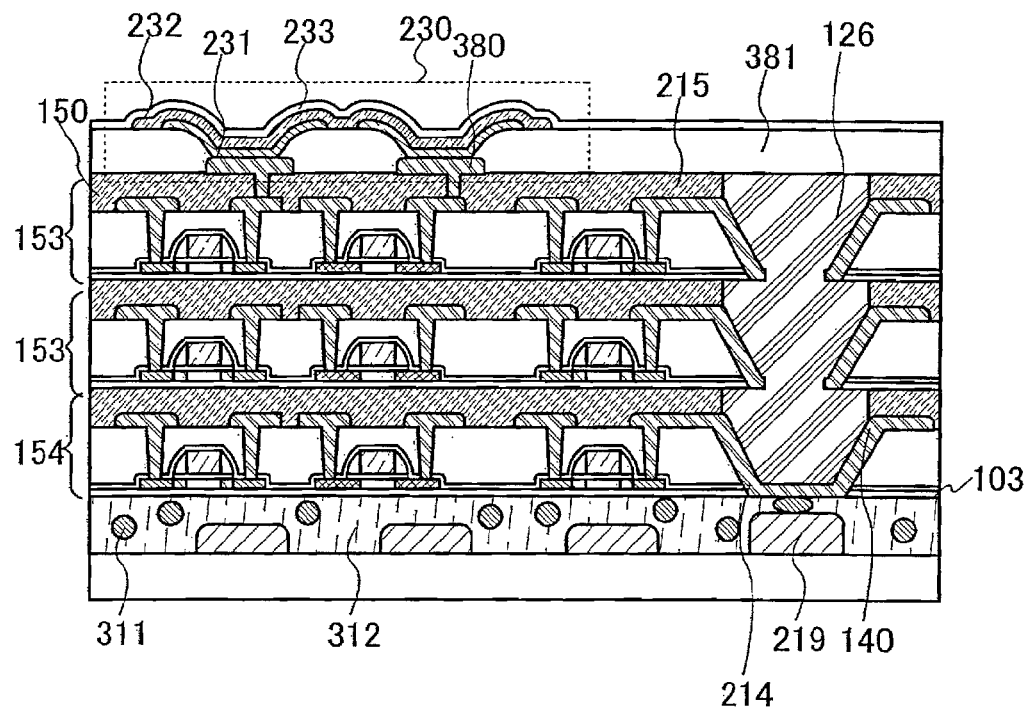

This embodiment mode will describe an example of the application of a semiconductor integrated circuit of the present invention to a semiconductor device capable of transmitting and receiving data without contact (also referred to as RFID (Radio Frequency Identification), an ID tag, an IC tag, an IC chip, an RF (Radio Frequency) tag, a wireless tag, an electronic tag, or a wireless chip), an ID film, an IC film, or an RF film, with reference to FIGS. 16A and 16B.

The semiconductor device (RFID) of the present invention is formed by separately forming a conductive film 219 which functions as an antenna and the semiconductor integrated circuit 303, and then, by connecting the conductive film 219 and the semiconductor integrated circuit 303 (see FIGS. 16A and 16B).

In the semiconductor integrated circuit 303 used here, an electric circuit (e.g., a power supply circuit, a demodulation circuit, a logic arithmetic circuit, or the like) of the RFID is formed such that the first element formation layer 154 to the n-th element formation layer 153 (in the diagram, n=3) are stacked, attached to each other, and electrically connected to each other with the through wiring 126, as the manufacturing example shown in Embodiment Mode 3. In addition, the conductive film 219 which functions as the antenna is formed on a substrate 221. As the substrate 221, a glass substrate, a thin and flexible substrate or film such as plastic, or the like can be used. Note that an ID film, an IC film, and an RF film may have a thickness of 100 μm or less, preferably 50 μm or less, more preferably 20 μm or less (the thickness of a semiconductor layer in a single-layer integrated circuit is 200 nm or less, preferably 100 nm or less, more preferably 70 nm or less). When the thickness of the film is approximately in the range described above, the film has characteristics that the film is flexible and not easily damaged by a mechanical shock.

In FIG. 16A, when the conductive film 219 which functions as the antenna formed on the substrate 221 is electrically connected to the through wiring 126 and semiconductor elements 205a to 205c included in the semiconductor integrated circuit 303, a semiconductor device can be formed.

As an example of a method for forming a semiconductor device of the present invention, for example, when the first element formation layer 154 to the n-th element formation layer 153 are attached and connected to each other without peeling off the first element formation layer 154 (the bottom layer) from the substrate 100, the semiconductor integrated circuit 303 is formed over the substrate 100. Then, when the conductive film 219 which functions as the antenna provided on the substrate 221 and the semiconductor integrated circuit 303 provided over the substrate 100 are attached to each other so as to be electrically connected, a semiconductor device can be formed.

In addition, after the conductive film 219 and the semiconductor integrated circuit 303 have been attached to each other as described above, the substrate 100 is peeled off from the semiconductor integrated circuit 303, so that a semiconductor device which is flexible and thin, and capable of transmitting and receiving data without contact can be formed (FIGS. 16A and 16B).

Furthermore, after the substrate 100 is peeled off, the substrate 221 provided with the semiconductor integrated circuit 303 and the conductive film 219 which functions as the antenna can be attached to a thin and flexible substrate or film, or the like. In this manner, by attaching the substrate 221 to another substrate, the semiconductor integrated circuit 303 and the conductive film 219 which functions as the antenna can be protected from contamination and a shock.

The conductive film 219 which functions as the antenna provided on the substrate 221 is formed of a conductive material by using a CVD method, a sputtering method, a printing method such as screen printing or gravure printing, a droplet discharge method, a dispenser method, or the like. As the conductive material, an element selected from among aluminum (Al), titanium (Ti), silver (Ag), copper (Cu), gold (Au), and nickel (Ni), or an alloy material or a compound material containing the above element as its main component is used, and the conductive film is formed to have a single-layer structure or a stacked structure.

In addition, the substrate 221 provided with the conductive film 219 which functions as the antenna and the semiconductor integrated circuit 303 are bonded to each other with the adhesive resin 312 (see FIG. 16A). As the adhesive resin 312 used here, the anisotropic conductive material which is described in the above embodiment mode is preferably used. When the anisotropic conductive material is used as the adhesive resin 312, the through wiring 126 and the semiconductor elements 205a to 205c included in the semiconductor integrated circuit 303 and the conductive film 219 which functions as the antenna can be electrically connected to each other through the conductive particles 311 included in the adhesive resin 312.

Alternatively, the through wiring 126 and the semiconductor elements 205a to 205c included in the semiconductor integrated circuit 303 and the conductive film 219 which functions as the antenna can be electrically connected to each other using a conductive adhesive such as silver paste, copper paste, or carbon paste, solder joint, or the like.

In addition, when the conductive film 219 which functions as the antenna is formed separately from the semiconductor integrated circuit 303, and then, they are electrically connected to each other, a lower surface of the first element formation layer 154, that is, the conductive layer 214 provided on the second insulating layer 103 side included in the first element formation layer can be connected to the conductive film 219 which functions as the antenna (see FIG. 16B).

In this manner, when the conductive layer 214 provided on the lower surface of the semiconductor integrated circuit 303 (that is, on the second insulating layer 103 side of the first element formation layer including semiconductor elements) and the conductive film 219 which functions as the antenna are electrically connected, another semiconductor element which has a specific function that is different from a transistor, such as a memory element or a sensor element can be provided on an upper surface of a semiconductor integrated circuit (that is, on the fifth insulating layer 150 side of the n-th element formation layer (top layer)).

Here, an example in which a memory element is formed on the upper surface of the semiconductor integrated circuit is shown (see FIG. 16B). Specifically, an example is shown, in which a third conductive layer 380 and a seventh insulating layer 381 are provided over the n-th element formation layer (in the drawing, n=3) including semiconductor elements, which is stacked for forming a semiconductor integrated circuit, and a memory element 230 formed with a stacked structure of a fourth conductive layer 231, a memory layer 232, and a fifth conductive layer 233 is provided over the seventh insulating layer 381. Here, the third conductive layer 380 is provided over the fifth insulating layer 150 which is provided in the n-th element formation layer 153. In addition, a structure is shown, in which, when the third conductive layer 380 is formed so as to be connected to the second conductive layer provided in the n-th element formation layer, the memory element 230 and the semiconductor elements which form the semiconductor integrated circuit 303 are electrically connected.

A material, the property or state of which changes by an electrical effect, an optical effect, a thermal effect, or the like can be used for the memory layer 232. For example, a material, the property or state of which changes by melting due to Joule heat, dielectric breakdown, or the like and an electrical property (e.g., resistance or capacitance) between the fourth conductive layer 231 and the fifth conductive layer 233 changes, is used. For example, a material which can cause a short-circuit between the fourth conductive layer 231 and the fifth conductive layer 233 when a current flows through the memory layer 232, can be used. In order to change an electrical property in this way, the thickness of the memory layer 232 is preferably 5 nm to 100 nm, more preferably, 10 nm to 60 nm.

As a material for forming the memory layer 232, an organic compound can be used, for example. The organic compound can be formed by a film formation method which is relatively easily performed such as a droplet discharge method, a spin coating method, or a vapor phase growth method. As an organic material used for the memory layer 232, for example, an aromatic amine-based compound (that is, a compound having a benzene ring-nitrogen bond) such as 4,4'-bis[N-(1-naphthyl)-N-phenyl-animo]-biphenyl (abbr.: α-NPD), 4,4'-bis[N-(3-methylphenyl)-N-phenyl-amino]-biphenyl (abbr.: TPD), 4,4',4''-tris(N,N-diphenyl-amino)-triphenylamine (abbr.: TDATA), 4,4',4''-tris[N-(3-methylphenyl)-N-phenyl-amino]-triphenylamine (abbr.: MTDATA), and 4,4'-bis(N-(4-(N,N-di-m-tolylamino)phenyl)-N-phenylamino)biphenyl (abbr.: DNTPD), polyvinyl carbazole (abbr.: PVK), a phthalocyanine compound such as phthalocyanine (abbr.: $H_2Pc$), copper phthalocyanine (abbr.: CuPc), or vanadyl phthalocyanine (abbr.: VOPc), or the like can be used. These materials have a high hole transporting property.

Besides, as an organic material, a material formed of a metal complex or the like having a quinoline skeleton or a benzoquinoline skeleton such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), a material formed of a metal complex or the like having an oxazole-based or thiazole-based ligand such as bis[2-(2-hydroxyphenyl)benzoxazolato]zinc (abbr.: $Zn(BOX)_2$), or bis[2-(2-hydroxyphenyl)benzothiazolato]zinc (abbr.: $Zn(BTZ)_2$), or the like can be used. These materials have a high electron transporting property.

Other than the metal complexes, a compound such as 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like can be used.

The memory layer 232 may have a single-layer structure or a stacked structure of an organic compound. In the case of a stacked structure, materials can be selected from the above-mentioned materials to form a stacked structure. Further, the above-mentioned organic compound and an organic compound used as a light emitting material may be stacked. As the organic compound used as the light emitting material, 4-dicyanomethylene-2-methyl-6-[2-(1,1,7,7-tetramethyljulolidine-9-yl)ethenyl]-4H-pyran (abbr.: DCJT), 4-dicyanomethylene-2-t-butyl-6-[2-(1,1,7,7-tetramethyljulolidine-9-yl)ethenyl]-4H-pyran, periflanthene, 2,5-dicyano-1,4-bis[2-(10-methoxy-1,1,7,7-tetramethyljulolidine-9-yl)ethenyl]benzene, N,N'-dimethylquinacridone (abbr.: DMQd), coumarin 6, coumarin 5451, tris(8-quinolinolato)aluminum (abbr.: $Alq_3$), 9,9'-bianthlyl, 9,10-diphenylanthracene (abbr.: DPA), 9,10-bis(2-naphthyl)anthracene (abbr.: DNA), 2,5,8,11-tetra-t-butylperylene (abbr.: TBP), or the like can be used.

A material in which the above-mentioned light emitting material is dispersed in a base material may be used to form the memory layer 232. As the base material in which the above-mentioned light emitting material is dispersed, an anthracene derivative such as 9,10-di(2-naphthyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)pyridinato]zinc (abbr.: $Znpp_2$) or bis[2-(2-hydroxyphenyl)benzoxazolato]zinc (abbr.: ZnBOX), or the like can be used. In addition, tris(8-quinolinolato)aluminum (abbr.: $Alq_3$), 9,10-bis(2-naphthyl)anthracene (abbr.: DNA), bis(2-methyl-8-quinolinolato)-4-phenylphenolato-aluminum (abbr.: BAlq), or the like can be used.

Such an organic compound is changed its property by a thermal effect or the like; therefore, a glass transition temperature (Tg) thereof is preferably 50° C. to 300° C., more preferably, 80° C. to 120° C.

In addition, a material in which a metal oxide is mixed with the above-mentioned organic compound may be used. Note that the material in which a metal oxide is mixed includes a state in which a metal oxide is mixed or stacked with the above-mentioned organic compound or the above-mentioned organic compound used as the light emitting material. Specifically, it indicates a state which is formed by a co-evaporation method using plural evaporation sources. Such a material can be referred to as an organic-inorganic composite material.

For example, in the case of mixing the above-mentioned organic compound having a high hole transporting property with a metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide. In the case of mixing the above-mentioned organic compound having a high electron transporting property with a metal oxide, it is preferable to use lithium oxide, calcium oxide, sodium oxide, potassium oxide, or magnesium oxide as the metal oxide.

In addition, a material of which property changes by an electrical effect, an optical effect, or a thermal effect may be used for the memory layer 232 which forms the memory element. For example, a conjugated high molecular compound doped with a compound (photoacid generator) which generates acid by absorbing light can also be used for the memory layer 232. As the conjugated high molecular compound, polyacetylenes, polyphenylene vinylenes, polythiophenes, polyanilines; polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Note that the example of using an organic compound as a material for forming the memory layer 232 is shown; however, the present invention is not limited to this example. For example, a phase change material such as a material which changes reversibly between a crystalline state and an amorphous state or a material which changes reversibly between a first crystalline state and a second crystalline state can be used by an electrical effect, an optical effect, a chemical effect, a thermal effect, or the like. Further, a material which reversibly changes only from an amorphous state to a crystalline state can be used.

The material which reversibly changes between a crystalline state and an amorphous state is a material containing a plurality of elements selected from germanium (Ge), tellurium (Te), antimony (Sb), sulfur (S), tellurium oxide (TeOx); tin (Sn), gold (Au), gallium (Ga), selenium (Se), indium (In), thallium (Tl), cobalt (Co), and silver (Ag). For example, a material based on Ge—Te—Sb—S, Te—TeO$_2$—Ge—Sn, Te—Ge—Sn—Au, Ge—Te—Sn, Sn—Se—Te, Sb—Se—Te, Sb—Se, Ga—Se—Te, Ga—Se—Te—Ge, In—Se, In—Se—Tl—Co, Ge—Sb—Te, In—Se—Te, or Ag—In—Sb—Te may be used. The material which reversibly changes between the first crystalline state and the second crystalline state is a material containing a plurality of elements selected from silver (Ag), zinc (Zn), copper (Cu), aluminum (Al), nickel (Ni), indium (In), antimony (Sb), selenium (Se), and tellurium (Te), for example, Ag—Zn, Cu—Al—Ni, In—Sb, In—Sb—Se, or In—Sb—Te. When using this material, a phase change is carried out between two different crystalline states. The material which changes only from an amorphous state to a crystalline state is a material containing a plurality of elements selected from tellurium (Te), tellurium oxide (TeO$_x$), palladium (Pd), antimony (Sb), selenium (Se), and bismuth (Bi), for example, Te—TeO$_2$, Te—TeO$_2$—Pd, or Sb$_2$Se$_3$/Bi$_2$Te$_3$. Note that in the description of the above material, Sb$_2$Se$_3$/Bi$_2$Te$_3$ means that a layer containing Sb$_2$Se$_3$ and a layer containing Bi$_2$Te$_3$ are stacked.

In addition, the fourth conductive layer 231 and the fifth conductive layer 233 which form the memory element can be formed by a CVD method, a sputtering method, a screen printing method, a droplet discharge method, a dispenser method, or the like. Then, as a material which forms the fourth conductive layer 231 and the fifth conductive layer 233, a single-layer structure or a stacked structure of an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), and carbon (C), or an alloy containing a plurality of the above elements can be used. In addition, a single-layer film such as an indium tin oxide (ITO) film, an indium tin oxide film containing silicon, a zinc oxide (ZnO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and another titanium nitride film; or the like can be used. When each of the fourth conductive layer 231 and the fifth conductive layer 233 is formed to have a stacked structure, resistance as a wiring can be reduced.

As the semiconductor device of the present invention, a memory element can be formed on the top surface of the semiconductor integrated circuit 303, and a sensor element or the like can be formed similarly. In this way, when the memory element or the sensor element is formed on the top surface of the semiconductor integrated circuit 303, the semiconductor integrated circuit 303 is attached to the substrate 221 provided with the conductive film 219 which functions as the antenna, and then, the memory element, the sensor element, or the like can be formed over a fifth provided insulating layer 215 provided over the n-th element formation layer.

Embodiment Mode 7

This embodiment mode will describe a method for manufacturing a semiconductor integrated circuit which is different from the above embodiment mode and a semiconductor device having the semiconductor integrated circuit, with reference to FIGS. 17A to 19B. Specifically, the case where each element formation layer for forming a semiconductor integrated circuit has semiconductor elements which have different functions or different structures will be described.

The semiconductor integrated circuit of the present invention can be formed by stacking a layer having semiconductor elements which have another function (e.g., a diode, a field effect transistor, a resistor, a capacitor, a memory element, a sensor element, or the like), as well as the layer having the semiconductor elements which function as the thin film transistors described in the above embodiment mode.

Figure 17A:
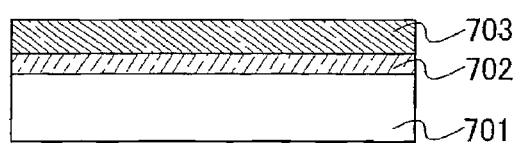
FIGS. 17A to 17C are diagrams illustrating a method for forming a semiconductor integrated circuit of the present invention.

In this manner, an example of manufacturing a semiconductor integrated circuit having various kinds of semiconductor elements will be described with reference to FIGS. 17A to 17C. First, as shown in FIG. 17A, a release layer 702 is formed over a first substrate 701, and a first element formation layer 703 having semiconductor elements which are formed using a semiconductor process, such as diodes, field effect transistors, resistors, or capacitors, memory elements, is formed over the release layer 702. The semiconductor elements formed in the first element formation layer 703 are semiconductor elements which are formed using the semiconductor process described above; and the semiconductor elements formed in the first element formation layer 703 are referred to as an element group A here.

Similarly, the release layer 702 and a second element formation layer 705 having an element group B to an n-th element formation layer 707 having an element group X are formed over a second substrate 704 to an n-th substrate 706. In addition, each of the second element formation layer 705 to the n-th element formation layer 707 includes an opening 708 for forming a through wiring. Here, the element group B to the element group X include semiconductor elements formed using the above semiconductor process, similarly to the element group A. Further, the element group A to the element group X may include one kind of semiconductor elements or plural kinds of semiconductor elements.

Figure 17B:
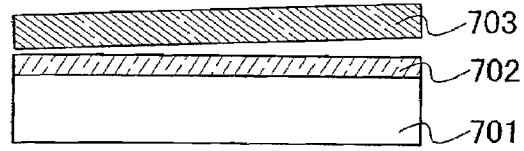
Figure 17B:
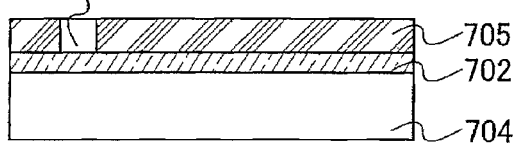
Figure 17B:
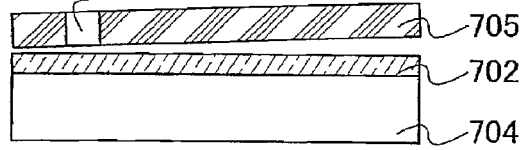
Figure 17B:
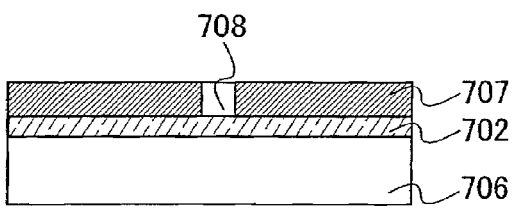
Figure 17B:
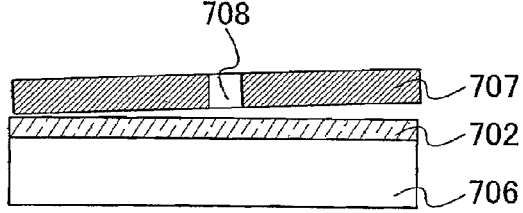
Figure 17C:
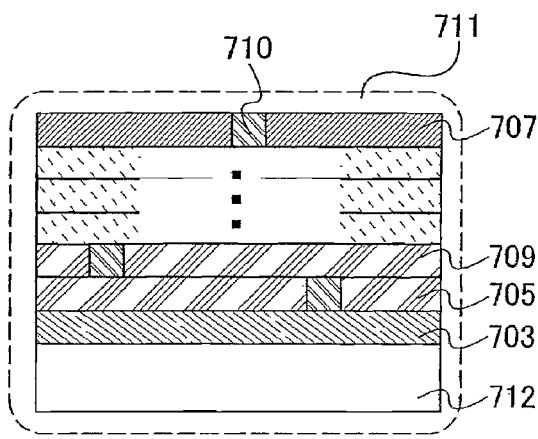

Next, as shown in FIG. 17B, the first element formation layer 703 to the n-th element formation layer 707 are peeled off from the first substrate 701 to the n-th substrate 706 respectively. The method described in the above embodiment mode may be used as a peeling method.

Next, the first element formation layer 703 is attached to another substrate 712. Then, the second element formation layer 705 is attached to the first element formation layer 703, and a through wiring 710 which connects the first element formation layer 703 and the second element formation layer 705 is formed by dropping conductive paste. Similarly, when a third element formation layer 709 to the n-th element formation layer 707 are attached to the second element formation layer 705 and the through wiring 710 is formed, a semiconductor integrated circuit 711 can be formed as shown in FIG. 17C.

In this manner, an example of forming a semiconductor integrated circuit by stacking layers including different kinds of element groups will be described with reference to FIGS. 18A to 18C. In this example, the first element formation layer having thin film transistors is formed as the element group A, and the second element formation layer having the memory elements described in Embodiment Mode 6 with reference to FIG. 16B is formed as the element group B.

Figure 18A:
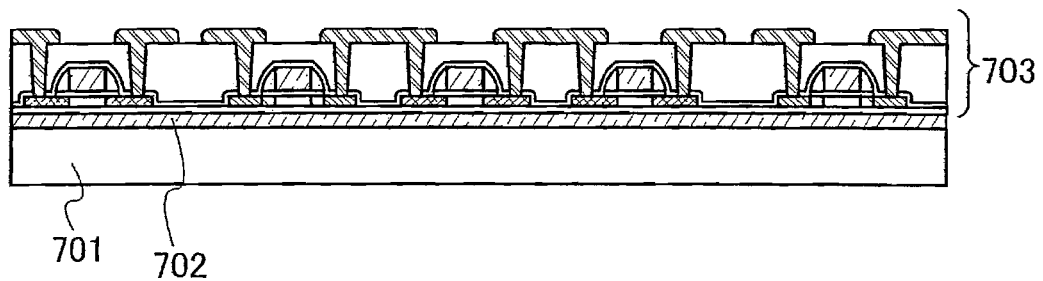
FIGS. 18A to 18C are diagrams illustrating a method for forming a semiconductor integrated circuit of the present invention.

First, as shown in FIG. 18A, the release layer 702 is formed over the first substrate 701, and the first element formation layer 703 having the element group A (thin film transistors) is formed over the release layer 702. Similarly, as shown in FIG. 18B, the release layer 702 is formed over the second substrate 704, and the second element formation layer 705 having the element group B (memory elements) is formed over the release layer 702. Here, the first element formation layer 703 having the element group A can be formed by using the method described in the above embodiment mode.

In the second element formation layer 705 having the element group B, first, a second insulating layer 713 is formed over the release layer 702. Next, when a conductive layer is formed over the second insulating layer and processed, a third conductive layer 714 is formed. Then, when a layer having an insulating property is formed over the third conductive layer and processed, a third insulating layer 715 is formed. Next, a memory layer 716 is formed over the third insulating layer 715. Then, a fourth conductive layer 717 having conductivity is formed over the memory layer 716. Accordingly, the second element formation layer 705 having a memory element 719 formed with a stacked structure of the third conductive layer 714, the memory layer 716, and the fourth conductive layer 717 is formed. In addition, the second element formation layer can include an opening for being connected to the first element formation layer.

As the third conductive layer 714 and the fourth conductive layer 717, a film formed of an element of aluminum (Al), titanium (Ti), molybdenum (Mo), tungsten (W), or silicon (Si), or an alloy film using the above element can be used. The third conductive layer 714 can be formed by depositing a film by a sputtering method, a CVD method, or the like, and then forming a resist mask by a photolithography method and processing the film by an etching method. In addition, although the fourth conductive layer 717 can be formed similarly to the third conductive layer 714, the fourth conductive layer 717 can be formed in an arbitrary shape using a metal mask.

As the memory layer 716, the organic compound described in Embodiment Mode 6 can be used. In addition, the second insulating layer 713 and the third insulating layer 715 are formed using an oxide of silicon, a nitride of silicon, an oxide of silicon containing nitrogen, a nitride of silicon containing oxygen, or the like by a vapor phase growth method (a CVD method), a sputtering method, or the like. Further, the third insulating layer 715 can be formed using an oxide of silicon, a nitride of silicon, polyimide, acrylic, siloxane, an oxazole resin or the like, by an arbitrary film formation method such as a vapor phase growth method, a sputtering method, an SOG (Spin On Glass) method, a droplet discharge method (e.g., an ink-jet method), or the like.

Figure 18B:
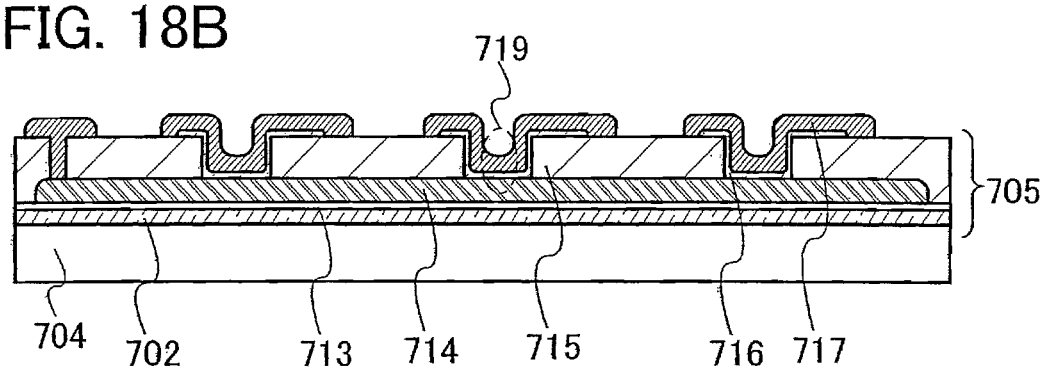
Figure 18C:
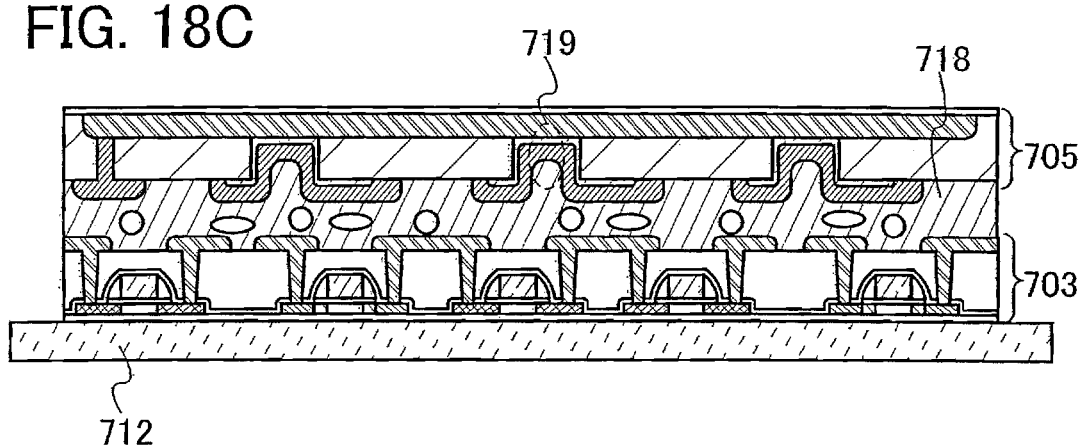

When the first element formation layer 703 and the second element formation layer 705 which are formed in this manner are peeled off and attached to each other, a semiconductor integrated circuit can be formed as shown in FIG. 18C. The method described in the above embodiment mode can be used for peeling and attaching respective element formation layers, and for forming a through wiring. Note that FIG. 18C shows an example in which the top surface of the second element formation layer 705 and the top surface of the first element formation layer 703 are attached to each other so as to face each other using an anisotropic conductive material 718 for bonding.

In this manner, when top layers of the first element formation layer 703 and the second element formation layer 705 are formed using conductive layers, and the first element formation layer 703 and the second element formation layer 705 are bonded to each other so as to face each other with the anisotropic conductive material 718 interposed therebetween, the first element formation layer 703 and the second element formation layer 705 can be electrically connected without forming a through wiring. This method can be applied to the case where a semiconductor integrated circuit is formed by stacking two element formation layers.

The above example shows the case where the first element formation layer 703 and the second element formation layer 705 are peeled off from the first substrate 701 and the second substrate 704 respectively, thereby forming the semiconductor integrated circuit. However, either one of the first element formation layer 703 or the second element formation layer 705 can be peeled off and attached to the other element formation layer. At this time, the first element formation layer 703 having the thin film transistors can be peeled off, and then attached to the second element formation layer 705; in this case, an opening may also be formed in the first element formation layer.

On the other hand, the second element formation layer 705 provided with the memory element 719 can be peeled off and attached to the first element formation layer 703. When the third conductive layer 714 and the fourth conductive layer 717 which form the memory element 719 are formed using a flexible metal such as aluminum and the memory layer 716 is formed using an organic compound, the second element formation layer 705 having the memory element 719 has considerable flexibility. Therefore, peeling off the second element formation layer 705 having the memory element 719 suffers less damage at the time of peeling, and a semiconductor integrated circuit with high reliability can be formed.

In addition, both a thin film transistor and a memory element may be formed in the first element formation layer 703 and the second element formation layer 705, and those layers may be overlapped, so that a semiconductor integrated circuit can be formed.

Furthermore, in the structure of the memory element shown in FIGS. 18B and 18C, a material for forming the memory layer 716 may be replaced with a material having a piezoelectric property, so that a piezoelectric element can be formed. Since the piezoelectric element generates a voltage between the third conductive layer 714 and the fourth conductive layer 717 in accordance with pressure applied from outside, the piezoelectric element can be used as a pressure sensor or the like.

As a material having a piezoelectric property for forming a piezoelectric layer, for example, crystal ($SiO_2$), barium titanate (BaTiO), lead titanate ($PbTiO_3$), lead zirconate titanate ($Pb(Zr, Ti)O_3$), lead lanthanum zirconate titanate ($(Pb, La)(Zr, Ti)O_3$), lithium niobate ($LiNbO_3$), lead metaniobate ($PbNb_2O_6$), a polyvinylidene fluoride (PVDF), zinc oxide (ZnO), aluminum nitride ($Al_xN_y$), or tantalum oxide ($Ta_2O_5$) can be used. A piezoelectric material is an insulator without a crystal center. When stress is applied to crystal, positive and negative charges are generated on the surface of the crystal, and polarization occurs. This is referred to as a positive piezoelectric effect. On the other hand, when a voltage is applied to the crystal, distortion occurs. This is referred to as an inverse piezoelectric effect. Therefore, when an alternating current is applied to the piezoelectric material, the piezoelectric material oscillates due to this inverse piezoelectric effect.

In this manner, by replacing a memory layer with a piezoelectric layer and attaching the second element formation layer 705 to the first element formation layer 703 using the process of the above example, a semiconductor integrated circuit having a thin film transistor and a piezoelectric element can be formed.

When a semiconductor integrated circuit having a sensor element for detecting information from outside like a piezoelectric element is formed, a layer having the sensor element is preferably formed as a top layer (the n-th element formation layer) which forms the semiconductor integrated circuit. This is because information from outside can be detected sensitively by placing the sensor element at the top layer (an outermost surface) of the semiconductor integrated circuit. In addition, as the sensor element, sensors having various structures such as a temperature sensor or an infrared ray sensor using a thermoelectric element, an acceleration sensor or a pressure sensor using a structure having a movable portion can be formed, as well as a pressure sensor using a piezoelectric element.

In addition, as an example of forming a layer having semiconductor elements which function as memory elements, like the above example, nonvolatile memories having a floating gate or destruction-type memory elements having the same shape as the thin film transistor, as well as memory elements provided with a memory layer between two conductive layers can be formed. Here, an example of a semiconductor integrated circuit with nonvolatile memories having a floating gate is described with reference to FIG. 19A.

In this example, by using a semiconductor substrate as the first substrate, a memory element 720 having a floating gate is formed over the first substrate, so that a first element formation layer 721 is formed. The memory element 720 included in the first element formation layer 721 includes a floating gate which is a charge retention region. A thin film transistor and a field effect transistor usually have a gate electrode formed over a gate insulating film; however, the memory element 720 is formed such that a floating gate is formed over a gate insulating film (also referred to as a tunnel oxide film), and a gate electrode is formed thereover with an insulating film interposed therebetween. The memory element 720 having the floating gate can store one bit using two states: whether charges are stored in the floating gate or not.

When writing is performed to the memory element 720, either one of two high concentration impurity regions (a source electrode here) is set at a ground voltage, and a high voltage is applied to the gate electrode and the other of the high concentration impurity regions (a drain electrode here). Then, electrons flow from the source electrode to the drain electrode. However, when a sufficiently high voltage is applied, electrons flowing through a channel portion become thermoelectrons (hot electrons), and a part of the electrons passes through a tunnel oxide film and is accumulated in the floating gate. Then, even when a gate is closed after sufficient electrons are accumulated in the floating gate, the electrons in the floating gate are blocked by the tunnel oxide film and held. This state is a state in which a threshold voltage of the transistor is increased due to the electrons accumulated in the floating gate, and the switch remains closed even when the transistor is operated at a low voltage. This state is a state in which information is stored in the memory element 720. On the other hand, in the case of erasing information, when the gate electrode is set at a ground voltage and the source electrode is kept at a high potential, electrons are gradually released from the floating gate and information is erased.

Next, a glass substrate is used as the second substrate, and a release layer and a second element formation layer 723 having an opening and a semiconductor element 722 which functions as a thin film transistor are formed over the second substrate. The second element formation layer can be formed by using the method which is described in the above embodiment mode. Then, when the second element formation layer 723 is peeled off from the second substrate, and the top surface of the second element formation layer 723 and the top surface of the first element formation layer 721 are attached to each other so as to face each other over the first element formation layer 721 which is formed over the first substrate, a semiconductor integrated circuit having a memory element and a semiconductor element which functions as a transistor can be formed as shown in FIG. 19A.

Figure 19A:
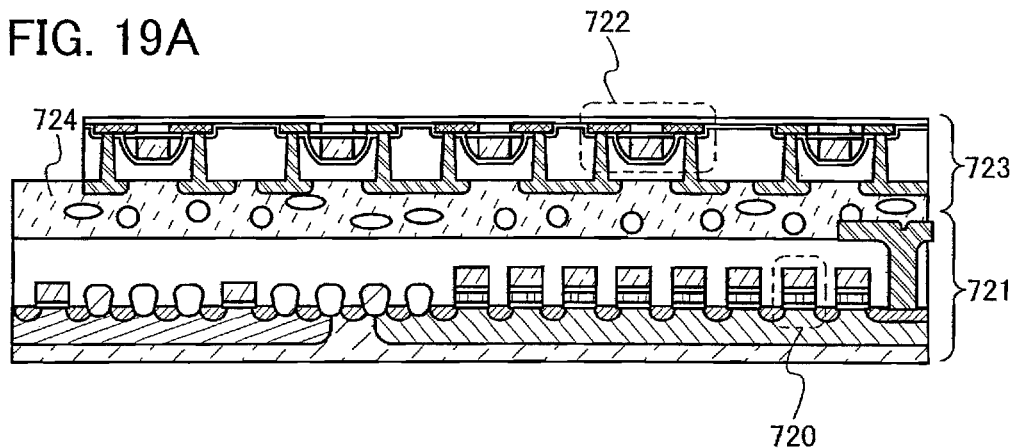
FIGS. 19A and 19B are diagrams illustrating a method for forming a semiconductor integrated circuit of the present invention.

Note that FIG. 19A shows an example using an anisotropic conductive material 724 for bonding. In this manner, by forming the top layers of the first element formation layer and the second element formation layer using conductive layers and bonding them to each other so as to face each other with an anisotropic conductive material interposed therebetween, the first element formation layer 721 and the second element formation layer 723 can be electrically connected without forming a through wiring.

Note that the present invention is not limited to this embodiment mode; a semiconductor integrated circuit having a memory element and a semiconductor element which functions as a transistor may be formed by forming an opening in the second element formation layer 723, forming a through wiring in the opening, and connecting the second element formation layer 723 and the first element formation layer 721. In addition, an opening may be formed in the first element formation layer 721.

Although the semiconductor element 722 and the nonvolatile memory element 720 have similar shapes, the semiconductor element 722 and the nonvolatile memory element 720 have different manufacturing processes; therefore, after the semiconductor element 722 and the nonvolatile memory element 720 are formed in different element formation layers, by attaching the semiconductor element 722 and the nonvolatile memory element 720 to each other by using the present invention, a semiconductor integrated circuit with high reliability can be formed.

In addition, like the above example, the first element formation layer 721 can be provided with a bipolar transistor, a PN junction diode, a field effect transistor (FET), or the like using a semiconductor substrate, and the second element formation layer 723 to the n-th element formation layer can be provided with a semiconductor element which can be formed over a glass substrate, such as a thin film transistor, so that the second element formation layer 723 to the n-th element formation layer can be attached to each other. For example, in the case of a semiconductor integrated circuit having a sensor element, since a bipolar transistor is often effective for amplifying an output of the sensor element, and a BiCMOS circuit in which a CMOS circuit and a bipolar transistor are combined may be formed by attaching element formation layers.

Figure 19B:
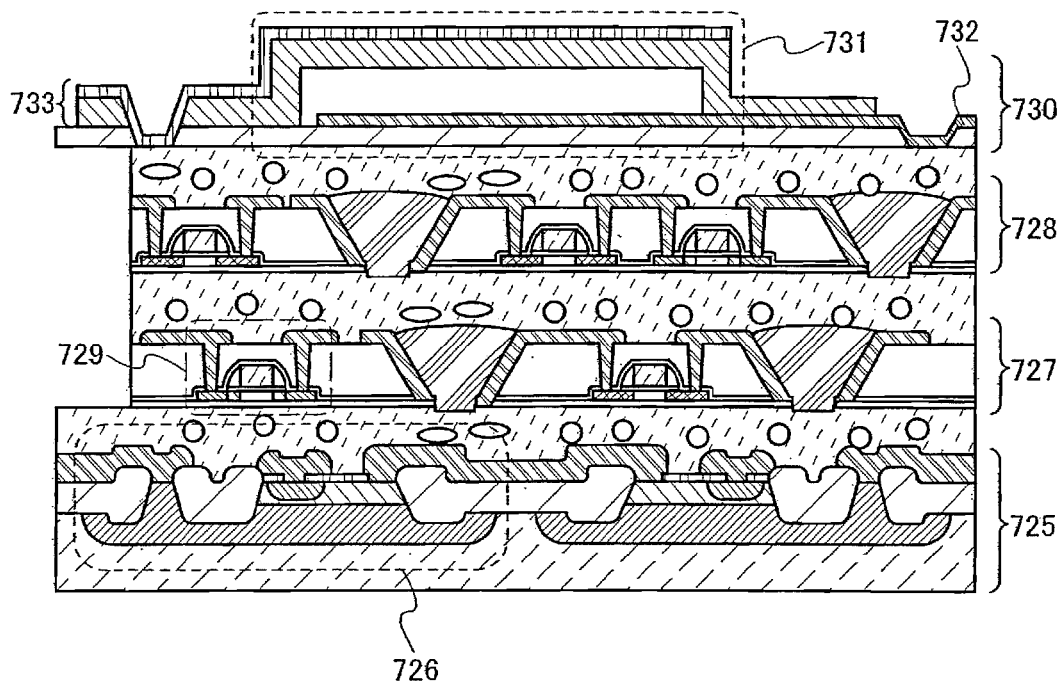

Such an example is shown in FIG. 19B. A first element formation layer 725 includes a semiconductor element 726 which functions as a bipolar transistor over a semiconductor substrate. A second element formation layer 727 and a third element formation layer 728 each include a semiconductor element 729 which functions as a thin film transistor. A fourth element formation layer 730 includes a sensor element 731 having a movable portion.

In this example, the first element formation layer 725 is formed by forming a bipolar transistor over the first substrate, using a semiconductor substrate as the first substrate. The bipolar transistor is a junction of p-type and n-type semiconductors, and has three terminals of an emitter, a base, and a collector. There are an NPN transistor in which opposite sides of a p-type semiconductor are sandwiched between n-type semiconductors, and a PNP transistor in which opposite sides of an n-type semiconductor are sandwiched between p-type semiconductors, and a current between the collector and the emitter is controlled in accordance with a current which flows between the base and the emitter. Here, a normal operation can be performed by increasing the impurity concentration of the semiconductor on the emitter side.

Next, a release layer, and the second element formation layer 727 or the third element formation layer 728 having the semiconductor element 729 which functions as the thin film transistor and an opening are provided over the second substrate or the third substrate. The second element formation layer 727 and the third element formation layer 728 can be formed by using the method described in the above embodiment mode.

Next, a release layer, and a structure which has a movable portion and functions as a sensor element 731 are formed over the fourth substrate. As a method for manufacturing the structure, first, a release layer and an insulating layer are sequentially formed over the substrate, and a conductive layer 732 which functions as a fixed electrode is formed thereover. Next, a sacrificial layer is formed over the conductive layer 732, and a structural layer 733 is formed over the sacrificial layer. The conductive layer 732, the sacrificial layer, and the structural layer 733 can be formed using a known material and a known film formation method. The structural layer 733 can be formed by stacking plural kinds of layers such as a conductive layer or a layer having an insulating property. In addition, since the sacrificial layer is removed eventually, a material having etching selectivity with respect to a material for forming another layer is preferably used.

Next, when the second element formation layer 727 to the fourth element formation layer 730 are peeled off from the second substrate to the fourth substrate, and attached to the first element formation layer 725 formed over the first substrate, a through wiring is formed. Then, etching of the sacrificial layer is performed for removing the sacrificial layer in order to form the movable portion of the structure which is formed in the fourth element formation layer 730; therefore, a semiconductor integrated circuit having the semiconductor element 726 which functions as the bipolar transistor and a structure which functions as the sensor element 731 can be formed as shown in FIG. 19B.

In addition, a semiconductor integrated circuit of the present invention can be formed such that the semiconductor elements which pass through different steps are separately formed and attached to each other. For example, a layer having a p-channel transistor and a layer having an n-channel transistor can be formed in different layers and attached to each other.

In this manner, a semiconductor integrated circuit can be formed by freely combining various element formation layers shown above. Furthermore, by using the semiconductor integrated circuit described in this embodiment mode, a semiconductor device like RFID, which is described in the above embodiment mode, can be formed, for example. In the case where a semiconductor device which functions as RFID is formed, an antenna which is separately formed may be attached to the semiconductor integrated circuit which is formed in accordance with the example of this embodiment mode. Further, in a process for manufacturing a semiconductor integrated circuit, when the first element formation layer to the (n−1)th element formation layer and the n-th layer including an antenna are formed, and the first element formation layer to the n-th element formation layer are stacked, a semiconductor device which functions as RFID can be formed.

Embodiment Mode 8

Figure 20A:
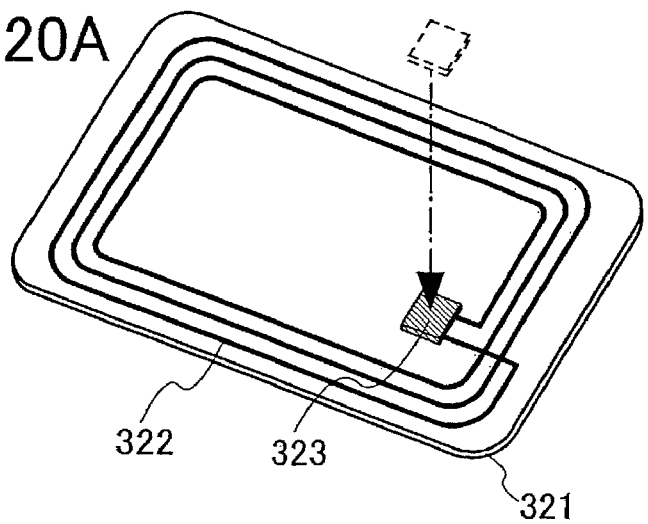
FIGS. 20A to 20C are diagrams illustrating a structural example of a semiconductor device of the present invention.
Figure 20B:
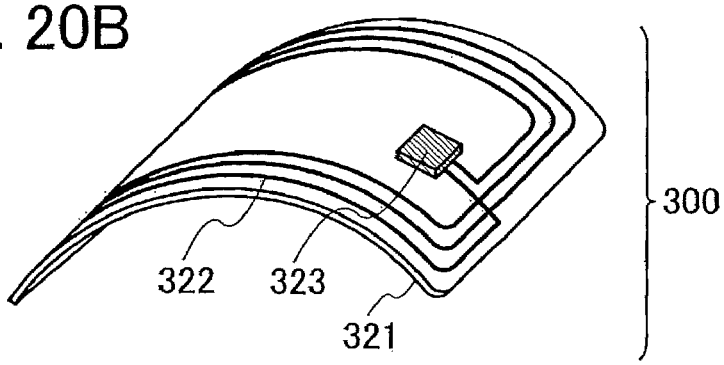
Figure 20C:
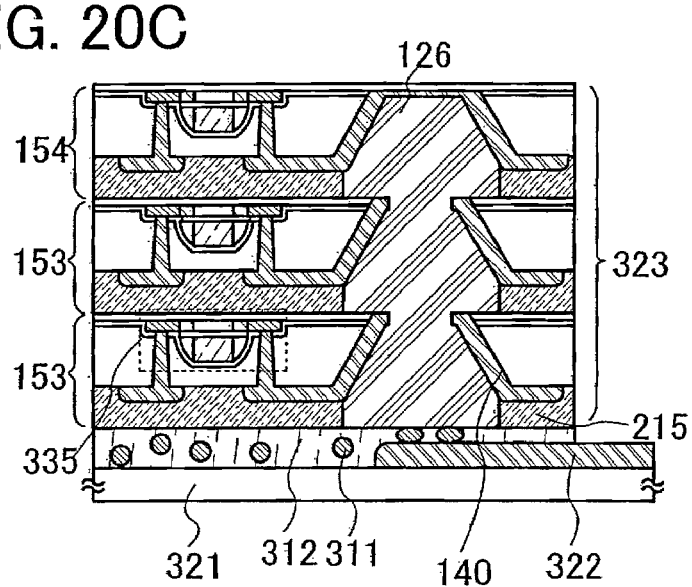

This embodiment mode will describe a usage pattern of a semiconductor device which functions as an IC card with reference to FIGS. 20A to 20C.

The semiconductor device 300 shown in FIGS. 20A to 20C is provided such that a semiconductor integrated circuit 323 which is formed in the above embodiment mode is bonded to a substrate 321. A conductive film 322 which functions as an antenna is formed over the substrate 321, and semiconductor elements included in the semiconductor integrated circuit 323 and the conductive film 322 which functions as the antenna and is provided over the substrate 321 are electrically connected to each other (see FIG. 20A).

Here, the semiconductor integrated circuit 323 used for forming the semiconductor device 300 is formed using the method described in the above embodiment mode; the first element formation layer to the n-th element formation layer (in the diagram, n=3) are stacked and attached to each other, and respective layers are electrically connected with a through wiring. In addition, electric circuits for forming a semiconductor device (e.g., a power supply circuit, a demodulation circuit, a logic arithmetic circuit, a memory circuit, or the like) are formed in the semiconductor integrated circuit 323.

The electrical connection between the semiconductor elements included in the semiconductor integrated circuit 323 and the conductive film 322 which functions as the antenna is performed such that the second conductive layer 140 which is located on a top surface on a side provided with the semiconductor element, that is the upper surface of the n-th element formation layer 153 having the semiconductor elements (it is the top layer which forms the semiconductor integrated circuit, and in the diagram, the third element formation layer) or the through wiring 126, and the conductive film 322 are connected (see FIG. 20C). Here, an example is shown, in which the through wiring 126 which is electrically connected to a semiconductor element 335 and the conductive film 322 which functions as the antenna are connected using a conductive resin. As the resin, when the anisotropic conductive material described in the above embodiment mode is used, the semiconductor integrated circuit and the conductive film which functions as an antenna can be electrically connected to each other through the conductive particles 311 included in the adhesive resin 312 (see FIG. 20C).

In addition, after the semiconductor integrated circuit is connected to the substrate provided with the conductive film which functions as the antenna, when a film to serve as a protective layer may be attached to the semiconductor integrated circuit, a semiconductor device can be protected.

Further, when a flexible substrate such as plastic is used as the substrate 321, the semiconductor device which functions as an IC card can be curved; therefore, an IC card with an added value can be provided (see FIG. 20B).

Embodiment Mode 9

Figure 21:
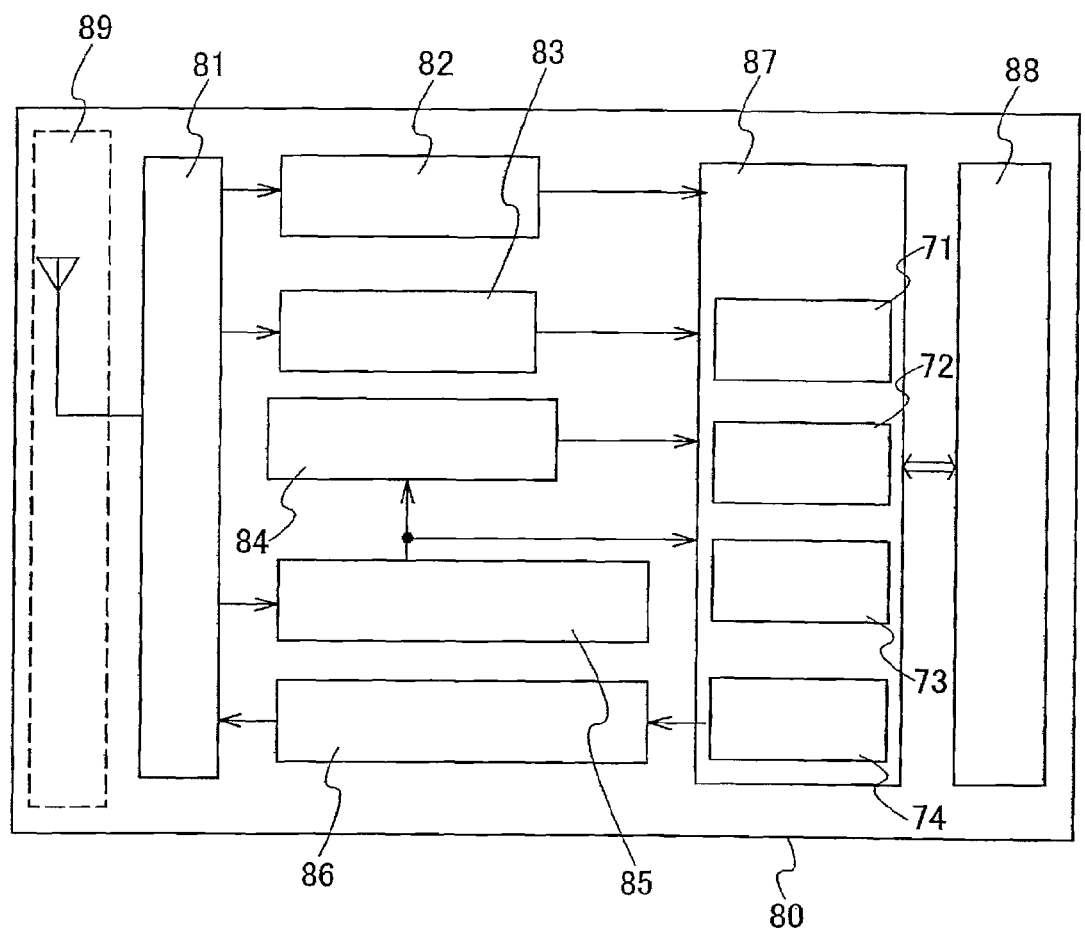
FIG. 21 is a diagram illustrating a structural example of a semiconductor device of the present invention.

This embodiment mode will describe an operation of a semiconductor device capable of exchanging data without contact, with reference to FIG. 21.

A semiconductor device 80 has a function of exchanging data without contact, and includes a high-frequency circuit 81, a power supply circuit 82, a reset circuit 83, a clock generating circuit 84, a data demodulation circuit 85, a data modulation circuit 86, a controlling circuit 87 for controlling another circuit, a memory circuit 88, and an antenna 89 (FIG. 21).

The high-frequency circuit 81 receives a signal from the antenna 89 and outputs a signal, which is received from the data modulation circuit 86, from the antenna 89. The power supply circuit 82 generates a power supply potential from a received signal inputted from the antenna 89. The reset circuit 83 generates a reset signal. The clock generating circuit 84 generates various clock signals based on a received signal inputted from the antenna 89. The data demodulation circuit 85 demodulates a received signal and outputs the demodulated signal to the controlling circuit 87. The data modulation circuit 86 modulates a signal received from the controlling circuit 87.

As the controlling circuit 87, for example, a code extracting circuit 71, a code judging circuit 72, a CRC judging circuit 73, and an output unit circuit 74 are provided. Note that the code extracting circuit 71 extracts each of plural codes included in an instruction sent to the controlling circuit 87. The code judging circuit 72 judges the content of the instruction by comparing the extracted code with a code corresponding to a reference. The CRC judging circuit detects whether or not there is a transmission error or the like based on the judged code.

In addition, the number of the memory circuits 88 is not limited to one, and a plurality of memory circuits 88 may be provided, and an SRAM, a flash memory, a ROM, a FeRAM, or the like, or an organic compound layer can be used for a memory element portion.

Next, an example of an operation of the semiconductor device of the present invention capable of exchanging data without contact is described. First, a wireless signal is received by the antenna 89 and then sent to the power supply circuit 82 through the high-frequency circuit 81, thereby generating a high power supply potential (hereinafter referred to as VDD) and a low power supply potential (hereinafter referred to as VSS). The VDD is supplied to each circuit in the semiconductor device 80. Note that VSS is common in the plural circuits included in the semiconductor device 80 and VSS can be GND.

A signal sent to the data demodulation circuit 85 through the high-frequency circuit 81 is demodulated (hereinafter this signal is called a demodulated signal). Moreover, signals passed through the reset circuit 83 and the clock generating circuit 84 via the high-frequency circuit 81, and the demodulated signal are sent to the controlling circuit 87. The signals sent to the controlling circuit 87 are analyzed by the code extracting circuit 71, the code judging circuit 72, the CRC judging circuit 73, and the like. Then, based on the analyzed signals, the information of the semiconductor device stored in the memory circuit 88 is outputted. The outputted information of the semiconductor device is encoded through the output unit circuit 74. Further, the encoded information of the semiconductor device 80 passes through the data modulation circuit 86 and then is sent by the antenna 89 as a wireless signal.

In this manner, when a signal is sent from a reader/writer to the semiconductor device 80 and the signal sent from the semiconductor device 80 is received by the reader/writer, the data in the semiconductor device can be read.

Moreover, in the semiconductor device 80, a power supply voltage may be supplied to each circuit by electromagnetic waves without mounting a power supply device (e.g., a cell or a battery), or a power supply device may be mounted so that a power supply voltage is supplied to each circuit by both electromagnetic waves and the power supply.

Since a semiconductor device which can be bent can be formed using the structure described in the above embodiment mode, the semiconductor device can be attached to an object having a curved surface.

Figure 22A:
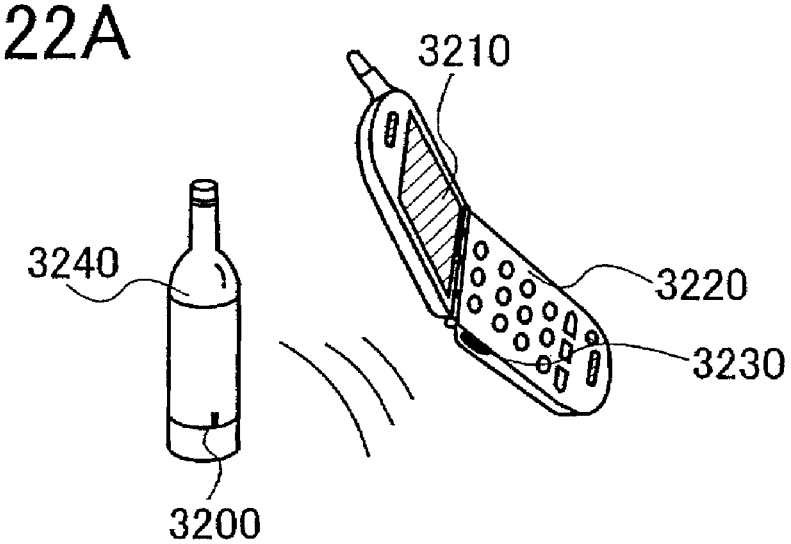
FIGS. 22A and 22B are diagrams illustrating examples of a usage pattern of a semiconductor device of the present invention.

Next, an example of a usage pattern of a flexible semiconductor device in which data can be exchanged without contact is described. As shown in FIG. 22A, a side surface of a mobile terminal 3220 including a display portion 3210 is provided with a reader/writer 3230. A side surface of a product 3240 is provided with a semiconductor device 3200 of the present invention. When the reader/writer 3230 is held over the semiconductor device 3200 included in the product 3240, the display portion 3210 displays information on the product, such as a raw material, a production area, an inspection result for each production step, a history of distribution process, and description of the product.

Figure 22B:
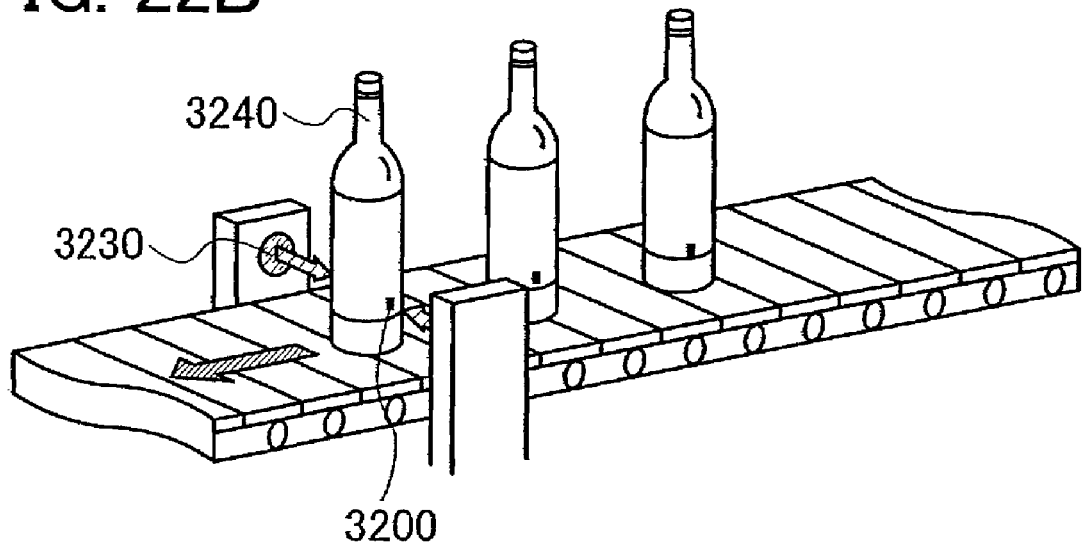

In addition, as an example shown in FIG. 22B, when the product 3240 is transferred by a conveyer belt, the product 3240 can be inspected by using the semiconductor device 3200 of the present invention provided to the product 3240 and the reader/writer 3230.

In this manner, by using the semiconductor device for a system for managing a product, information can be acquired easily, and improvement in functionality and added value of the system can be achieved. As described in the above embodiment mode, a semiconductor element included in a semiconductor device can be prevented from being damaged even when the semiconductor device of the present invention is attached to an object having a curved surface, and a reliable semiconductor device can be provided.

In addition, as a signal transmission method in the above-described semiconductor device which can exchange data without contact, an electromagnetic coupling method, an electromagnetic induction method, a microwave method, or the like can be used. The transmission method may be selected as appropriate by a practitioner in consideration of an intended use, and an optimum antenna may be provided in accordance with the transmission method.

In a case of employing, for example, an electromagnetic coupling method or an electromagnetic induction method (e.g., 13.56 MHz band) as the signal transmission method in the semiconductor device, electromagnetic induction caused by a change in magnetic field density is used. Therefore, the conductive film which functions as an antenna is formed in an annular shape (e.g., a loop antenna) or a spiral shape (e.g., a spiral antenna).

A microwave method (e.g., UHF band (860 to 960 MHz band), a 2.45 GHz band, or the like) can be used as the signal transmission method in the semiconductor device. In that case, the shape such as a length of the conductive film which functions as an antenna may be appropriately set in consideration of a wavelength of an electromagnetic wave used for signal transmission. For example, a conductive film which functions as an antenna can be formed in a linear shape (e.g., a dipole antenna), a flat shape (e.g., a patch antenna), a ribbon-like shape, or the like. The shape of the conductive film which functions as the antenna is not limited to a linear shape, and the conductive film which functions as the antenna may be provided in a curved-line shape, a meander shape, or a combination thereof, in consideration of a wavelength of an electromagnetic wave.

The conductive film which functions as the antenna is formed from a conductive material by a CVD method, a sputtering method, a printing method such as screen printing or gravure printing, a droplet discharge method, a dispenser method, a plating method, or the like. The conductive film is formed with a single-layer structure or a stacked structure using an element selected from among aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the above element as its main component.

In a case of forming a conductive film which functions as an antenna by, for example, a screen printing method, the conductive film can be formed by selectively printing conductive paste in which conductive particles each having a grain size of several tens of μm or less are dissolved or dispersed in an organic resin. As the conductive particle, a fine particle of one or more metals of silver (Ag), gold (Au), copper (Cu), nickel (Ni), platinum (Pt), palladium (Pd), tantalum (Ta), molybdenum (Mo), and titanium (Ti), silver halide, or carbon black can be used. In addition, as the organic resin contained in the conductive paste, one or more of organic resins each functioning as a binder, a solvent, a dispersant, or a coating of the metal particle can be used. Typically, an organic resin such as an epoxy resin or a silicone resin can be used. When a conductive film is formed, baking is preferably performed after the conductive paste is printed. For example, in the case of using fine particles (e.g., the grain size of the particles is greater than or equal to 1 nm and less than or equal to 100 nm) containing silver as their main component as a material of the conductive paste, a conductive film can be obtained by hardening the conductive paste by baking at temperatures ranging from 150 to 300° C. Alternatively, fine particles containing solder or lead-free solder as its main component may be used; in this case, it is preferable to use a fine particle having a grain size of 20 μm or less. Solder or lead-free solder has an advantage such as low cost.

Besides the above-mentioned materials, ceramic, ferrite, or the like may be applied to an antenna. Furthermore, a material of which dielectric constant and magnetic permeability are negative in a microwave band (metamaterial) can be applied to an antenna.

In the case of using an electromagnetic coupling method or an electromagnetic induction method, and providing a semiconductor device including an antenna in contact with a metal film, a magnetic material having magnetic permeability is preferably provided between the semiconductor device and the metal film. In the case of providing a semiconductor device including an antenna in contact with a metal film, an eddy current flows in the metal film accompanying change in a magnetic field, and a demagnetizing field generated by the eddy current impairs a change in a magnetic field and decreases a communication range. Therefore, an eddy current of the metal and a decrease in the communication range can be suppressed by providing a material having magnetic permeability between the semiconductor device and the metal film. Note that ferrite or a metal thin film having high magnetic permeability and little loss of high frequency wave can be used as the magnetic material.

In the case of providing an antenna, a semiconductor element such as a transistor and a conductive film which functions as an antenna may be formed over the same substrate, or a semiconductor element and a conductive film which functions as an antenna may be provided over separate substrates and then attached to be electrically connected to each other.

Figure 23:
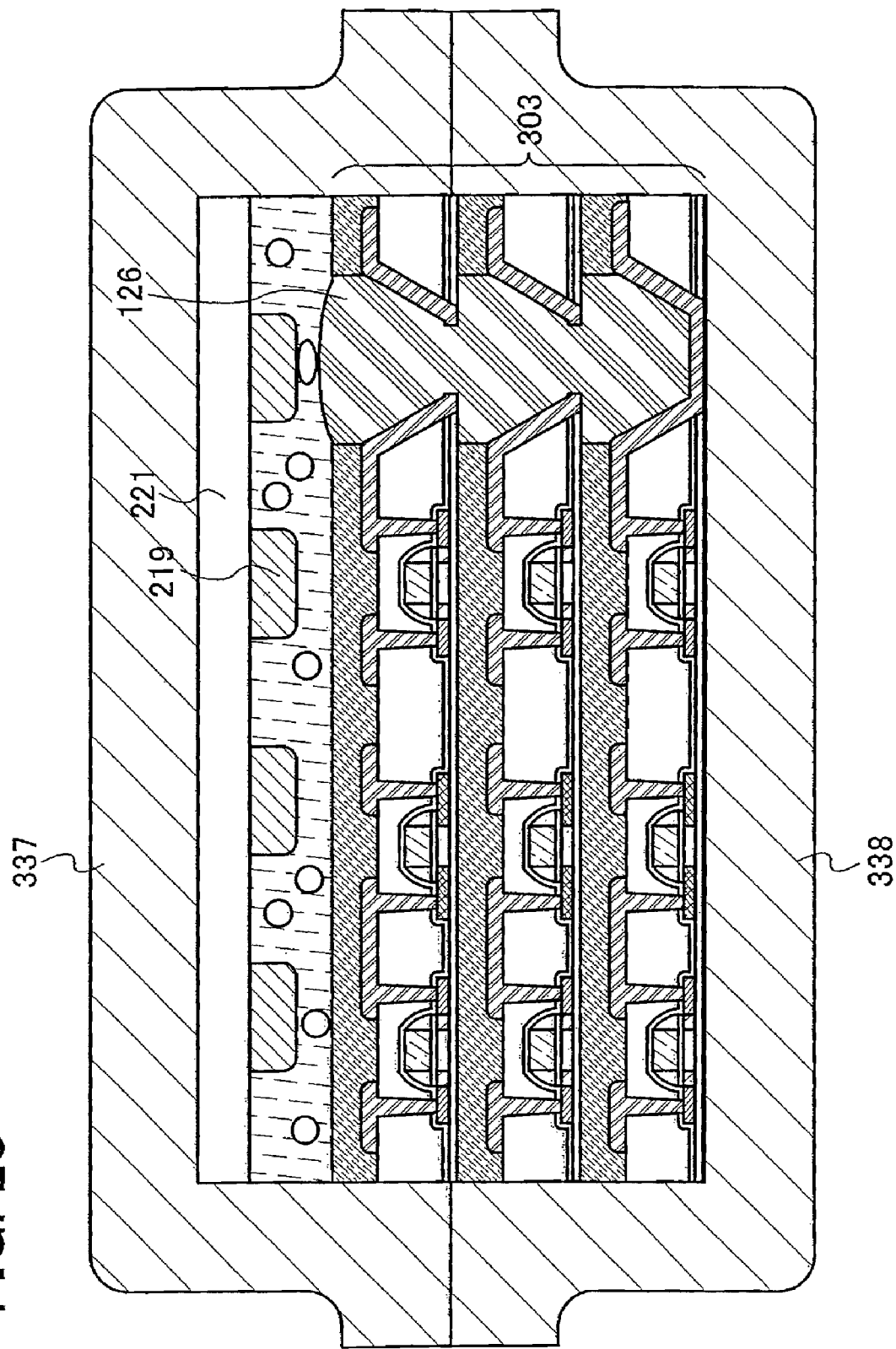
FIG. 23 is a diagram illustrating a structural example of a semiconductor device of the present invention.

Note that sealing treatment can be performed on the above-described semiconductor device. For example, as shown in FIG. 23, sealing treatment can be performed on a semiconductor integrated circuit or a semiconductor device using a first sheet material 337 (also referred to as a film or a substrate) and a second sheet material 338. In FIG. 23, the semiconductor device which has been subjected to sealing treatment corresponds to the semiconductor device described in Embodiment Mode 6 with reference to FIG. 16A. As the semiconductor device, a semiconductor integrated circuit and the conductive film 219 which functions as the antenna and is formed on the substrate 221 are attached to each other so as to be electrically connected.

An impurity element, moisture, and the like which are mixed into the semiconductor elements from outside can be suppressed due to such sealing. The first sheet material 337 and the second sheet material 338 used for sealing may be a film made of polypropylene, polyester, vinyl, polyvinyl fluoride, polyvinyl chloride, or the like, paper of a fibrous material, or a stacked film of a base film (polyester, polyimide, an inorganic vapor-deposited film, paper, or the like) and an adhesive synthetic resin film (an acrylic-based synthetic resin, an epoxy-based synthetic resin, or the like), or the like.

An adhesive layer provided on the uppermost surface of the film or a layer (not an adhesive layer) provided on the outermost layer is melted by heat treatment to be bonded by applying pressure. An adhesive layer may be provided on the surface of the first sheet material 337 and the second sheet material 338, but it is not necessarily provided. The adhesive layer corresponds to a layer containing an adhesive such as a thermosetting resin, a UV curing resin, an epoxy-based resin, or a resin additive. The sheet material used for sealing is preferably coated with silica to prevent moisture or the like from entering the inside after sealing, and for example, a sheet material in which an adhesive layer, a film of polyester or the like, and silica coat are stacked can be used.

In addition, when heat treatment is performed on films, the first sheet material and the second sheet material which have the same thermal expansion coefficient are preferably used. This is because transformation of the semiconductor device can be prevented or abnormal stress can be prevented from being applied to the semiconductor elements by setting the shrinkage rates of the sheet materials after heat treatment to be the same.

As the first sheet material 337 or the second sheet material 338, a film subjected to antistatic treatment for preventing static electricity or the like (hereinafter referred to as an antistatic film) can be used as well. An antistatic film includes a film where an antistatic material is dispersed in a resin, a film to which an antistatic material is attached, and the like. A film containing an antistatic material may be a film having one surface provided with an antistatic material, or a film having the both surfaces provided with an antistatic material. In a film having one surface provided with an antistatic material, a surface containing an antistatic material may be attached to the inside or outside of the film. Note that an antistatic material may be provided over the entire surface or a part of a film. An antistatic material herein includes metal, an oxide of indium and tin, and a surfactant such as a zwitterionic surfactant, a cationic surfactant, and a nonionic surfactant. Instead, a resin material containing a cross-linked copolymer high molecular compound having a carboxyl group and a quaternary ammonium base in a side chain may be used as an antistatic material. An antistatic film may be obtained by attaching or kneading these materials to a film, or coating the surface of the film with these materials. When a semiconductor device is sealed with an antistatic film, the semiconductor elements can be protected from external static electricity or the like when being handled as a product.

In the sealing treatment, only one of surfaces of the semiconductor device may be sealed selectively by using either one of the first sheet material 337 or the second sheet material 338. In addition, sealing may be performed using a glass substrate instead of the first sheet material 337 or the second sheet material 338; in this case, the glass substrate can function as a protective film, and moisture and an impurity element which enters semiconductor elements from outside can be suppressed.

Embodiment Mode 10

The semiconductor device of the present invention can be used in various objects and various systems as shown in FIGS. 24A to 24E by utilizing a function capable of transmitting and receiving data without contact.

The various objects include, for example, keys (see FIG. 24A), banknotes, coins, securities, bearer bonds, certificates (a driver's license, a resident's card, or the like), books, packing containers (a petri dish or the like; see FIG. 24B), personal accessories and ornaments (a bag, glasses, or the like; see FIG. 24C), packing and wrapping containers (wrapping paper, a bottle, or the like; see FIG. 24D), recording media (a disk, a video tape, or the like), vehicles (a bicycle or the like), foods, clothing, everyday articles, and electronic devices (a liquid crystal display device, an EL display device, a television device, a portable terminal, or the like).

A semiconductor device 1120 of the present invention can be fixed by being attached to the surfaces of the objects having various forms as described above, or being embedded into the objects.

In addition, the various systems using the semiconductor device of the present invention include a physical distribution-inventory management system, a certification system, a distribution system, a production record system, a book management system, and the like. By utilizing the semiconductor device 1120 of the present invention, high-function, multifunction, and a high-added value of the system can be achieved.

Figure 24E:
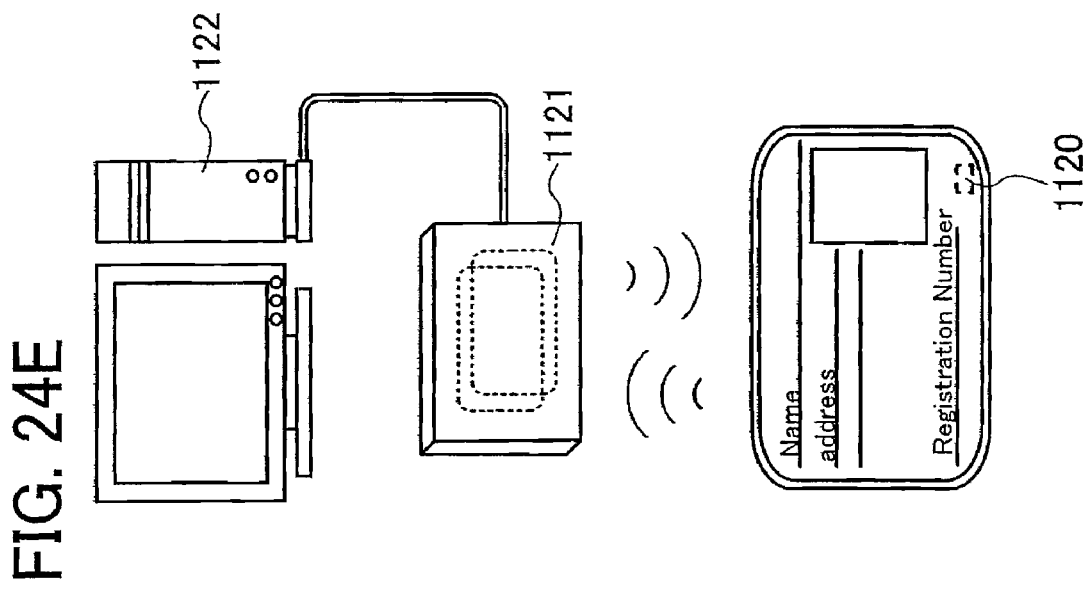
FIGS. 24A to 24E are diagrams illustrating examples of a usage pattern of a semiconductor device of the present invention.
Figure 24C:
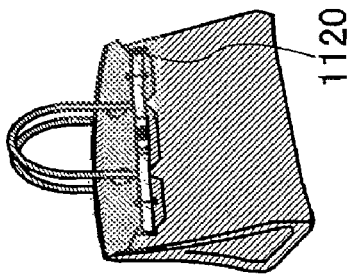
Figure 24D:
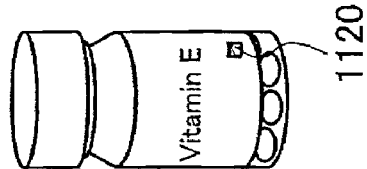
Figure 24A:
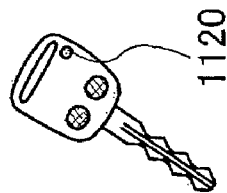
Figure 24B:
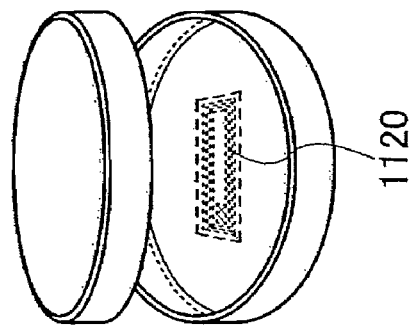

For example, the semiconductor device 1120 of the present invention is provided inside an identification card, and a reader/writer 1121 is provided at an entrance of a building or the like (see FIG. 24E). The reader/writer 1121 reads an identification number inside the identification card that every person possesses and supplies information related to the identification number that has been read to a computer 1122. The computer 1122 determines whether to permit the person's entrance or exit, based on the information supplied from the reader/writer 1121. In such a manner, by utilizing the semiconductor device of the present invention, an entrance-exit management system with improved convenience can be provided. Note that in this specification, a reader/writer includes not only a device having a reading function and a writing function, but also a communication device having a reading function or a writing function.

The structure of this embodiment mode can be combined with any structure of the other embodiment modes.

Embodiment Mode 11

This embodiment mode will describe a structure which is different from the above embodiment mode of usage patterns of a semiconductor device of the present invention, with reference to FIGS. 25A to 27B. Specifically, a semiconductor device having a displaying means will be described.

First, as a displaying means, a case of providing a pixel portion with a light-emitting element will be described with reference to FIGS. 25A and 25B. Note that FIG. 25A shows a top view showing an example of a semiconductor device having a displaying means of the present invention, whereas FIG. 25B shows a cross-sectional view of FIG. 25A taken along chain lines a-b and c-d.

As shown in FIG. 25A, a semiconductor device having a displaying means shown in this embodiment mode includes a scanning line driver circuit 502, a signal line driver circuit 503, a pixel portion 504, and the like which are provided over a substrate 501. In addition, an opposite substrate 506 is provided such that the pixel portion 504 is sandwiched between the opposite substrate 506 and the substrate 501, and the substrate 501 and the opposite substrate 506 are attached to each other with a sealant 505. The scanning line driver circuit 502, the signal line driver circuit 503, and the pixel portion 504 can be provided by forming semiconductor elements each having any of the structures shown in the above embodiment mode over the substrate 501.

The scanning line driver circuit 502 and the signal line driver circuit 503 receive a video signal, a clock signal, a start signal, a reset signal, or the like from an FPC (Flexible Printed Circuit) 507 which serves as an external input terminal. In the drawing, only the FPC 507 is shown; however, the FPC 507 may be provided with a printed wiring board.

In addition, as the signal line driver circuit 503 or the scanning line driver circuit 502 here, a semiconductor integrated circuit where element formation layers are stacked can be employed as shown in the above embodiment mode. By providing the semiconductor integrated circuit where the element formation layers are stacked in this manner, an area in which the signal line driver circuit 503 or the scanning line driver circuit 502 is occupied can be reduced; therefore, the pixel portion 504 can be formed to have a large area.

FIG. 25B is a schematic view of a cross section of FIG. 25A taken along chain lines a-b and c-d. Here, a structure of the signal line driver circuit 503 and the pixel portion 504 which are provided over the substrate 501 is shown. A semiconductor integrated circuit 510 having a CMOS circuit that is a combination of an n-type semiconductor element 511a and a p-type semiconductor element 511b having any of the structures shown in the above embodiment mode is formed in the signal line driver circuit 503. The semiconductor integrated circuit 510 is formed by stacking the first element formation layer to the n-th element formation layer (in the diagram, the second element formation layer), using any of the methods described in the above embodiment mode. Then, the through wiring 126 is formed by dropping conductive paste in the openings provided in the first element formation layer to the n-th element formation layer, and a plurality of n-type semiconductor elements 511a or a plurality of p-type semiconductor elements 511b provided in the first element formation layer to the n-th element formation layer is electrically connected to each other; accordingly, the scanning line driver circuit 502, the signal line driver circuit 503, and the like are formed.

In addition, a driver circuit such as the scanning line driver circuit 502 or the signal line driver circuit 503 may be formed using a CMOS circuit, a PMOS circuit, or an NMOS circuit, and the semiconductor integrated circuit of the present invention described in the above embodiment mode can be used. A driver integration type in which a driver circuit such as the scanning line driver circuit 502 or the signal line driver circuit 503 is formed over the substrate 501 is described in this embodiment mode; however, it is not necessarily required, and a driver circuit can be formed outside the substrate 501 instead of over the substrate 501.

The pixel portion 504 is formed with a plurality of pixels each including a light-emitting element 516 and a semiconductor element 511c for driving the light-emitting element 516. The structure of the semiconductor element 511c is not limited in particular. Here, a first electrode 513 is provided so as to be connected to a conductive layer 512 connected to a source region or a drain region of the semiconductor element 511c, and an insulating layer 509 is formed to cover an end portion of the first electrode 513. The insulating layer 509 functions as a partition in a plurality of pixels. Then, a light-emitting layer 514 is formed over the first electrode 513, and a second electrode 515 is formed over the light-emitting layer 514. The light-emitting element 516 is provided with a stacked structure of the first electrode 513, the light-emitting layer 514, and the second electrode 515.

As the insulating layer 509, a positive type photosensitive acrylic resin film is used here. The insulating layer 509 is formed to have a curved surface at an upper end portion or a lower end portion thereof in order to make the coverage of the insulating layer 509 favorable. For example, in a case of using positive type photosensitive acrylic as a material of the insulating layer 509, the insulating layer 509 is preferably formed to have a curved surface with a curvature radius (0.2 to 3 μm) only at an upper end portion. Either a negative type which becomes insoluble in an etchant by light irradiation or a positive type which becomes soluble in an etchant by light irradiation can be used as the insulating layer 509. Alternatively, the insulating layer 509 can be provided with a single-layer structure or a stacked structure of an organic material such as epoxy, polyimide, polyamide, polyvinylphenol, or benzocyclobutene, or a siloxane material such as a siloxane resin.

As shown in the above embodiment mode, the surface of the insulating layer 509 can be modified to obtain a dense film by subjecting the insulating layer 509 to plasma treatment and oxidizing or nitriding the insulating layer 509. By modifying the surface of the insulating layer 509, intensity of the insulating layer 509 can be improved, and physical damage such as crack generation at the time of forming an opening or the like or film reduction at the time of etching can be reduced. Furthermore, by modifying the surface of the insulating layer 509, interfacial quality such as adhesion with the light-emitting layer 514 to be provided over the insulating layer 509 is improved.

One of the first electrode 513 and the second electrode 515 is used as an anode, and the other is used as a cathode.

A material having a high work function is preferably used for an anode. For example, a single-layer film such as an indium tin oxide film, an indium tin oxide film containing silicon, a transparent conductive film formed by a sputtering method using a target in which indium oxide is mixed with zinc oxide (ZnO) of 2 to 20 wt %, a zinc oxide (ZnO) film, a titanium nitride film, a chromium film, a tungsten film, a Zn film, or a Pt film; a stacked layer of a titanium nitride film and a film containing aluminum as its main component; a three-layer structure of a titanium nitride film, a film containing aluminum as its main component, and another titanium nitride film; or the like can be used. When an anode has a stacked structure, the anode can have low resistance as a wiring and form a favorable ohmic contact.

A material having a low work function (Al, Ag, Li, Ca, or an alloy thereof such as MgAg, MgIn, AlLi, $CaF_2$, or calcium nitride) is preferably used for a cathode. In a case where an electrode used as a cathode is made to transmit light, a stacked layer of a metal thin film with a small thickness and a transparent conductive film (an indium tin oxide film, an indium tin oxide film containing silicon, a transparent conductive film formed by a sputtering method using a target in which indium oxide is mixed with zinc oxide (ZnO) of 2 to 20 wt %, a zinc oxide (ZnO) film, or the like) is preferably used as the electrode.

Here, the first electrode 513 is formed using indium tin oxide which has a light-transmitting property as an anode, and light is extracted from the substrate 501 side. Note that light may be extracted from the opposite substrate 506 side by using a material having a light-transmitting property for the second electrode 515, or light can be extracted from both the substrate 501 side and the opposite substrate 506 side by forming the first electrode 513 and the second electrode 515 with a material having a light-transmitting property (this structure is referred to as dual emission).

The light-emitting layer 514 can be formed with a single layer or a stacked structure of a low molecular material, an intermediate molecular material (including an oligomer and a dendrimer), a high molecular material (also referred to as a polymer), or the like by a method such as a vapor deposition method using an evaporation mask, an ink-jet method, or a spin coating method.

Further, by attaching the opposite substrate 506 to the substrate 501 with the sealant 505, the light emitting element 516 is provided in a space 508 surrounded by the substrate 501, the opposite substrate 506, and the sealant 505. Note that the space 508 may be filled with the sealant 505, as well as with an inert gas (nitrogen, argon, or the like).

Note that an epoxy-based resin is preferably used for the sealant 505. Furthermore, it is preferable that the sealant 505 should not transmit moisture or oxygen as much as possible. As a material for the opposite substrate 506, a glass substrate, a quartz substrate, a plastic substrate formed of FRP (Fiberglass-Reinforced Plastics), PVF (polyvinylfluoride), a polyester film, polyester, acrylic, or the like can be used.

Note that the semiconductor device including the displaying means of the present invention is not limited to the above structure using a light-emitting element in a pixel portion as described above, and it also includes a semiconductor device using liquid crystals in a pixel portion. The semiconductor device using liquid crystals in a pixel portion is shown in FIG. 26.

Figure 26:
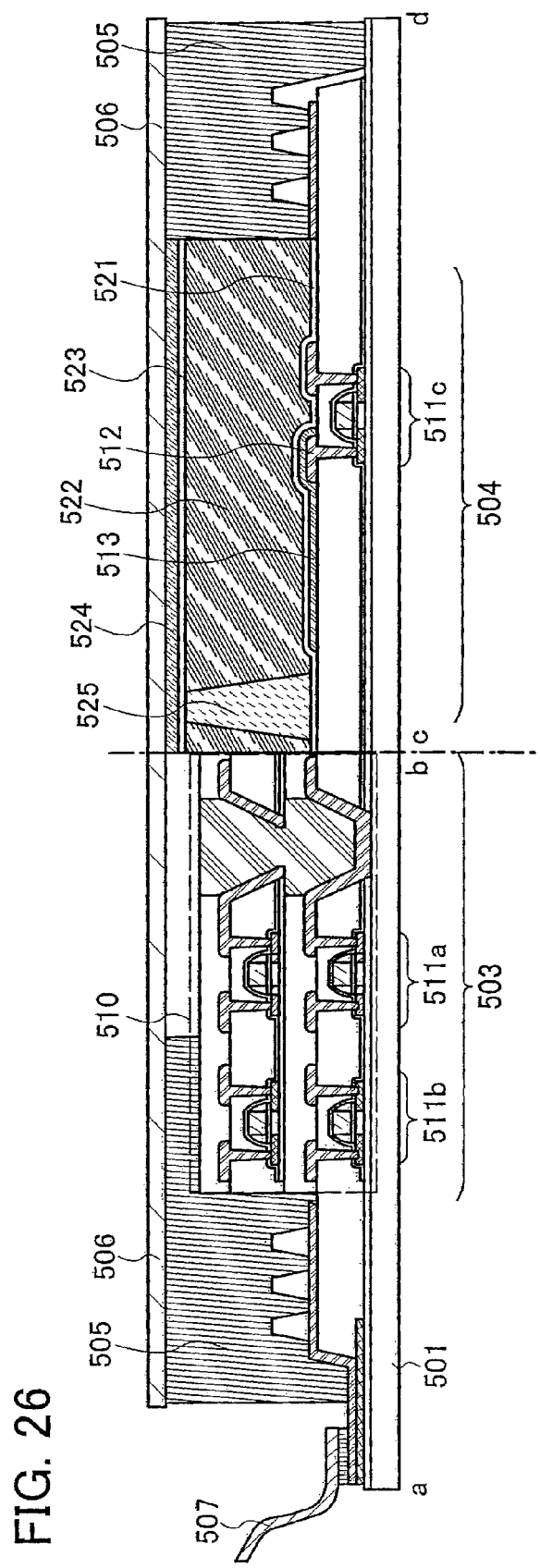
FIG. 26 is a diagram illustrating a structural example of a semiconductor device of the present invention.

Here, the semiconductor device shown in FIG. 26 has a top surface structure similarly to the structure shown in FIG. 25A, and FIG. 26 shows a cross-sectional view of FIG. 25A taken along chain lines a-b and c-d. Similarly to the above example, the semiconductor device as shown in FIG. 26 includes the scanning line driver circuit 502, the signal line driver circuit 503, the pixel portion 504, and the like which are provided over the substrate 501. In addition, the opposite substrate 506 is provided such that the pixel portion 504 is sandwiched between the opposite substrate 506 and the substrate 501, and the substrate 501 and the opposite substrate 506 are attached to each other with the sealant 505. The scanning line driver circuit 502 and the signal line driver circuit 503 receive a video signal, a clock signal, a start signal, a reset signal, or the like from the FPC 507 which serves as the external input terminal.

As the signal line driver circuit 503 or the scanning line driver circuit 502, a semiconductor integrated circuit where element formation layers are stacked can be employed as shown in the above embodiment mode.

In FIG. 26, the semiconductor integrated circuit 510 having the CMOS circuit that is a combination of the n-type semiconductor element 511a and the p-type semiconductor element 511b having any of the structures shown in the above embodiment mode is formed in the signal line driver circuit 503. The semiconductor integrated circuit 510 is formed by using any of the methods described in the above embodiment mode and stacking the first element formation layer to the n-th element formation layer (in the diagram, the second element formation layer). Then, the through wiring 126 is formed by dropping conductive paste in the opening provided in the first element formation layer to the n-th element formation layer, and a plurality of n-type semiconductor elements 511a or a plurality of p-type semiconductor elements 511b provided in the first element formation layer to the n-th element formation layer is electrically connected; accordingly, the scanning line driver circuit 502, the signal line driver circuit 503, and the like are formed.

As shown in FIG. 26, in the pixel portion of the semiconductor device, liquid crystals 522 are provided between an orientation film 521 provided to cover the conductive layer 512 and the first electrode 513 and an orientation film 523 provided on the opposite substrate 506 side. Moreover, a spacer 525 is provided in the liquid crystals 522 to control the distance (cell gap) between the first electrode 513 and a second electrode 524. In addition, the second electrode 524 is provided on the opposite substrate 506. An image can be displayed by controlling light transmittance by controlling a voltage applied to the liquid crystals provided between the first electrode 513 and the second electrode 524.

In the semiconductor device shown in this embodiment mode, the semiconductor elements 511c in the pixel portion can be formed at the same time as the first element formation layer which forms a semiconductor integrated circuit. In addition, the scanning line driver circuit 502, the signal line driver circuit 503, or the like can be fanned by stacking the second element formation layer to the n-th element formation layer only in a portion where the semiconductor integrated circuit 510 is formed. In this way, as the pattern of the semiconductor device having the display means described in this embodiment mode, the pixel portion can be provided with light-emitting elements or liquid crystals.

Figure 27A:
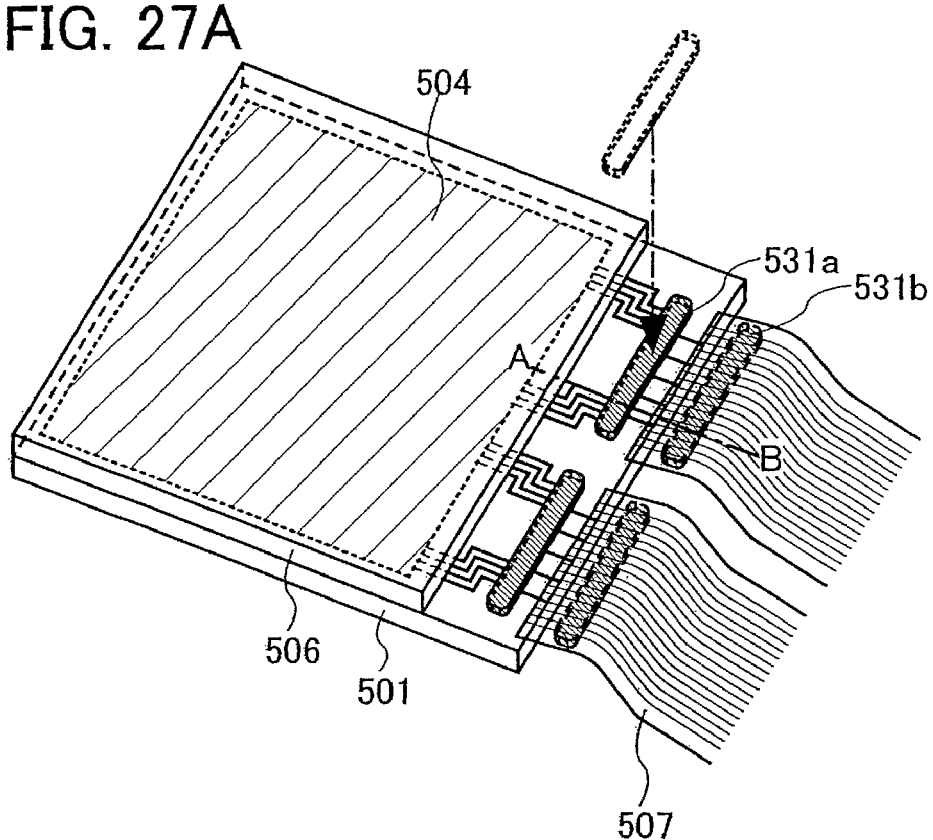
FIGS. 27A and 27B are diagrams illustrating a structural example of a semiconductor device of the present invention.

Although a driver integration type in which a driver circuit such as the scanning line driver circuit or the signal line driver circuit is formed over the substrate is shown in FIGS. 25A to 26, a driver circuit can be formed by being attached to the substrate instead of directly over the substrate. An example of a display device in this case is described with reference to FIGS. 27A and 27B. FIG. 27A shows a perspective view of a semiconductor device having a driver circuit outside, and FIG. 27B is a cross-sectional schematic view taken along a line A-B of FIG. 27A.

The semiconductor device of this example as shown in FIG. 27A includes the pixel portion 504, a scanning line driver circuit and a signal line driver circuit which are formed using semiconductor integrated circuits, and the like which are provided over the substrate 501, similarly to the above example. Then, the counter substrate 506 is provided such that the pixel portion 504 is sandwiched between the counter substrate 506 and the substrate 501, and the substrate 501 and the counter substrate 506 are attached to each other with the sealant 505.

Figure 27B:
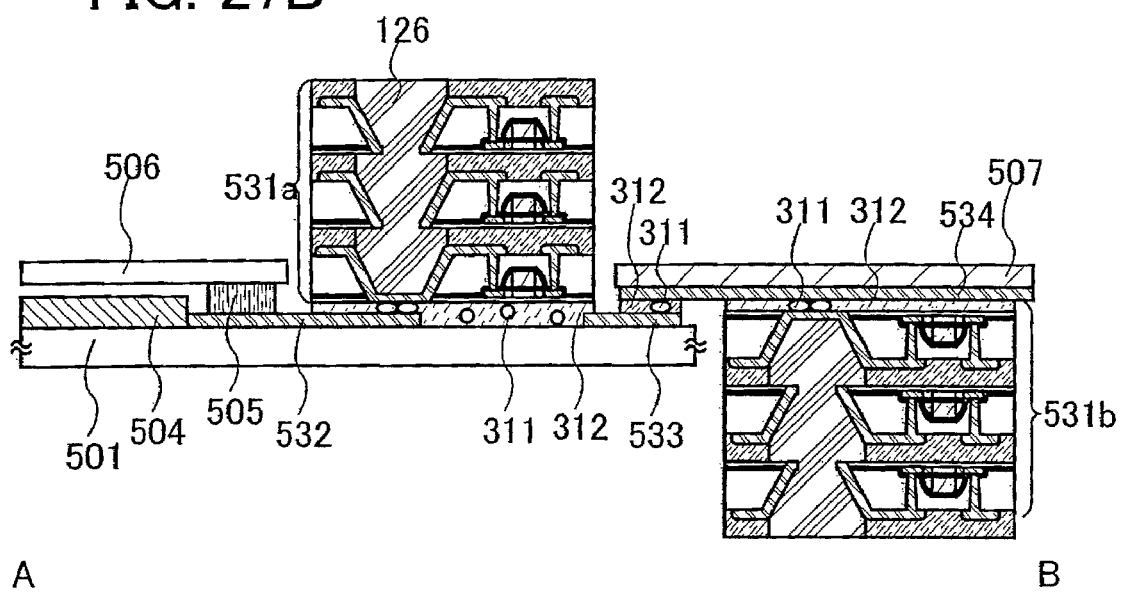

As shown in FIG. 27B, a semiconductor device is formed such that a semiconductor integrated circuit 531a is bonded onto the substrate 501 and a semiconductor integrated circuit 531b is bonded onto the FPC 507 functioning as a connection film. The pixel portion 504 and the semiconductor integrated circuit 531a are connected to each other with a first conductive layer 532 over the substrate 501. The semiconductor integrated circuit 531a and the semiconductor integrated circuit 531b are connected to each other through a second conductive layer 533 on the substrate 501 and a third conductive layer 534 on the FPC 507.

The connection between the semiconductor integrated circuit 531a and the first conductive layer 532, or the connection between the semiconductor integrated circuit 531b and the third conductive layer 534 can be performed using an anisotropic conductive material formed of the adhesive resin 312 containing the conductive particles 311 as described in the above embodiment mode. In addition to the anisotropic conductive material, the above connection can be performed using a conductive adhesive such as silver paste, copper paste, or carbon paste, a conductive adhesive such as ACP, a conductive film such as an ACF, solder joint, or the like.

By using the semiconductor integrated circuit of the present invention, high integration of a semiconductor device can be achieved, and time required for a manufacturing process can be shortened.

Embodiment Mode 12

Electronic devices manufactured according to the present invention will be described with reference to FIGS. 28A to 28E.

Figure 28A:
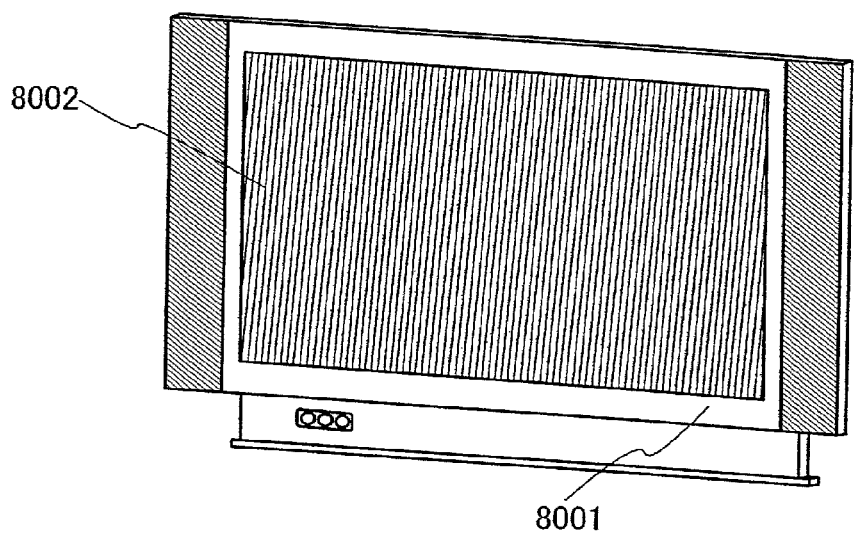
FIGS. 28A to 28E are diagrams illustrating structural examples of a semiconductor device of the present invention.

A television 8001 shown in FIG. 28A includes a display portion 8002, a driver circuit, and the like. By using the structure of the semiconductor device or the manufacturing method thereof described in the above embodiment mode for the display portion 8002, the driver circuit, and the like, the television which is one usage pattern of a semiconductor device of the present invention can be manufactured.

Figure 28B:
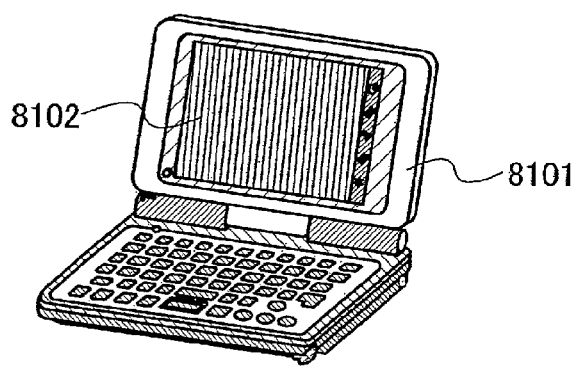

An information terminal device 8101 shown in FIG. 28B includes a display portion 8102, an electronic controlling circuit, an input/output interface, and the like. By using the structure of the semiconductor device or the manufacturing method thereof described in the above embodiment mode for the display portion 8102, the electronic controlling circuit, and the like, the information terminal device which is one usage pattern of a semiconductor device of the present invention can be manufactured.

Figure 28C:
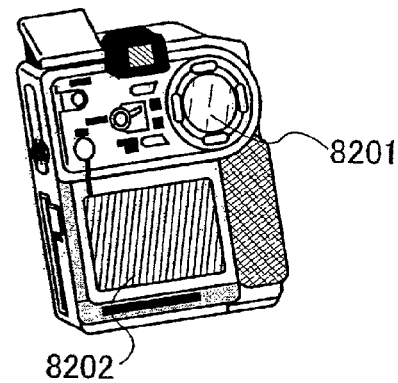

A video camera 8201 shown in FIG. 28C includes a display portion 8202, an image processing circuit, and the like. By using the structure of the semiconductor device or the manufacturing method thereof described in the above embodiment mode for the display portion 8202, the image processing circuit, and the like, the video camera which is one usage pattern of a semiconductor device of the present invention can be manufactured.

Figure 28D:
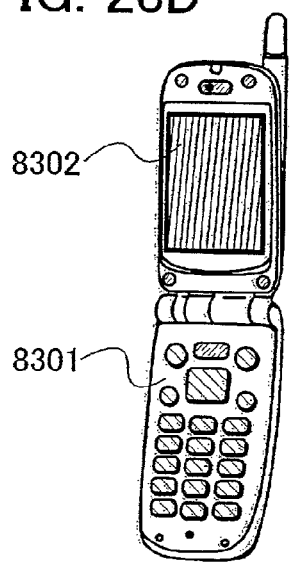

A telephone 8301 shown in FIG. 28D includes a display portion 8302, a wireless communication circuit, and the like. By using the structure of the semiconductor device or the manufacturing method thereof described in the above embodiment mode for the display portion 8302, the wireless communication circuit, and the like, the telephone which is one usage pattern of a semiconductor device of the present invention can be manufactured.

Figure 28E:
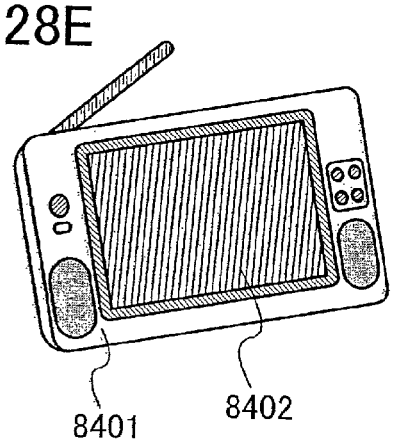

A portable television 8401 shown in FIG. 28E includes a display portion 8402, a driver circuit, a wireless communication circuit, and the like. By using the structure of the semiconductor device or the manufacturing method thereof described in the above embodiment mode for the display portion 8402, the driver circuit, the wireless communication circuit, and the like, the portable television which is one usage pattern of a semiconductor device of the present invention can be manufactured. The present invention can be applied to various types of televisions including a small-sized television incorporated in a portable terminal such as a cellular phone set, a medium-sized television which is portable, and a large-sized television (e.g., 40 inches in size or more).

Note that the electronic device of the present invention is not limited to FIGS. 28A to 28E and includes an electronic device which has a plurality of semiconductor elements in a display portion, a driver circuit portion, or the like.

As described above, an application range of the present invention is so wide that the present invention can be applied to methods for manufacturing electronic devices of various fields. In addition, by using the semiconductor integrated circuit of the present invention, high integration of a semiconductor device can be realized, and time required for a manufacturing process can be shortened. An electronic device with high performance can be provided at low cost by using the semiconductor integrated circuit of the present invention for the electronic device.

Embodiment Mode 13

A semiconductor integrated circuit of the present invention can be made flexible by being peeled off from a manufactured substrate. Hereinafter, a specific example of a semiconductor device including a flexible semiconductor integrated circuit will be described with reference to FIGS. 29A to 29F.

Figure 29A:
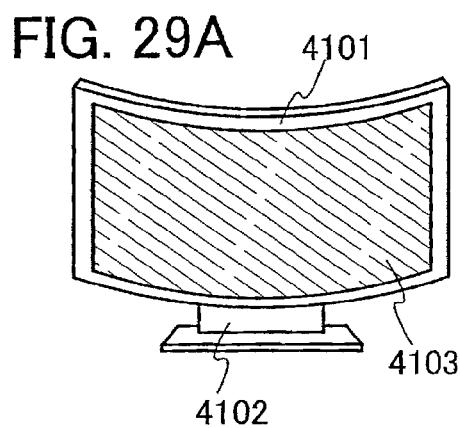
FIGS. 29A to 29F are diagrams illustrating structural examples of a semiconductor device of the present invention.

FIG. 29A shows a display 4101, which includes a support 4102, a display portion 4103, and the like. The display portion 4103 is formed using a flexible substrate, which can realize a lightweight and thin display. In addition, the display portion 4103 can be curved, and can be detached from the support 4102 and mounted along a curved wall. A flexible display, which is one usage pattern of a semiconductor device of the present invention, can be formed by using the semiconductor integrated circuit or the semiconductor device described in the above embodiment mode for an integrated circuit of the display portion 4103, a peripheral driver circuit, or the like. Thus, the flexible display can be provided over a curved portion as well as a flat surface; therefore, it can be used for various applications.

Figure 29B:
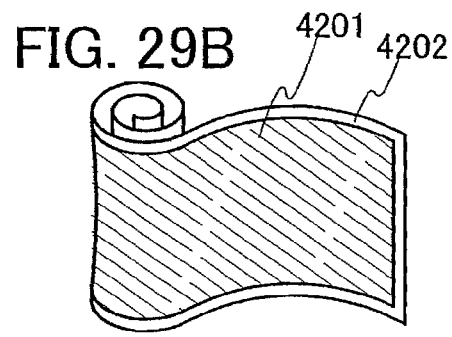

FIG. 29B shows a display 4201 capable of being wound, which includes a display portion 4202, and the like. A thin and large-area display capable of being wound, which is one usage pattern of a semiconductor device of the present invention, can be manufactured by using the semiconductor integrated circuit or the semiconductor device described in the above embodiment mode for an integrated circuit of the display portion 4202, a driver circuit, or the like. Since the display 4201 capable of being wound is formed using a flexible substrate, the display can be carried in a bent or wound state, along with the display portion 4202. Therefore, even in the case where the display 4201 capable of being wound is large-size, the display can be carried in a bag in a bent or wound state.

Figure 29C:
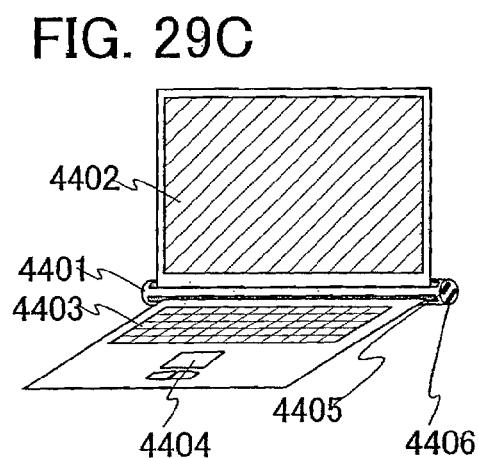

FIG. 29C shows a sheet-type computer 4401, which includes a display portion 4402, a keyboard 4403, a touch pad 4404, an external connection port 4405, a power plug 4406, and the like. A thin or sheet-type computer can be manufactured, which is one usage pattern of a semiconductor device of the present invention, by using the semiconductor integrated circuit or the semiconductor device described in the above embodiment mode for an integrated circuit of the display portion 4402, a driver circuit, an information processing circuit, or the like. The display portion 4402 is formed using a flexible substrate, which can realize a lightweight and thin computer. In addition, the display portion 4402 can be wound and stored in a main body if a portion of the main body of the sheet-type computer 4401 is provided with a storage space. In addition, by also forming the key board 4403 to be flexible, the keyboard 4403 can be wound and stored in the storage space of the sheet-type computer 4401 in a similar manner to the display portion 4402, which is convenient for carrying around. The computer can be stored without taking a place by bending when it is not used.

Figure 29D:
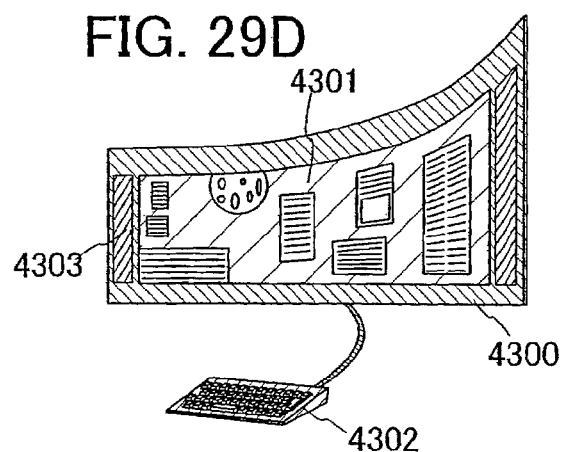

FIG. 29D shows a display device 4300 having a 20-inch to 80-inch large-sized display portion, which includes a keyboard 4302 that is an operation portion, a display portion 4301, a speaker 4303, and the like. The display portion 4301 is formed using a flexible substrate, and the display device 4300 can be carried in a bent or wound state with the keyboard 4302 detached. In addition, the connection between the keyboard 4302 and the display portion 4301 can be performed without wires. For example, the display device 4300 can be mounted along a curved wall and can be operated with the key board 4302 without wires.

In the example shown in FIG. 29D, the semiconductor integrated circuit or the semiconductor device described in the above embodiment mode is used for an integrated circuit of the display portion 4301, a driver circuit of the display portion, a wireless communication circuit which controls communication between the display portion and the keyboard, or the like. Thus, a thin and large-area display device can be manufactured, which is one usage pattern of a semiconductor device of the present invention.

Figure 29E:
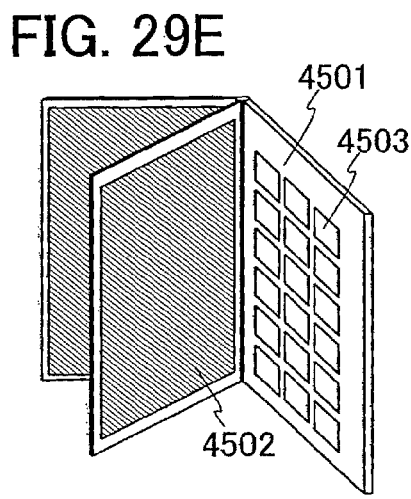

FIG. 29E shows an electronic book 4501, which includes a display portion 4502, an operation key 4503, and the like. In addition, a modem may be incorporated in the electronic book 4501. The display portion 4502 is formed using a flexible substrate and can be bent or wound. Therefore, the electronic book can also be carried without taking a place. Further, the display portion 4502 can display a moving image as well as a still image such as a character.

In the example shown in FIG. 29E, the semiconductor integrated circuit or the semiconductor device described in the above embodiment mode is used for an integrated circuit of the display portion 4502, a driver circuit, a controlling circuit, or the like. Thus, a thin electronic book can be manufactured, which is one usage pattern of a semiconductor device of the present invention.

Figure 29F:
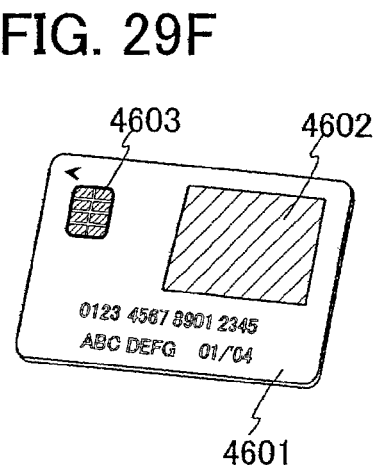

FIG. 29F shows an IC card 4601, which includes a display portion 4602, a connection terminal 4603, and the like. Since the display portion 4602 is formed to be a lightweight and thin sheet type using a flexible substrate, it can be formed over a card surface by attachment. When the IC card can receive data without contact, information obtained from outside can be displayed on the display portion 4602.

In the example shown in FIG. 29F, the semiconductor integrated circuit or the semiconductor device described in the above embodiment mode is used for an integrated circuit of the display portion 4602, a wireless communication circuit, or the like. Thus, a thin IC card can be manufactured, which is one usage pattern of a semiconductor device of the present invention.

As described above, an applicable range of the present invention is so wide that the present invention can be applied to electronic devices or information displaying means of various fields.

Embodiment Mode 14

This embodiment mode will describe a specific example of manufacturing a semiconductor integrated circuit by using a method in which element formation layers are stacked and respective layers are connected with a through wiring, as described in the above embodiment mode. Specifically, this embodiment mode shows an example of forming a semiconductor integrated circuit, by taking a memory cell of an SRAM which is volatile memory as an example.

Figure 30A:
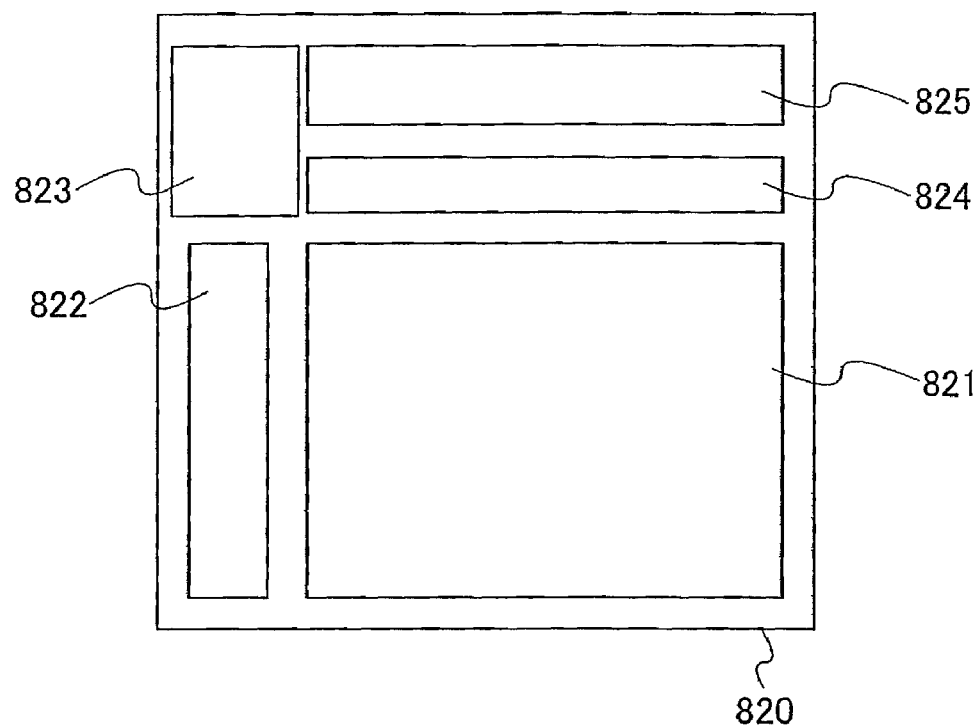
FIGS. 30A and 30B are diagrams illustrating a structural example of a semiconductor integrated circuit of the present invention.

FIG. 30A shows a block diagram of an SRAM. An SRAM 820 includes a memory cell array 821 in which memory cells are arranged in matrix, a row decoder 822 and a column decoder 823 which decode a specified address, a selector 824 which selects an address of the memory cell array from an output of the column decoder, and an R/W circuit 825 which controls reading and writing data.

Figure 30B:
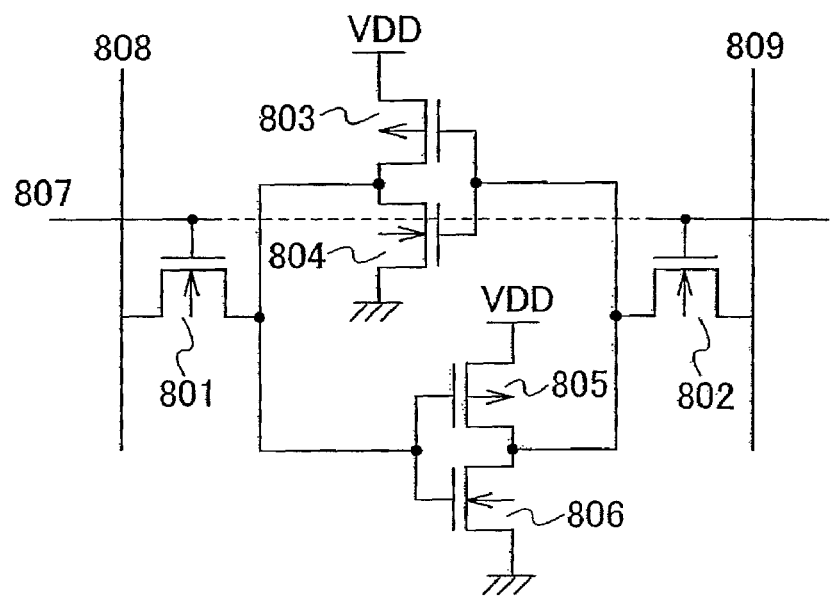

FIG. 30B shows one of the memory cells which form the memory cell array at a transistor level. The memory cell of the SRAM includes two select transistors 801 and 802 (n-channel transistors) for selecting the memory cell, and two inverters which store information, that is, two n-channel transistors 804 and 806 and two p-channel transistors 803 and 805. Therefore, one memory cell of the SRAM includes six transistors: four n-channel transistors and two p-channel transistors.

One of high concentration impurity regions (either a source electrode or a drain electrode) of the select transistor 801 is connected to a bit line 808. One of high concentration impurity regions (either a source electrode or a drain electrode) of the select transistor 802 is connected to a bit b line 809. Gate electrodes of the two select transistors 801 and 802 are connected to a word line 807.

In the select transistor 801, the high concentration impurity region which is not connected to the bit line 808 is connected to an input portion of the inverter formed of the p-channel transistor 805 and the n-channel transistor 806, and to an output portion of the inverter formed of the p-channel transistor 803 and the n-channel transistor 804. In addition, in the select transistor 802, the high concentration impurity region which is not connected to the bit b line 809 is connected to an output portion of the inverter formed of the p-channel transistor 805 and the n-channel transistor 806 and an input portion of the inverter formed of the p-channel transistor 803 and the n-channel transistor 804.

Next, a method for forming a memory cell having the above-mentioned structure by using the present invention will be described with reference to FIGS. 31A and 31B. A circuit diagram of the memory cell shown in FIG. 30B can be transposed in such a way that only n-channel transistors are arranged at a lower stage and only p-channel transistors are arranged at an upper stage while keeping the connection relationship, as shown in FIG. 31A.

Figure 31A:
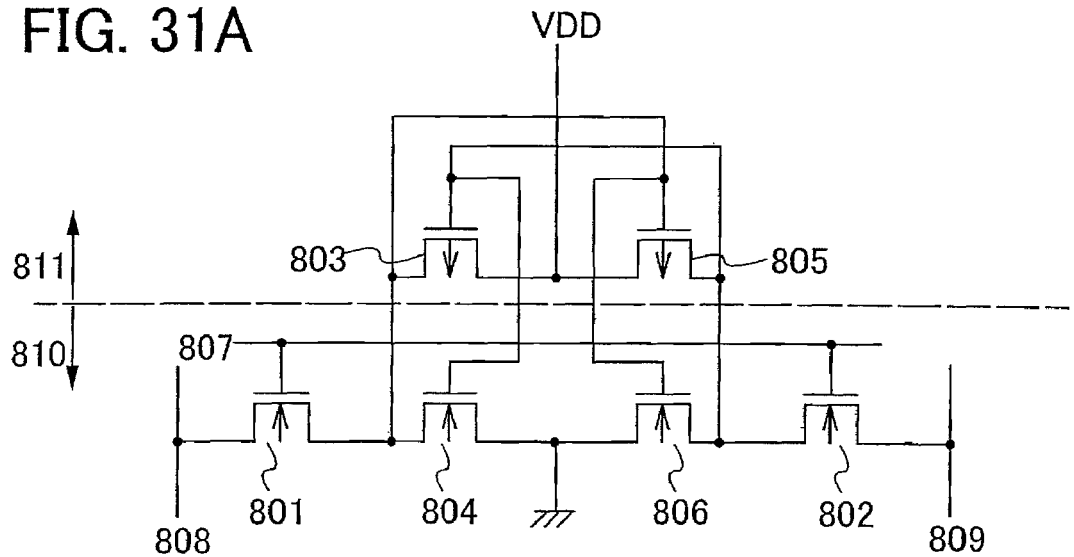
FIGS. 31A and 31B are diagrams illustrating a structural example of a semiconductor integrated circuit of the present invention.
Figure 31B:
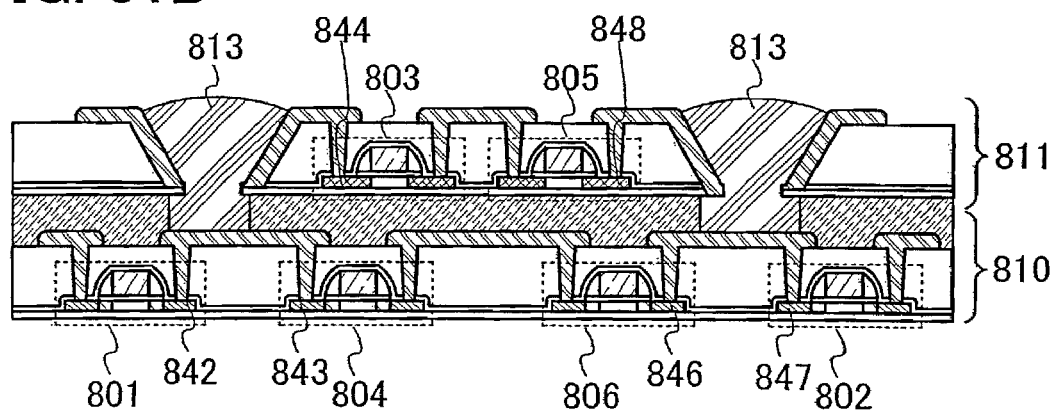

FIG. 31B shows an example in which the circuit shown in FIG. 31A is formed by using the present invention. In the circuit diagram shown in FIG. 31A, the portion shown at the lower stage is formed of a first element formation layer 810 having n-channel transistors, and the portion shown at the upper stage is formed of a second element formation layer 811 having p-channel transistors. An opening is formed in the second element formation layer 811. When the first element formation layer 810 and the second element formation layer 811 are stacked, and through wirings 813 are formed in the openings of the second element formation layer 811, the first element formation layer 810 and the second element formation layer 811 can be electrically connected.

In FIG. 31B, a high concentration impurity region 842 of the select transistor 801 and a high concentration impurity region 843 of the n-channel transistor 804 are connected to a high concentration impurity region 844 of the p-channel transistor 803 with the through wiring. Similarly, a high concentration impurity region 846 of the n-channel transistor 806 and a high concentration impurity region 847 of the select transistor 802 are connected to a high concentration impurity region 848 of the p-channel transistor 805 with the through wiring.

Here, FIG. 31B shows only a connection relationship of the high concentration impurity regions which form a source electrode and a drain electrode of each transistor, but does not show a connection relationship of a gate electrode. The connection relationship shown in FIG. 31A can be obtained by leading a wiring which is formed using the second conductive layer or the third conductive layer.

A semiconductor integrated circuit which forms such an SRAM can be formed by using the method described in the above embodiment mode.

In the memory cell, the n-channel transistors 804 and 806 which form the inverters differ from the select transistors 801 and 802 in a connection relationship with another circuit and a function. For example, the select transistors are connected to a selector with the bit line 808 and the bit b line 809, and operate at the time of reading or writing data stored in the memory cell. On the other hand, the n-channel transistors 804 and 806 which form the inverters are connected to the p-channel transistors 803 and 805 which form the inverters, the select transistors, and a wiring for supplying a ground voltage, and the n-channel transistors 804 and 806 function to hold stored data. In this manner, an example in which the structure of layers which form a semiconductor integrated circuit is determined in accordance with the function of each transistor is described with reference to FIGS. 32A to 33B.

Figure 32A:
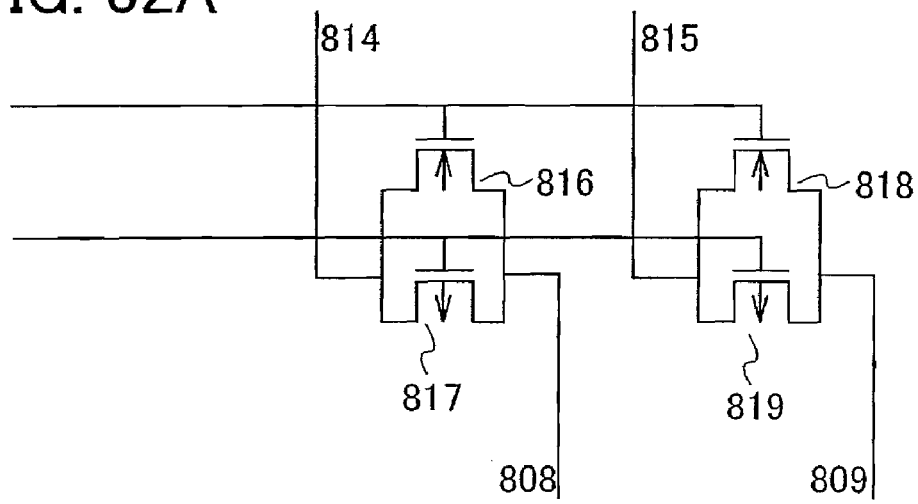
FIGS. 32A and 32B are diagrams illustrating a structural example of a semiconductor integrated circuit of the present invention.
Figure 32B:
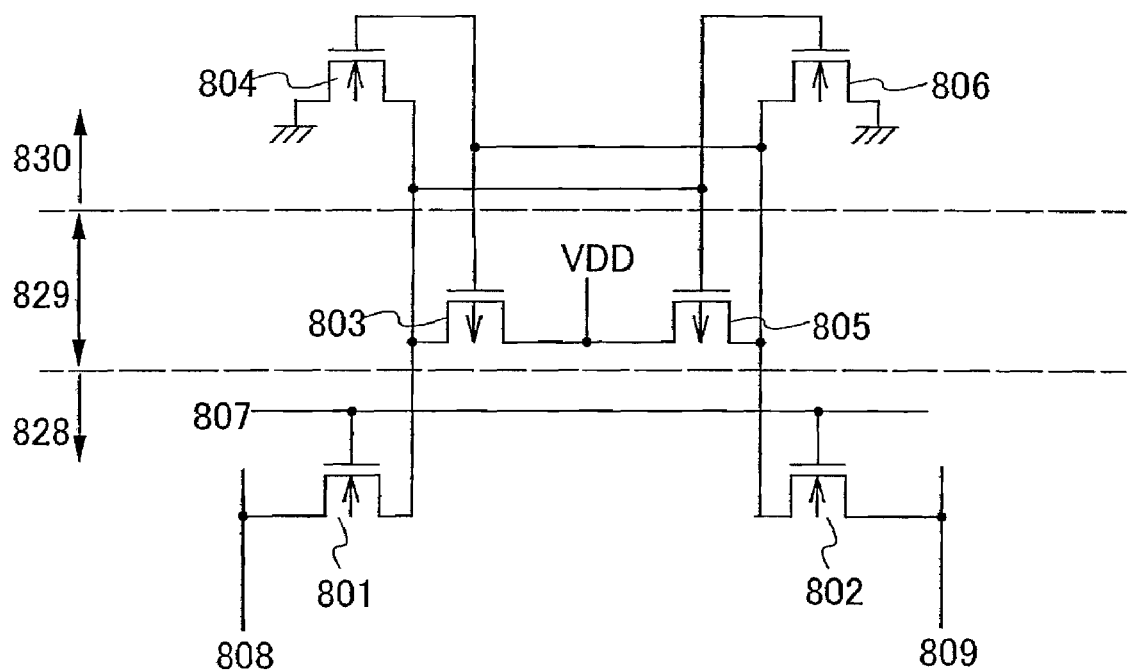
Figure 33A:
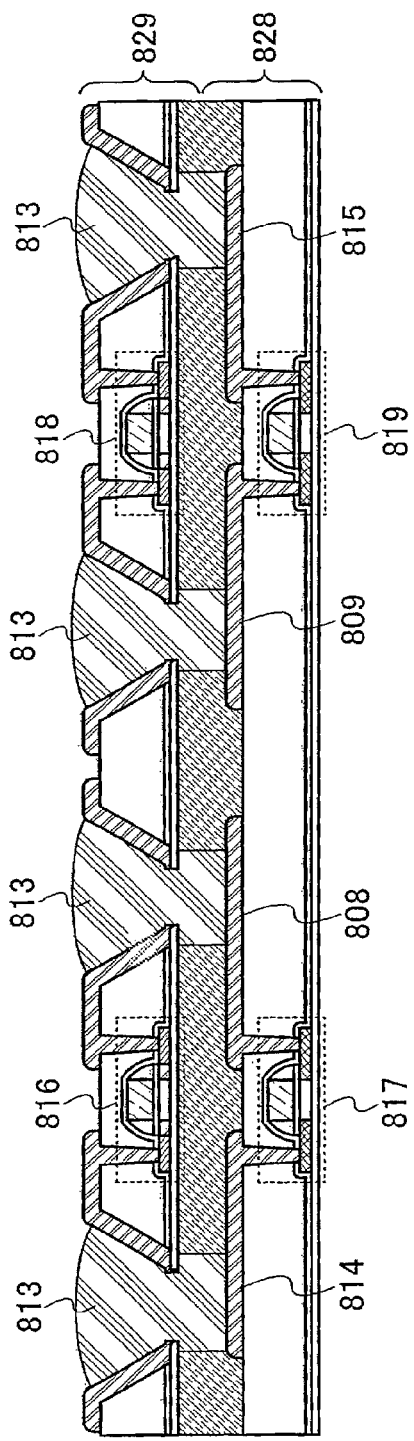
FIGS. 33A and 33B are diagrams illustrating a structural example of a semiconductor integrated circuit of the present invention.
Figure 33B:
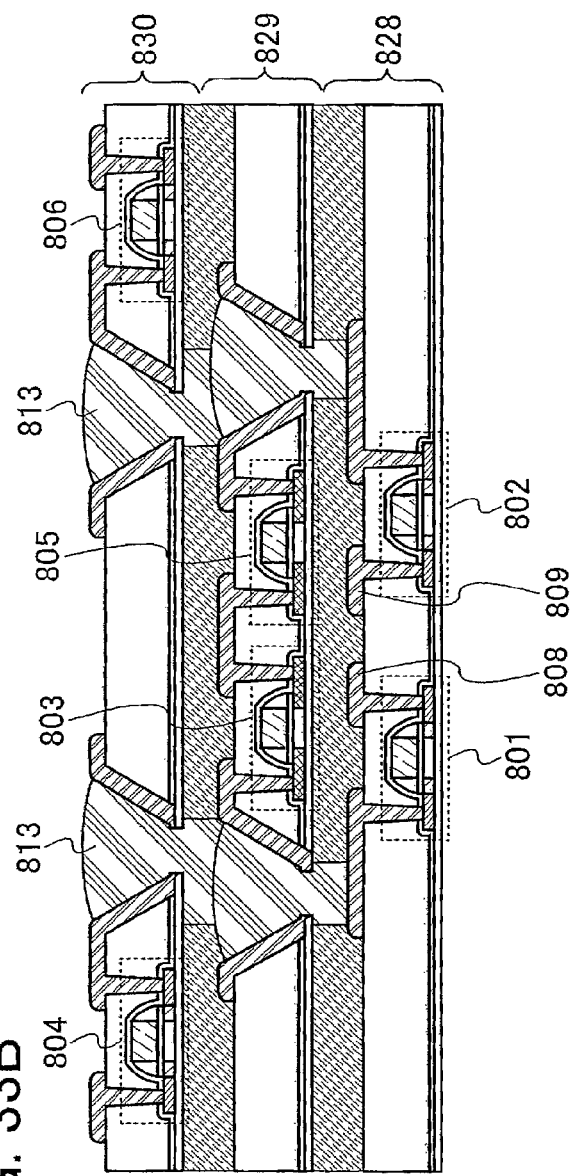

FIGS. 32A and 32B are equivalent circuit diagrams of the semiconductor integrated circuit, and FIGS. 33A and 33B are cross-sectional views of the semiconductor integrated circuit having such a circuit structure. The following description will be given with reference to these drawings.

As shown in FIGS. 32A and 33A, in the case where a selector which is connected to a select transistor with the bit line 808 or the bit b line 809 is an analog switch formed of n-channel transistors 816 and 818 and p-channel transistors 817 and 819, the p-channel transistors 817 and 819 which form the analog switch are formed in a first element formation layer 828, and the n-channel transistors 816 and 818 which form the analog switch are formed in a second element formation layer 829. Furthermore, the bit line 808 and the bit b line 809 are formed in the first element formation layer 828. The n-channel transistors 816 and 818 of the second element formation layer 829 can be connected to the bit line 808 and the bit b line 809 in the first element formation layer 828 with the through wirings 813.

Furthermore, as shown in FIGS. 32B and 33B, the select transistors 801 and 802 (n-channel transistors) can be formed in the first element formation layer 828; the p-channel transistors 803 and 805 which form the inverters can be formed in the second element formation layer 829; and the n-channel transistors 804 and 806 which form the inverters can be formed in a third element formation layer 830. The first element formation layer 828, the second element formation layer 829, and the third element formation layer 830 are connected to each other with the through wirings 813.

In this manner, by forming a transistor which forms a circuit with a stacked structure, a circuit area can be reduced. In addition, when the bit line 808 and the bit b line 809 which connect the selector and the select transistor are formed using only the first element formation layer 828, the wiring length can be shortened. Similarly, by forming a column decoder connected to the select transistor in the first element formation layer 828, the length of wiring connected to each circuit and the memory cell can be shortened. In this way, when the length of the wiring is shortened, power consumption can be reduced and operating speed can be improved.

In addition, a ground voltage (also referred to as a reference voltage, ground, 0 V, VSS) is applied to one of high concentration impurity regions of the n-channel transistor which forms the inverter, and a power supply voltage is applied to one of high concentration impurity regions of the p-channel transistor which forms the inverter. Therefore, a wiring to which a power supply voltage is applied is formed in the second element formation layer, and a wiring to which a ground voltage is applied is formed in the third element formation layer. These wirings are formed in different element formation layers. Preferably, when wirings are formed so as not to overlap with each other when element formation layers are attached to each other, parasitic capacitance generated between wirings can be reduced and operating speed can be improved.

In this way, each element formation layer which forms a semiconductor integrated circuit can be formed in consideration of the operation of the circuit.

This application is based on Japanese Patent Application serial No. 2006-126329 filed in Japan Patent Office on Apr. 28, 2006, the entire contents of which are hereby incorporated by reference.

What is claimed is:

1. A semiconductor integrated circuit comprising:
a first element formation layer including a first semiconductor element, the first semiconductor element including a first semiconductor layer and first insulating layers sandwiching the first semiconductor layer; and
an n-th element formation layer including an opening and an n-th semiconductor element where n is an integer of 2 or more, the n-th semiconductor element including an n-th semiconductor layer and n-th insulating layers sandwiching the n-th semiconductor layer,
wherein the n-th element formation layer is stacked over the first element formation layer;
a wiring is formed in the opening;
the n-th element formation layer further includes a source electrode and a drain electrode each connected to the n-th semiconductor layer;
at least one of the source electrode and the drain electrode is provided on a side surface of the opening; and
an opening of the first element formation layer overlaps with the opening of the first element formation layer.

2. The semiconductor integrated circuit according to claim 1, wherein the side surface of the opening has conductivity.

3. The semiconductor integrated circuit according to claim 1, wherein the wiring is formed from a conductive material.

4. The semiconductor integrated circuit according to claim 3, wherein the conductive material is a material in which a conductive particle is dissolved or dispersed in an organic resin.

5. The semiconductor integrated circuit according to claim 4, wherein the conductive particle is at least one metal particle selected from the group consisting of Ag, Au, Cu, Ni, Pt, Pd, Ir, Rh, W, Al, Ta, Mo, Cd, Zn, Fe, Ti, Zr and Ba; a fine particle of silver halide; or carbon black.

6. The semiconductor integrated circuit according to claim 1, wherein at least one of the first semiconductor element and the n-th semiconductor element comprises a thin film transistor.

7. A semiconductor device comprising the semiconductor integrated circuit according to claim 1.

8. The semiconductor integrated circuit according to claim 1, wherein the opening is a through hole.

* * * * *